US011011629B2

(12) United States Patent
Beninger-Bina et al.

(10) Patent No.: US 11,011,629 B2
(45) Date of Patent: May 18, 2021

(54) POWER SEMICONDUCTOR SWITCH WITH IMPROVED CONTROLLABILITY

(71) Applicant: Infineon Technologies Dresden GmbH & Co. KG, Dresden (DE)

(72) Inventors: Markus Beninger-Bina, Grosshelfendorf (DE); Matteo Dainese, Munich (DE); Ingo Dirnstorfer, Dresden (DE); Erich Griebl, Dorfen (DE); Caspar Leendertz, Munich (DE); Christian Philipp Sandow, Haar (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/695,707

(22) Filed: Nov. 26, 2019

(65) Prior Publication Data

US 2020/0168727 A1 May 28, 2020

(30) Foreign Application Priority Data

Nov. 28, 2018 (DE) .......................... 102018130095.6

(51) Int. Cl.
*H01L 29/739* (2006.01)
*H01L 29/66* (2006.01)
*H01L 27/082* (2006.01)

(52) U.S. Cl.
CPC ...... *H01L 29/7397* (2013.01); *H01L 27/0823* (2013.01); *H01L 29/66348* (2013.01)

(58) Field of Classification Search
CPC ........... H01L 29/7397; H01L 29/66348; H01L 27/0823; H01L 29/1095; H01L 29/36; H01L 29/0619; H01L 29/7396; H01L 29/407; H01L 29/0696; H01L 29/7398; H01L 29/0684; H01L 29/42356; H01L 29/4236
See application file for complete search history.

(56) References Cited

U.S. PATENT DOCUMENTS

| 10,741,547 | B2* | 8/2020 | Naito ....................... H01L 29/12 |
| 10,840,362 | B2* | 11/2020 | Philippou ........... H01L 29/7396 |
| 2017/0018636 | A1* | 1/2017 | Naito ................... H01L 29/0649 |
| 2018/0286971 | A1* | 10/2018 | Philippou ......... H01L 29/66325 |
| 2018/0342605 | A1* | 11/2018 | Dainese ................ H01L 29/407 |
| 2019/0123185 | A1* | 4/2019 | Vellei ................... H01L 29/7396 |
| 2019/0326118 | A1* | 10/2019 | Naito ................... H01L 29/0696 |

FOREIGN PATENT DOCUMENTS

| DE | 112015006812 T5 | 4/2018 |
| DE | 102018112344 A1 | 11/2018 |
| DE | 102017124871 A1 | 4/2019 |

* cited by examiner

*Primary Examiner* — Victor A Mandala
(74) *Attorney, Agent, or Firm* — Murphy, Bilak & Homiller, PLLC

(57) ABSTRACT

A power semiconductor switch includes a cross-trench structure associated with at least one IGBT cell. The cross-trench structure merge at least one control trench, at least one dummy trench and at least one further trench of at least one IGBT cell to each other. The cross-trench structure overlaps at least partially along a vertical direction with trenches of the at least one IGBT-cell.

22 Claims, 40 Drawing Sheets

POWER SEMICONDUCTOR SWITCH WITH IMPROVED CONTROLLABILITY

TECHNICAL FIELD

This specification refers to embodiments of a power semiconductor switch and to embodiments of a method of processing a power semiconductor switch. In particular, this specification is directed to embodiments of a power semiconductor switch having one or more power cells that each comprise at least three trenches with respective trench electrodes, e.g., for dV/dt controllability, and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state. In such case, the power semiconductor device is typically referred to as a (power semiconductor) switch.

In some cases, the gate electrode may be included within a trench of the power semiconductor device, wherein the trench may exhibit, e.g., a stripe configuration or a needle configuration.

It is usually desirable to keep losses, e.g., switching losses, of the power semiconductor switch low. For example, low switching losses may be achieved by ensuring short switching durations, e.g., a short turn-on duration and/or a short turn-off duration.

On the other hand, in a given application, there may also be requirements regarding a maximum slope of the voltage (dV/dt) and/or a maximum slope of the load current (dI/dt) that may occur during or after the switching operation.

Hence, it is desirable to provide a power semiconductor switch that allows for improved control of the switching operation.

SUMMARY

According to an embodiment, a power semiconductor switch comprises a first load terminal and a second load terminal. The power semiconductor switch is configured to conduct a load current along a vertical direction between said terminals. The power semiconductor switch further comprises: an active cell region with a drift region of a first conductivity type; an edge termination region having a well region of a second conductivity type electrically connected to the first load terminal; a plurality of IGBT cells arranged within the active cell region, wherein each of the IGBT cells comprises a plurality of trenches that extend into the drift region along the vertical direction and that laterally confine a plurality of mesas. The plurality of trenches include: at least one control trench having a control electrode for controlling the load current; at least one dummy trench having a dummy electrode electrically coupled to the control electrode; at least one further trench having a further trench electrode, the at least one further trench being one of a further control trench and a further dummy trench. The plurality of mesas include: at least one active mesa electrically connected to the first load terminal within the active cell region and being configured to conduct at least a part of the load current, wherein each of the number of control trenches that are included in the respective IGBT cell is arranged adjacent to no more than one active mesa; at least one inactive mesa arranged adjacent to the at least one dummy trench and not electrically connected to the first load terminal. The power semiconductor switch further comprises a cross-trench structure associated with at least one of the IGBT cells, the cross-trench structure merging each of the at least one control trench, the at least one dummy trench and the at least one further trench of the at least one IGBT cell to each other, wherein the cross-trench structure overlaps at least partially along the vertical direction with the plurality of the trenches of the at least one IGBT-cell.

For example, a portion of the drift region extends into the at least one active mesa and has a net dopant concentration profile along the vertical direction, wherein the net dopant concentration has a local maximum within a central portion of the vertical extension of the at least one active mesa. The net dopant concentration can be the dopant concentration of the first conductivity minus the dopant concentration of the second conductivity type. The central portion of the at least one active mesa can be the portion which is displaced from the mesa top and the mesa bottom by respective at least 10%, or at least 20% of the total vertical mesa extension. The local maximum can be formed by means of the net dopant concentration changing at least by a factor of two along the vertical direction.

According to another embodiment, a method is presented. The method comprises processing a power semiconductor switch. The processed power semiconductor switch comprises a first load terminal and a second load terminal. The processed power semiconductor switch is configured to conduct a load current along a vertical direction between said terminals. Processing the power semiconductor switch comprises forming: an active cell region with a drift region of a first conductivity type; an edge termination region having a well region of a second conductivity type to be electrically connected to the first load terminal; a plurality of IGBT cells arranged within the active cell region, wherein each of the IGBT cells comprises a plurality of trenches that extend into the drift region along the vertical direction and that laterally confine a plurality of mesas. The plurality of trenches include: at least one control trench having a control electrode for controlling the load current; at least one dummy trench having a dummy electrode to be electrically coupled to the control electrode; at least one further trench having a further trench electrode, the at least one further trench being one of a further control trench and a further dummy trench. The plurality of mesas include: at least one active mesa to be electrically connected to the first load terminal within the active cell region and being configured to conduct at least a part of the load current, wherein each of the number of control trenches that are included in the respective IGBT cell is arranged adjacent to no more than one active mesa; at least one inactive mesa arranged adjacent to the at least one dummy trench and not to be electrically connected to the first load terminal. Processing the power semiconductor switch further comprises forming a cross-trench structure associated with at least one of the IGBT cells, the cross-trench structure merging each of the at least one control trench, the at least one dummy trench and the at least one further trench of the at least one IGBT cell to each other, wherein the cross-trench structure overlaps at least partially along the vertical direction with the plurality of the trenches of the at least one IGBT-cell.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
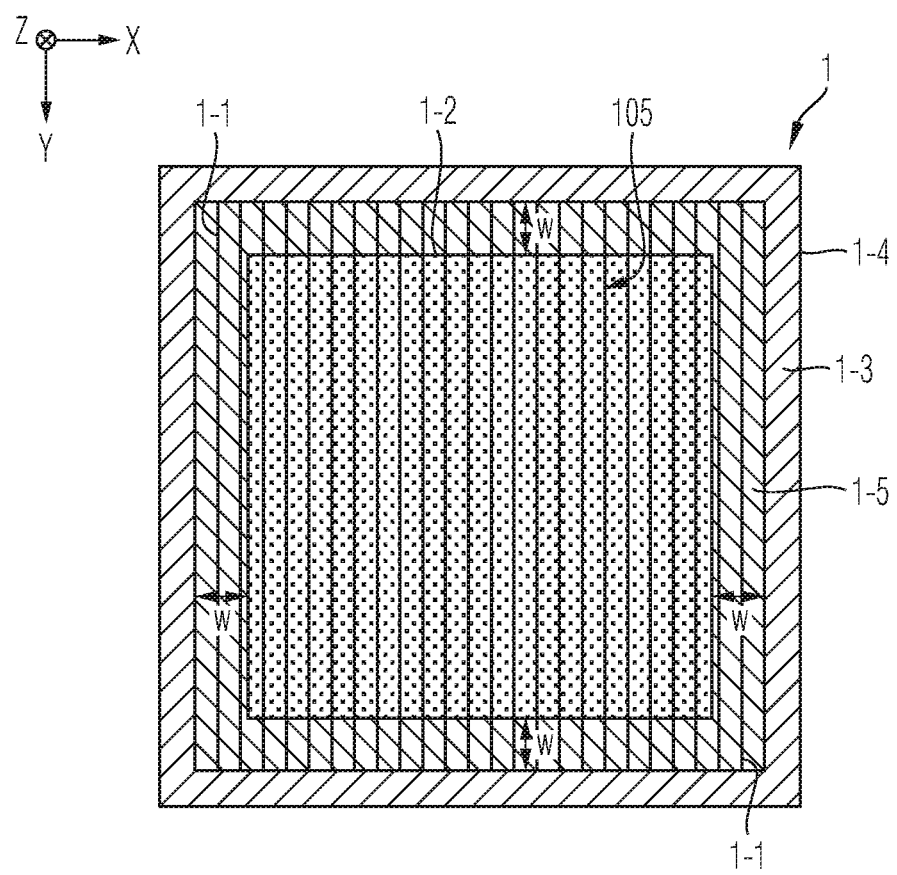
FIG. 1 schematically and exemplarily illustrates a section of a horizontal projection of a power semiconductor switch in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, in particular a power semiconductor switch, such as an IGBT, e.g., exhibiting a stripe cell or cellular cell configuration, e.g., an IGBT that may be used within a power converter or a power supply. Thus, in an embodiment, such IGBT can be configured to carry a load current that is to be fed to a load and/or, respectively, that is provided by a power source. For example, the IGBT may comprise one or more active power semiconductor cells, such as a monolithically integrated IGBT cell, and/or a monolithically integrated RC-IGBT cell. Such transistor cells may be integrated in a power semiconductor module. A plurality of such cells may constitute a cell field that is arranged with an active cell region of the IGBT.

The term "power semiconductor device" as used in this specification intends to describe a semiconductor device on a single chip with high voltage blocking and/or high current-carrying capabilities. In other words, such power semiconductor device (e.g., an IGBT) is intended for high current, typically in the Ampere range, e.g., up to several ten or hundred Ampere, and/or high voltages, typically above 15 V, more typically 100 V and above, e.g., up to at least 6500 V.

For example, the power semiconductor device described below may be an IGBT or another power semiconductor switch exhibiting a stripe trench cell configuration or a cellular trench cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 2:
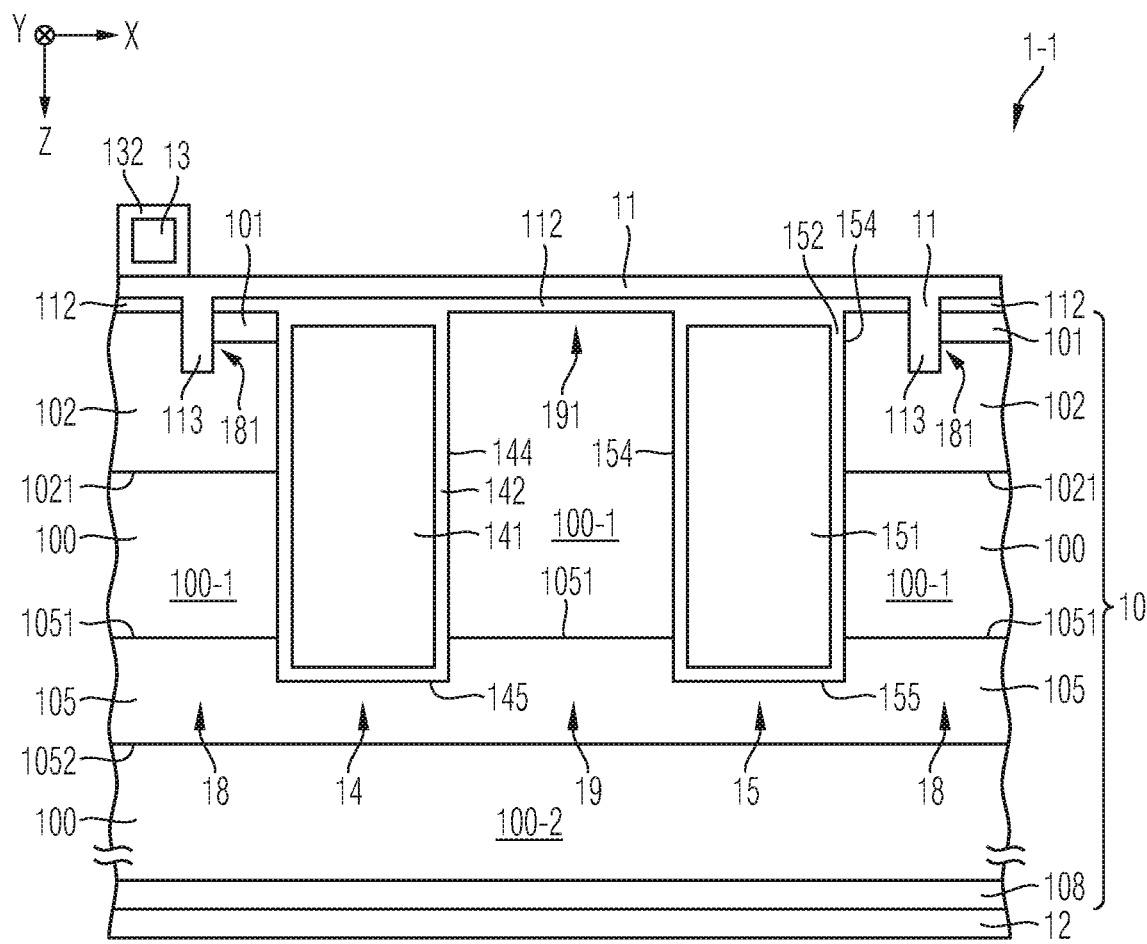
FIGS. 2, 3A, 3B, and 4 each schematically and exemplarily illustrate a section of a vertical cross-section of a power semiconductor switch in accordance with one or more embodiments.

FIG. 1 schematically and exemplarily illustrates a section of a horizontal projection of a power semiconductor switch 1 in accordance with one or more embodiments. FIG. 2 schematically and exemplarily illustrates a section of a vertical cross-section of a power semiconductor switch 1 in accordance with one or more embodiments. In the following, it will be referred to each of FIG. 1 and FIG. 2.

The power semiconductor switch 1 can for example be an IGBT or, respectively, a power semiconductor switch that has a configuration that is based on an IGBT configuration, such as Reverse Conducting (RC) IGBT. In the following, the power semiconductor switch 1 will also be simply referred to as "switch 1".

For example, the power semiconductor switch 1 comprises a semiconductor body 10 that is coupled to a first load terminal 11 and a second load terminal 12. For example, the first load terminal 11 is an emitter terminal, whereas the second load terminal 12 can be a collector terminal. The power semiconductor switch 1 is configured to conduct a load current along the vertical direction Z between said terminals 11, 12.

The semiconductor body 10 may comprise a drift region 100 of the first conductivity type. The drift region 100 may be n-doped. In an embodiment, the drift region 100 has a (electrically activated) dopant concentration within the range of $2*10^{12}$ cm$^{-3}$ to $4*10^{14}$ cm$^{-3}$. For example, the extension of the drift region 100 along the vertical direction Z and its dopant concentration are chosen in dependence of the blocking voltage rating for which the power semiconductor switch 1 shall be designed, as it is known to the skilled person. Within the present specification, the term "drift region" is intended to describe such region of a power semiconductor switch (e.g., an IGBT) the skilled person typically designates as a drift region or, respectively, drift zone.

Further, the first load terminal 11 may be arranged on the frontside of the power semiconductor switch 1 and may include a frontside metallization. The second load terminal 12 may be arranged, opposite to the frontside, e.g., on a backside of the power semiconductor switch 1 and may include, for example, a backside metallization. Accordingly, the power semiconductor switch 1 may exhibit a vertical configuration and the load current may be conducted along the vertical direction Z. In another embodiment, each of the first load terminal 11 and the second load terminal 12 may be arranged on a common side, e.g., both on the frontside, of the power semiconductor switch 1.

Now referring in more detail to FIG. 1, the power semiconductor switch 1 may further include an active cell region 1-2, an edge termination region 1-3 and a chip edge 1-4. The edge termination region 1-3 may surround the active cell region 1-2. A transition region 1-5 can be arranged between the active cell region 1-2 and the edge termination region 1-3. For example, the transition region 1-5 surrounds the active cell region 1-2. The transition region 1-5 can be surrounded by the edge termination region 1-3.

In an embodiment, the semiconductor body 10 essentially consists of the edge termination region 1-3, the transition region 1-5 and the active cell region 1-2.

For example, each of the edge termination region 1-3, the transition region 1-5 and the active cell region 1-2 extend along the vertical direction Z from the frontside of the power semiconductor switch 1 entirely through the semiconductor body 10 to the backside of the power semiconductor switch 1. Each of the edge termination region 1-3, the transition region 1-5 and the active cell region 1-2 may not only include components of the semiconductor body 10, but also components external thereof, e.g., components of the first load terminal 11 and/or the second load terminal 12.

Further, in an example, along lateral directions, there is no overlap between the edge termination region 1-3, the transition region 1-5 and the active cell region 1-2 within the semiconductor body 10. Thus, the active cell region 1-2 may entirely be surrounded by the transition region 1-5, and, within the semiconductor body 10, there is no lateral overlap, e.g., along the first lateral direction X, the second lateral direction Y and linear combinations thereof, between the transition region 1-5 and the active cell region 1-2. Analogously, the transition region 1-5 may entirely be surrounded by the edge termination region 1-3, and, within the semiconductor body 10, there is no lateral overlap, e.g., along the first lateral direction X, the second lateral direction Y and linear combinations thereof, between the transition region 1-5 and the edge termination region 1-3.

In an embodiment, the transition region 1-5 has a width W along a lateral direction from the active cell region 1-2 towards the edge termination region 1-3 (e.g., in/against the first lateral direction X and in/against the second lateral Y and/or in linear combinations of the these lateral directions) of at least 1 µm. Said width W of the transition region 1-5 may hence be the distance between the active cell region 1-2 and the edge termination region 1-3. This (minimum) width W may be present along the entire circumference of the transition region 1-5. The width of the transition region 1-5 may be greater than 1 µm, e.g., greater than 3 µm, greater than 5 µm, greater than 7 µm or even greater than 10 µm. Further exemplary features of the transition region 1-5 and the edge termination region 1-5 will be described below. Along said width W, a portion of the drift region 100 may be present.

The chip edge 1-4 may laterally terminate the semiconductor body 10, e.g., the chip edge 1-4 may have become into being by means of wafer dicing, for example, and may extend along the vertical direction Z. The edge termination region 1-3 may be arranged between the active cell region 1-2 and the chip edge 1-4, as illustrated in FIG. 1.

In the present specification, the terms "active cell region" and "edge termination region" are employed in a conventional manner, i.e., the active cell region 1-2 and the edge termination region 1-3 may be configured to provide for the principle technical functionalities the skilled person typically associates therewith.

For example, the active cell region 1-2 of the power semiconductor switch 1 is configured to conduct the main part of the load current between the terminals 11, 12, whereas the edge termination region 1-3 does not conduct the load current, but rather fulfills functions regarding the course of the electric field, ensuring the blocking capability, safely terminating the active cell region 1-2 and the transition region 1-5 and so forth, in accordance with an embodiment.

The power semiconductor switch 1 comprises a plurality of IGBT cells 1-1, wherein the plurality of IGBT cells 1-1 is predominantly arranged within the active cell region 1-2. For example, most of the plurality of IGBT cells 1-1 of the power semiconductor switch 1 are arranged within the active cell region 1-2. The number of IGBT cells 1-1 may be greater than 100, than 1000, or even greater than 10,000. For example, at least 85%, at least 95% or at least 98% of the total number of IGBT cells 1-1 are arranged within the active cell region 1-2. In an embodiment, the remaining IGBT cells 1-1 are arranged within the transition region 1-5. Some of the IGBT cells 1-1 may entirely be arranged within the transition region 1-5, others may be arranged with both within the active cell region 1-2 and extend, by means of their respective lateral ends, into the transition region, as schematically illustrated in FIG. 1.

In an embodiment, each IGBT cell 1-1 at least partially extends into the transition region 1-5, as schematically and exemplarily illustrated in FIG. 1.

Thus, for example, some of the IGBT cells 1-1 are arranged within the transition region 1-5 or, respectively, extend into the transition region 1-5, as schematically and exemplarily illustrated in FIG. 1. In this respect, the transition region 1-5 can also be understood as a form of an active region of the power semiconductor switch 1. For example, by means of said share of the total number of IGBT cells 1-1 that is arranged within the transition region 1-5 or that extends into the transition region 1-5, the transition region 1-5 may also be configured to conduct a part of the load current.

In accordance with an embodiment, the IGBT cells 1-1 are not arranged within the edge termination region 1-3. However, within the edge termination region 1-3, specially configured charge carrier drainage cells may be included that support drainage of charge carriers, e.g., shortly before and/or during a turn-off operation.

Each IGBT cell 1-1 may exhibit a stripe configuration as schematically illustrated in FIG. 1, wherein the total lateral extension in one lateral direction, e.g., along with the second lateral direction Y, of each IGBT cell 1-1 and its components may substantially correspond to, or, respectively, slightly exceed the total extension of the active cell region 1-2 along this lateral direction.

In another embodiment, each IGBT cell 14 may exhibit a cellular configuration, wherein the lateral extensions of each IGBT cell 1-1 may be substantially smaller than the total lateral extensions of the active cell region 1-2.

However, embodiments described herein rather relate to IGBT cells 1-1 that are based on a stripe configuration with respect to the second lateral direction Y, as exemplarily and schematically illustrated in most of the drawings.

In an embodiment, each of the plurality of IGBT cells 1-1 that are included in the active cell region 1-2 exhibit the same set-up. By way of introduction, a partial section of an exemplary IGBT cell set-up will now be described with respect to FIG. 2.

The configuration of the IGBT cells 1-1 that may be included within the transition region 1-5 can be identical to the configuration of the IGBT cells 1-1 that are included in the active cell region 1-2. Additionally or alternatively, the transition region 1-5 includes IGBT cells that have a different configuration, e.g., in terms of the MPT contacting scheme/neighborhood relation (cf. more detailed explanations below), as compared to the IGBT cells 1-1 of the active cell region 1-2.

Each IGBT cell 1-1 comprises at three or more trenches that extend into the drift region 100 along the vertical direction Z and laterally confine a plurality of mesas 18, 19, wherein the partial section of FIG. 2 only shows two trenches. Each IGBT cell 1-1 may extend at least partially into the semiconductor body 10 and comprise at least a section of the drift region 100. Further, each IGBT cell 1-1 may be electrically connected with the first load terminal 11 to allow for the load current carrying capacity. Each IGBT cell 1-1 may be configured to conduct a part of the load current between said terminals 11 and 12, and to block a blocking voltage applied between said terminals 11 and 12.

For controlling the power semiconductor switch 1, each IGBT cell 1-1 may be equipped with a control electrode 141 included in a control trench 14 of the three or more trenches, wherein the control electrode 141 is configured to selectively set the respective IGBT cell 1-1 into one of the conducting state and the blocking state.

For example, referring to the example illustrated in FIG. 2, a source region 101 of the first conductivity type may be electrically connected with the first load terminal 11. The source region 101 may be n-doped, e.g., at a significantly greater dopant concentration as the drift region 100.

Further, a body region 102 of the second conductivity type may separate the source region 101 and the drift region 100, e.g., the body region 102 can isolate the source region 101 from the drift region 100, as it is known to skilled person acquainted with general principles of IGBT configurations. The body region 102 may be p-doped, e.g. with an electrically activated dopant concentration within the range of $1*10^{15}$ cm$^{-3}$ to $5*10^{18}$ cm$^{-3}$. A transition between the body region 102 and the drift region 100 may form a first pn-junction 1021.

For connecting the source region 101 with the first load terminal 11, first contact plugs 113 can extend from the first load terminal 11 along the vertical direction Z so as to contact both the source region 101 and the body region 102. Instead of the first contact plugs 113, also flat contacts may be employed in other embodiments for connecting the source region 101 and/or the body region 102 with the first load terminal 11. In contrast to contact plugs, such flat contacts to not extend significantly into the semiconductor body 10, but rather terminate approximately at the surface of the semiconductor body 10. In other words, the contact plugs 113 may be formed as contact hole trenches extending into the semiconductor body 10, as illustrated in FIG. 2. Alternatively, the contact plugs 113 may not extend significantly into the semiconductor body 10, but rather terminate approximately at the upper surface of the semiconductor body 10, as is known to the person skilled in the art.

The drift region 100 may extend along the vertical direction Z until it interfaces with a doped contact region 108 that is arranged in electrical contact with the second load terminal 12. The section of the drift region 100 arranged between (the optional) region 105 (explained in more detail below) and the doped contact region 108 may form the major part of the drift region 100, in the following also referred to as lower drift region section 100-2. In an embodiment, the dopant concentration of the drift region 100 increases in a section of the drift region 100 that forms the interface with the doped contact region 108, e.g., so as to form a field stop region of the first conductivity type, as it is known to the skilled person (cf. field stop region 107 in FIGS. 23A-B).

The doped contact region 108 may be formed in accordance with the configuration of the power semiconductor switch 1; e.g., the doped contact region 108 can be an emitter region of the second conductivity type, e.g., a p-type emitter. For forming an RC-IGBT, the doped contact region 108 may be constituted by an emitter region of the second conductivity type that is interrupted by small sections of the first conductivity type that are also electrically connected to the second load terminal 12 and which are commonly referred to as "n-shorts".

For example, the three or more trenches that are included in each IGBT cell 1-1 include at least one control trench 14 having said control trench electrode 141 and at least one dummy trench 15 having a dummy trench electrode 151, wherein each of said trenches 14, 15 may extend into the semiconductor body 10 along the vertical direction Z and include an insulator 142, 152 that insulates the respective trench electrode 141, 151 from the semiconductor body 10.

The trench electrodes 141, 151 of the at least one control trench 14 and of the at least one dummy trench 15 may both be electrically coupled to a control terminal 13 of the power semiconductor switch 1, in accordance with an embodiment. Hence, the dummy trench electrode 151 may be electrically coupled to the control trench electrode 141. For example, the dummy trench electrode 151 is electrically connected to the control trench electrode 141. Or, the dummy trench electrode is electrically coupled to the control trench electrode 141 by means of an ohmic connection having an increased ohmic resistance (as compared to the low ohmic connection).

Whereas FIG. 2 exemplarily illustrates that the dummy trench 15 is arranged adjacent to the control trench 14, it shall be understood that the IGBT cell 1-1 may comprise one or more other trenches of a type different from the control trench type and the dummy trench type, and that this at least one other trench may be arranged adjacent to the control trench 14. For example, said at least one other trench can be a source trench (reference numeral 16 in other drawings) whose trench electrode (reference 161 in other drawings) is electrically connected to the first load terminal 11. This will be explained in more detail below.

For example, the control terminal 13 is a gate terminal. Further, the control terminal 13 may be electrically connected to the control trench electrode 141 and electrically insulated from the first load terminal 11, the second load terminal 12 and the semiconductor body 10, e.g., by means of at least an insulation structure 132.

In an embodiment, the power semiconductor switch 1 may be controlled by applying a voltage between the first load terminal 11 and the control terminal 13, e.g., so as to selectively set the power semiconductor switch 1 into one of the conducting state and the blocking state.

For example, the power semiconductor switch 1 is configured to be controlled based on a gate-emitter-voltage $V_{GE}$, e.g., in a principle manner of controlling an IGBT known to the skilled person.

In an embodiment, the dummy trench electrode 151 may also be electrically connected to the control terminal 13 and thus receive the same control signal as the control trench electrode 141. In another embodiment, the dummy trench electrode 151 may be electrically coupled to the control terminal 13 by means of a resistor having a resistance within the range of 1 mΩ to 1Ω, within the range of 1Ω to 10Ω, or within the range of 10Ω to 100Ω. In another embodiment, the dummy trench electrode 151 is electrically connected to a second control terminal (not illustrated) and thus receives a control signal different from control trench electrode 141. Further, it should be noted that, in an embodiment, the control trench electrodes 141 of all IGBT cells are not necessarily connected to one and the same control terminal 13. Rather, a second control terminal (not illustrated) can be provided, and a first subset of the control trench electrodes 141 is electrically connected to the control terminal 13, and a second subset of the control trench electrodes 141 is electrically connected to the further control terminal. This allows operating the switch 1 with two different control voltages, which can offer the possibility of causing early desaturation of the switch 1, e.g., in case of high carrier confinement. For example, with reference to FIG. 1, starting at the first IGBT cell 1-1 in the active cell region 1-2, every second IGBT cell 1-1 along the first lateral direction X belongs to the first subset, and starting at second IGBT cell 1-1 in the active cell region 1-2 (adjacent to said first IGBT cell 1-1) every second IGBT cell 1-1 along the first lateral direction X belongs to the second subset.

Further, each IGBT cell 1-1 of the power semiconductor switch 1 may have at least one active mesa 18 electrically connected to the first load terminal 11 within the active cell region 1-2, the active mesa 18 comprising the source region 101, the body region 102 and a part of the drift region 100, wherein, in the active mesa 18, respective sections of these regions 101, 102, 100 can be arranged adjacent to a sidewall 144 of the control trench 14, as exemplarily illustrated in FIG. 2. For example, both the source region 101 and the body region 102 are electrically connected to the first load terminal 11, e.g., by means of the first contact plug 113.

In an embodiment of the power semiconductor switch 1, the doped contact region 108 is a p-type emitter, and the active mesa 18 may entirely laterally overlap with the p-type emitter 108.

Further, the control trench electrode 141 (herein also referred to as control electrode 141) can be configured to receive a control signal from the control terminal 13 and to control the load current in the active mesa 18, e.g., by inducing an inversion channel in the body region 102 so as to set the power semiconductor switch 1 into the conducting state. Thus, a transition 181 between the first load terminal 11 and the active mesa 18 may provide for an interface for the load current to pass from the first load terminal 11 into the semiconductor body 10 and/or vice versa.

In an embodiment, the inversion channel in the active mesa 18 may be induced once an inversion channel threshold voltage, e.g., within the respective active mesa 18, is exceeded. For example, the inversion channel threshold voltage depends on at least one of the work function of the control electrode 141, the dopant concentration of the source region 101, the dopant concentration of the body region 102, the relevant thickness of the trench insulator 142, the dielectric constant of the trench insulator 142.

In an embodiment, all active mesas 18 of the power semiconductor switch 1 are configured with the same inversion channel threshold voltage.

For example, the control electrodes 141 of all IGBT cells 1-1 that are included in the active cell region 1-2 may be electrically connected to the control terminal 13. In another embodiment, as indicated above, two control terminals can be provided in order to operate the switch 1 with two different control voltages.

In addition to the active mesa 18, each IGBT cell 1-1 of the power semiconductor switch 1 can have at least one inactive mesa 19, e.g., arranged adjacent to the at least one dummy trench 15, wherein a transition 191 between the first load terminal 11 and the inactive mesa 19 provides an electrical insulation at least for charge carriers of the first conductivity type. In an embodiment, there is no low ohmic connection between the inactive mesa 19 and the first load terminal 11, but, at most, a high ohmic connection between the inactive mesa 19 and the first load terminal. For example, the inactive mesa 19 is not electrically connected to the first load terminal 11. In an embodiment, the inactive mesa 19 may only be non-ohmically coupled to the first load terminal 11, e.g., via at least one pn-junction.

In an embodiment, the IGBT cell 1-1 may be configured to prevent the load current from crossing said transition 191 between the inactive mesa 19 and the first load terminal 11. For example, the inactive mesa 19 does not allow for inducing an inversion channel. In contrast to the active mesa 18, the inactive mesa 19 does not conduct the load current during the conducting state of the power semiconductor switch 1, in accordance with an embodiment. For example, the inactive mesa 19 can be considered as a decommissioned mesa that is not used for the purpose of carrying the load current.

In an embodiment of the inactive mesa 19, the inactive mesa 19 is not electrically connected to the first load terminal 11, but electrically insulated from, e.g., by means of an insulation layer 112. In this embodiment, the transition 191 between the first load terminal 11 and the inactive mesa 19 provides an electrical insulation not only for charge carriers of the first conductivity type, but also for charge carriers of the second conductivity type. To this end, in a variant the inactive mesa 19 comprises neither section of the source region 101 nor a section of the body region 102 nor is the inactive mesa 19 contacted by means of a contact plug (cf. reference numeral 111), as illustrated in FIG. 2. In another variant, the inactive mesa 19 may be configured in a similar manner as the active mesa 18, e.g., by also comprising a section of the source region 101 and/or a section of the body region 102, the difference to the active mesa 18 including that neither the section of the source region 101 (if present) nor the section of the body region 102 of the inactive mesa 19 is electrically connected to the first load terminal 11. In accordance with this embodiment of the inactive mesa 19, no current at all crosses said transition 191.

In another example, the inactive mesa 19 may be electrically connected to the first load terminal 11, wherein the transition 191 between the first load terminal 11 and the inactive mesa 19 provides an electrical insulation only for charge carriers of the first conductivity type, but not for charge carrier of the second conductivity type. In other words, in this example, the inactive mesa 19 may be configured at allow a current of charge carriers of the second conductivity type, e.g., a hole current, to pass said transition 191. For example, depending on the electrical potential of the dummy trench electrode 151, such hole current may only temporarily come into being, e.g., shortly before carrying out a turn-off operation, e.g., so as to reduce the total charge carrier concentration present in the semiconductor body 10. In an embodiment, this may also occur for such inactive mesas 19 with an electrical insulation only for charge carries of the first conductivity type in a reverse conducting IGBT configuration, where the load current would be temporarily carried through these inactive mesas 19 in diode mode operation, where the backside (cf. doped contact region 108) would be structured to comprise both emitters of the second conductivity type and emitters of the first conductivity type (previously referred to as "n-shorts"). As stated above, in this example, the inactive mesa 19 may be electrically connected to the first load terminal 11. For example, a doped contact region (not illustrated) of the second conductivity type (that is different from the electrically floating barrier region 105 mentioned below) of the inactive mesa 19 may be electrically connected to the first load terminal 11, e.g., by means of one of the first contact plugs 113, as schematically and exemplarily illustrated in FIG. 3B. The doped contact region (not illustrated) of the second conductivity type may isolate the section of the drift region 100 that is present within the inactive mesa 19 from the first load terminal 11. For example, in accordance with this example of the inactive mesa 19, within the inactive mesa 19, there is no region doped with dopants of the first conductivity type that is electrically connected to the first load terminal 11.

The above illustrated embodiment of the inactive mesa 19 may allow for providing the configuration of the IGBT cell 1-1 to prevent the load current from crossing said transition 191 between the inactive mesa 19 and the first load terminal 11.

The inactive mesa 19 may be laterally confined by the control trench 14 and the dummy trench 15, or by the dummy trench 15 and another trench type, which will be elucidated further below. Further optional aspects of the inactive mesa 19 will be described below. For example, even though the dummy trench electrode 151 may be electrically connected to the control terminal 13, in an example, the dummy trench electrode 151 is not configured to control the load current in the inactive mesa 19, since the inactive mesa 19 does not allow for inducing an inversion channel within the inactive mesa 19, in accordance with an embodiment.

The power semiconductor switch 1 may further comprise an electrically floating barrier region 105 of the second conductivity type (in the following also simply referred to as "barrier region"), as schematically exemplarily illustrated in FIG. 2. Exemplary features of this barrier region 105 will be explained in greater detail further below. Before the more detailed description of the barrier region 105, exemplary aspects regarding a Micro-Pattern-Trench-Structure (MPT) of the power semiconductor switch 1 shall be explained.

Figure 3A:
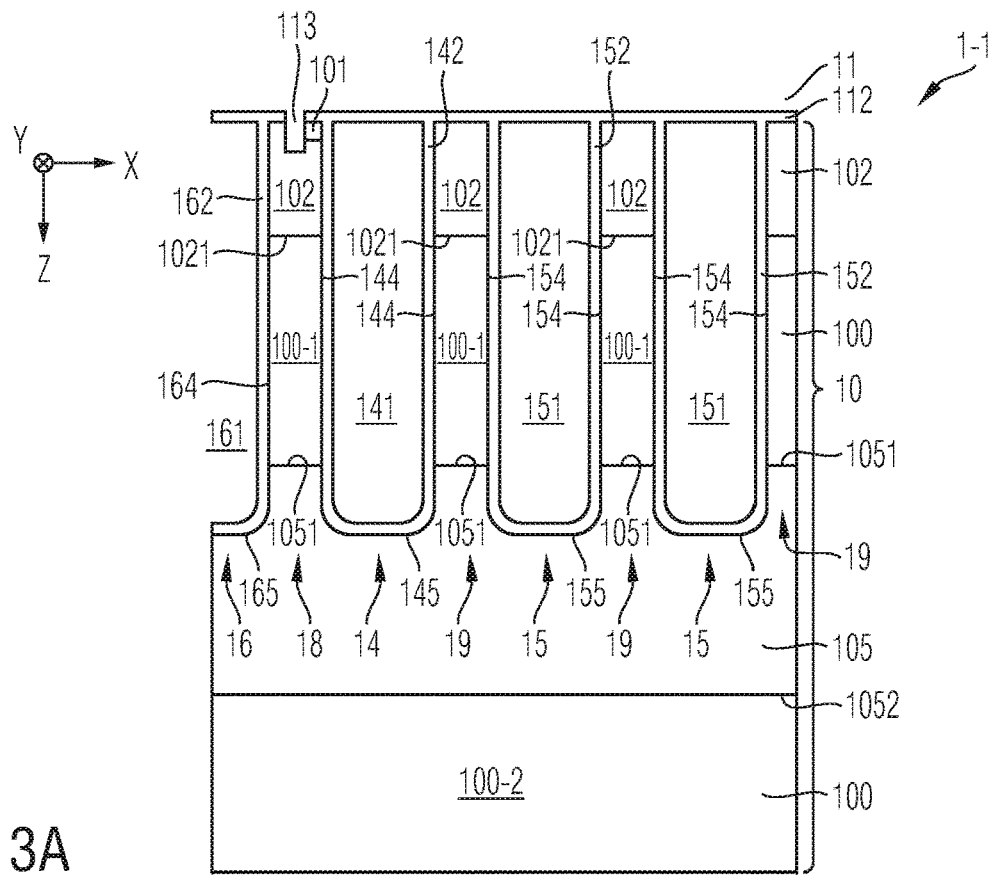
Figure 3B:
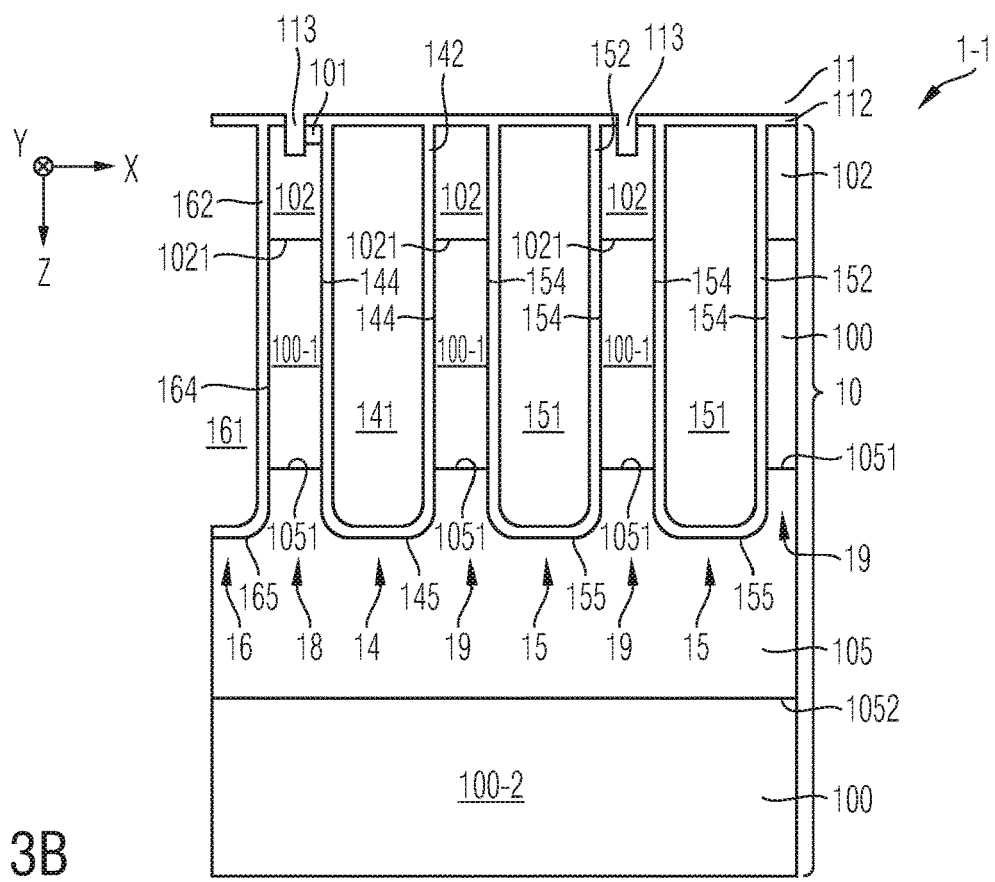

Referring to the embodiments schematically illustrated in FIGS. 3A-B, each IGBT cell 1-1 of the active cell region 1-2 may further comprise at least one source trench 16 that extends into the semiconductor body 10 along the vertical direction Z and includes an insulator 162 that insulates a source trench electrode 161 from the semiconductor body 10, the source trench electrode 161 being electrically connected to the first load terminal 11. For example, the at least one source trench 16 is arranged between the control trench 14 (on the right) and the dummy trench 15 of an adjacent cell 1-1 (on the left, not illustrated), as illustrated in FIGS. 3A-B. In an embodiment, each IGBT cell 1-1 may comprise more than one source trench 16, e.g., two source trenches 16 or three source trenches 16 (cf. FIG. 6A), wherein each of the trench electrodes 161 of the source trenches 16 may be electrically connected to the first load terminal 11. For example, the more than one source trenches 16 are arranged between the control trench 14 on the one side and the dummy trench 15 on the other side.

In an embodiment, the active mesa 18 may be laterally confined by the control trench 14 and the source trench 16. For example, the sidewall 144 of the control trench 14 and a sidewall 164 of the source trench 16 confine the active mesa 18 along the first lateral direction X. The active mesa 18 may be configured in a manner that has exemplarily described with respect to FIG. 2; e.g., the first contact plug 113 may electrically connect each of the section of the body region 102 and the section of the source region 101 to the first load terminal 11.

Still referring to the embodiment schematically illustrated in FIGS. 3A-B, each IGBT cell 1-1 of the active cell region may further comprise, in addition to the control trench 14 and the dummy trench 15 (and in addition to or as an alternative to the at least one source trench 16) at least one further trench that extends into the semiconductor body 10 along the vertical direction Z and includes an insulator that insulates a further trench electrode from the semiconductor body 10. This at least one further trench is one of a further control trench 14 and a further dummy trench 15. FIGS. 3A/B show a variant where there is provided one further trench in the form of a further dummy trench 15.

Thus, in an embodiment, each IGBT cell 1-1 comprises at least three trenches, namely the control trench 14, the dummy trench 15 and the further (dummy or control) trench, whose trench electrodes 141, 151 are each coupled or electrically connected to the control terminal 13. In an embodiment, these three trenches can be arranged adjacent to each other, as illustrated in FIGS. 3A-3B. In other embodiment, the at least one source trench 16 is arranged between two of these three control/dummy trenches 14, 15.

Even though not illustrated in the drawings, each IGBT cell 1-1 of the active cell region 1-2 may further comprise, in addition to or as an alternative to the at least one source trench 16, at least one floating trench that extends into the semiconductor body 10 along the vertical direction Z and includes an insulator that insulates a trench electrode from the semiconductor body 10, the trench electrode of the floating trench being electrically floating. In an embodiment, the trench electrode of the floating trench is neither electrically connected to the first load terminal 11, nor electrically connected to the second load terminal 12, nor electrically connected to the control terminal 13, nor to a section of the semiconductor body 10. In another embodiment, the electrically floating trench electrode is connected, by means of a connection having a high ohmic resistance, to a defined electrical potential (e.g., to an electrical potential of a contact or to an electrical potential of another semiconductor region). For example, by means of said high ohmic connection, during a switching operation, the electrical potential of the electrically floating trench electrode is temporarily decoupled from the defined electrical potential. Said decoupling may occur on a time scale of said switching operation, e.g., for at least 10 ns, or at least 100 ns, or at least 10 μs. For example, the resistance of said high ohmic connection amounts to more than 100Ω, or to more than 1 MΩ In an embodiment, an ohmic resistance, e.g. measured during a standstill situation, between the first load terminal 11 and the electrically floating trench electrode amounts to more than 100Ω, or to more than 1 MΩ For example, if present, the at least one floating trench can be arranged between the control trench 14 and the dummy trench 15.

Thus, in accordance with an embodiment, each IGBT cell 1-1 of the active region 1-2 comprises at least one control trench 14, at least one dummy trench 15, at least one further (dummy or control) trench 14;15 and, optionally, at least one source trench 16.

Figure 4:
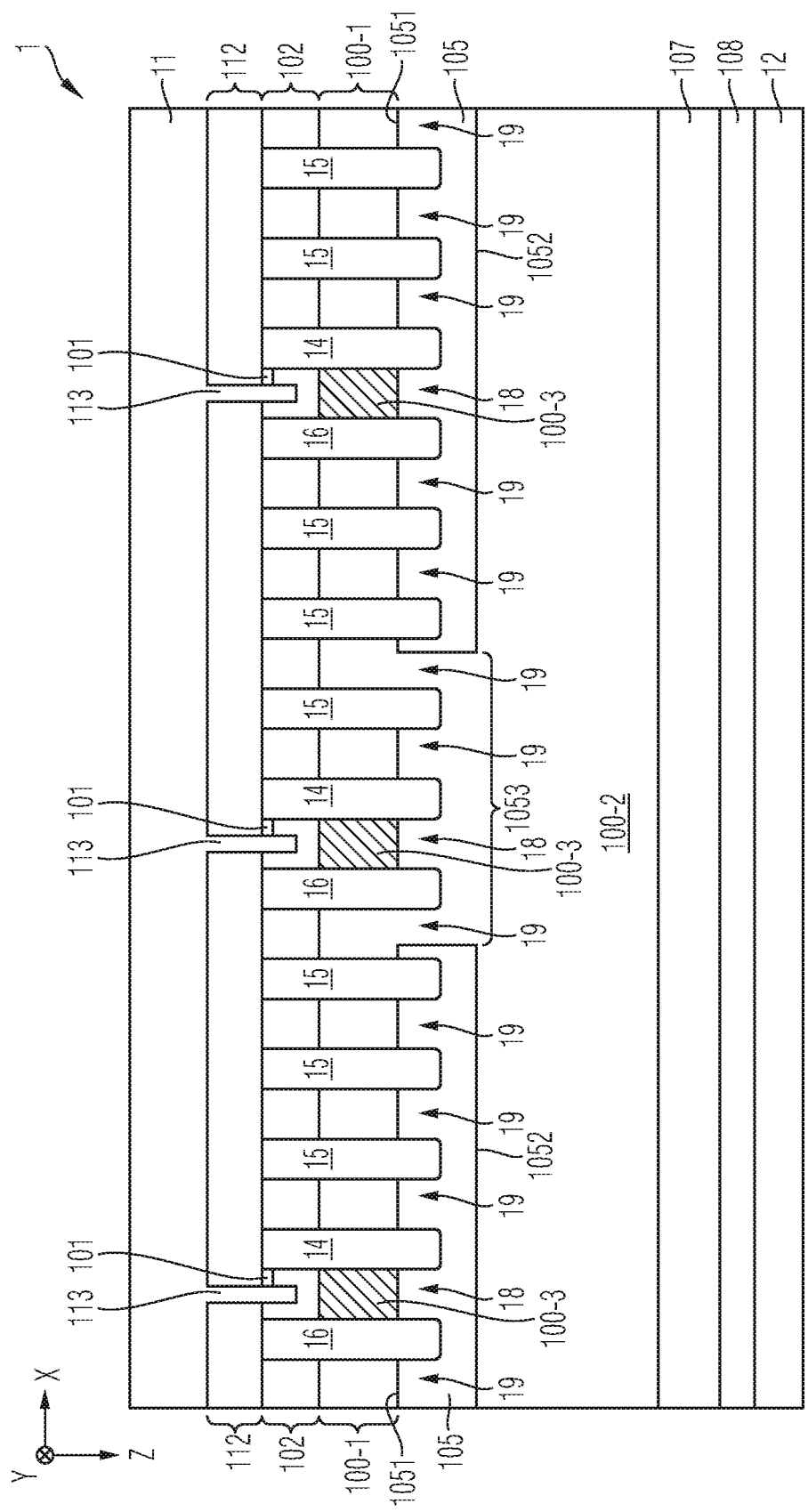

Further, in accordance with the embodiment illustrated in FIGS. 3A-B and FIG. 4, each IGBT cell 1-1 of the active cell region 1-2 may comprise more than one inactive mesas 19, wherein at least one of the inactive mesas 19 can be laterally confined by the source trench 16 and the dummy trench 15. Another inactive mesa 19 can be laterally confined by two source trenches 16. Another inactive mesa 19 can be laterally confined by two dummy trenches 15. Yet another inactive mesa 19 can be laterally confined by one of the dummy trenches 15 and the control trench 14. As illustrated, each of the inactive mesas 19 may comprise a respective section of the body region 102, wherein, in an embodiment, these sections are not electrically connected to the first load terminal 11 but electrically insulated therefrom, e.g., by means of the insulation layer 112, as has been explained above.

In an embodiment, the power semiconductor switch 1 can be an IGBT and each of its IGBT cells 1-1 of its active region 1-2 may exhibit a micro pattern trench (MPT) structure.

For example, each or at least most of the trenches 14, 15, 16 that may be included in the IGBT cell 1-1 may exhibit equal spatial dimensions and may be arranged in accordance with a regular pattern. For example, each of the trenches 14, 15, 16 may exhibit a depth along the vertical direction Z within the range of 3 μm to 8 μm, and a width along the first lateral direction X within the range of 0.4 μm to 1.6 μm. The trenches 14, 15, 16 can be formed according to a first layout having a first pitch, wherein the first layout may define each of the trench widths and the mesa widths. Also the mesas 18, 19 may have the same mesa width. In an embodiment, however, the width of the inactive mesa 19 may be different, e.g., wider than the width of the active mesa 18. For example, at least one of the at least one inactive mesa 19 of each cell 1-1 may be at least a factor of 1.5 wider than the active mesa width. For example, all active mesas 18 have the same active mesa width, and all inactive mesas 19 have the same inactive mesa width, wherein the inactive mesa width may be greater than the active mesa width, e.g., by factor of at least 1.5.

Further, each or at least most of the trench electrodes 141, 151, 161 of all trenches 14, 15, 16 that may be included in the IGBT cell 1-1 may exhibit equal spatial dimensions, e.g., regarding the total extension along the vertical direction (which is terminated by means of the respective trench bottoms 145, 155, 165) and the total extension in the first lateral direction (i.e., the trench width, which is terminated by means of the respective sidewalls 144, 154, 164), and/or regarding the dimensions of the insulators 142, 152, 162. In addition, each of the trenches 14, 15, 16 that may be included in the IGBT cell 1-1 can be arranged equidistantly along the first lateral direction X. For example, each of the active mesas 18 of the IGBT cell 1-1 may exhibit the same width, which may be within the range of 0.1 µm to 2 µm, within the range of 0.3 µm to 0.8 µm, or within the range of 0.6 µm to 1.4 µm. The inactive mesa width may be within the same ranges, e.g., identical to the active mesa widths or, respectively, greater, as explained above.

Further, some of the trenches 14, 15, 16 that may be included in the IGBT cell 1-1 may extend into the barrier region 105, e.g., by at least 100 nm, by at least 500 nm or by at least 1000 nm. This aspect will also be explained in greater detail below.

For the following explanations, these abbreviations may apply:
G=control trench 14
D=dummy trench 15
S=source trench 16
k=active mesa 18
o=inactive mesa 19

As has been stated above, the power semiconductor switch 1 may comprise a plurality of equally configured IGBT cells 1-1 within the active cell region 1-2. In an embodiment, using the abbreviations introduced above, three exemplary neighborhood relationship within in each IGBT cell 1-1 of the active cell field 1-2 may be expressed as follows (for three adjacent IGBT cells 1-1, to be continued in accordance with the number of the IGBT cells 1-1):
(1) kSkGoDoG-kSkGoDoG-kSkGoDoG- . . .
(2) kSoSkGoDoG-kSoSkGoDoG-kSoSkGoDoG- . . .
(3) kSoSoSkGoDoG-kSoSoSkGoDoG-kSoSoSkGoDoG- . . .

Without being limited to these exemplary neighborhood relationships (also being referred to as contacting schemes herein), the embodiments according to most of the remaining drawings are based on the above identified exemplary neighborhood relationships. Thus, it shall be understood that the IGBT cells 1-1 must not necessarily comprise a floating trench, in accordance with an embodiment.

Referring to all embodiments described herein, it shall be understood that the neighborhood relationship/contacting scheme in each IGBT cell 1-1 can be chosen such that:
(a) each of the number of control trenches 14 ("G" in the examples above) that are included in the respective IGBT cell 1-1 is arranged adjacent to no more than one active mesa 18. This design rule may be fulfilled along the entire extension in the second lateral direction Y of the respective IGBT cell 1-1. Hence, in an embodiment, during the on-state of the switch 1, a load current path in the respective IGBT cell 1-1 is only present at one side of the respective control trench 14. In so far, the IGBT cell design can be considered to be asymmetric. In the examples above, the active mesas 18 ("k" in the examples above) in the IGBT cells 1-1 are laterally confined by a respective control trench 14 and a respective source trench 16 ("S" in the examples above).
(b) at least one of the number of inactive mesas 19 ("o" in the examples above) is arranged adjacent to the at least one dummy trench 15 ("D" in the examples above). Another one of the number of inactive mesas 19 can for example be arranged between two source trenches 16 ("S" in the examples above). In fact, a trench with its trench electrode connected to the control terminal 13 and being arranged adjacent to inactive mesas 19 on both sides makes this trench a dummy trench 15. If one of its adjacent mesas were an active mesa 18, then this trench would be a control trench 14.

As indicated above, irrespective of the contacting scheme, the power semiconductor switch 1 may further comprise an electrically floating barrier region 105 of the second conductivity type (in the following also simply referred to as "barrier region").

In an embodiment, the barrier region 105 is configured to provide for an electrically conductive path between a section of the active mesa 18 and the bottom 155 of the dummy trench 15. Thus, the barrier region 105 may be configured to guide the electrical potential of the section of the active mesa 18 to the bottom 155 of the dummy trench 15. For example, the barrier region 105 may extend into the active mesa 18 and from there below the bottom 165 of the source trench 16 and across the inactive mesa 19 so as to interface with the bottom 155 of the dummy trench 15.

As has been stated above, the power semiconductor switch 1 may comprise a plurality of IGBT cells 1-1, e.g., most of them included in the active cell region 1-2. For example, the barrier region 105 connects the inactive mesas 19 included in the plurality of IGBT cells 1-1 within the active region 1-2 with each other. For example, to this end, the barrier region 105 may extend partially into each of the inactive mesas 19. The barrier region 105 may further extend, at least partially, into some of the active mesas 18. Each of the dummy trench bottoms 155 may extend into the barrier region 105. Thereby, the barrier region 105 can guide the electrical potential present within the active mesas towards the dummy trench electrodes 151.

As will be explained in more detail below, the barrier region 105 may laterally overlap with some (parts) of the active mesas 18 and may not laterally overlap with other (parts) of the active mesas 18. For example, to this end, the barrier region 105 may exhibit a lateral structure formed by one or more passages 1053, as will be explained in more detail below, and/or the barrier region 105 may be laterally displaced from the edge termination region 1-3, e.g., by means of at least the transition region 1-5 that may (as explained above) be equipped with one or more active mesas 18.

The total volume of all active mesas 18 of all IGBT cells 1-1 in the active cell region 1-2 can be divided into a first share and into a second share, the first share not laterally overlapping with the barrier region 105 and the second share laterally overlapping with the barrier region 105. For example, the first share of the active mesas 18 laterally overlaps with the at least one passage 1053 (cf. explanations further below) of the barrier region 105 or with another section of the drift region 100 where the barrier region 105 is not present (e.g., within the transition region 1-5). In contrast, the second share of the active mesas 18 laterally overlaps with the barrier region 105. For example, the load current conducted by the second share traverses the barrier region 105.

In an embodiment, the first share is configured to carry the load current at least within the range of 0% to 100% of the nominal load current for which the power semiconductor device is designed. The second share may be configured to carry the load current if it exceeds at least 0.5% of the nominal load current.

Hence, the first share of active mesas 18 can be considered as an "ignition volume" which, e.g., during turn-on of the power semiconductor switch 1 starts to conduct the load current whereas the second share initially remains inactive. Then, if, e.g., only if the load current exceeds a threshold of, e.g., at least 0.5% of the nominal load current (wherein this threshold can be higher than 0.5%, e.g., higher than 1%, e.g., at least 5% or at least 10%), the barrier region 105 may become more conductive such that the second share may also carry the load current.

For example, for small load currents below 10%, or below 1%, or below 0.5% of the nominal load current of the power semiconductor switch 1, the active mesas 18 without lateral overlap with barrier region 105 (i.e., said first share of the total volume) may act as emitters of charge carriers of the first conductivity type, and, e.g., by this avoid a snapback in the transfer or output characteristics of the power semiconductor switch 1. For larger load currents (greater than 0.5%, than 1%, than 5% or than 10% of the nominal load current) an upper pn-junction 1051 (cf. explanation below) is in a forward bias mode with respect to the charge carriers of the first conductivity type. This may then allow also for charge carriers of the first conductivity type to be emitted by the active mesas 18 laterally overlapping with the barrier region 105 (i.e., said second share of the total volume).

As already explained above, each active mesa 18 can be configured to induce an inversion channel within the respective active mesa 18. For example, all active mesas 18 are configured with the same inversion channel threshold voltage. Thus, the delay between the begin of the load current conduction within the second volume share and the begin of the load current conduction within the first volume share (according to which, e.g., during turn-on, the second volume share of the active mesas 18 that laterally overlaps with the barrier region 105 only carries the load current once the load current exceeds said threshold value of, e.g., at least 0.5%) exemplarily described above is, e.g., neither caused by means of providing a control signal to the control electrodes controlling the first volume share different from a control signal provided to the control electrodes controlling the second volume share, nor by a difference between inversion channel threshold voltages. Rather, the first volume share and the second volume share are provided with the same control signal and are configured with the same inversion channel threshold voltage and said delay is achieved only by accordingly positioning and/laterally structuring the barrier region 105, in accordance with an embodiment.

Hence, in an embodiment, the only differentiating feature between the first volume share of the active mesas 18 and the second volume share of the active mesas 18 is that the first volume share does not laterally overlap with the barrier region 105 and that the second volume share does laterally overlap with the barrier region 105. For example, thereby, the said exemplarily described delay between the load current conduction begins (starting times) is achieved.

For example, once the load current is conducted by both volume shares, it may be distributed among the volume shares in accordance with the ratio between the volume shares. In an embodiment, if the load current exceeds 50% of the nominal load current, the ratio between a first load current share conducted by the first volume share of the active mesas 18 and a second load current share conducted by the second volume share of the active mesas 18 can be at least within 10% of the ratio between the first volume share and the second volume share or, respectively, the ratio between the first load current share conducted by the first volume share of the active mesas 18 and the second load current share conducted by the second volume share of the active mesas 18 can be (at least substantially) identical to the ratio between the first volume share and the second volume share.

The electrically floating barrier region 105 can be spatially confined, in and against the vertical direction Z, by the drift region 100. Hence, the barrier region 105 may form each of the upper pn-junction 1051 and a lower pn-junction 1052 with the drift region 100, wherein the lower pn-junction 1052 can be arranged lower than the bottom 155 of the dummy trench 15. For example, the upper pn-junction 1051 is arranged within the inactive mesa(s) 19 and, hence, above the bottom 155 of the dummy trench 15. The distance between the first pn-junction 1021 and the upper pn-injunction 1051 along the vertical direction Z may amount to at least 0.5 μm. Thus, the two pn-junctions 1021 and 1051 are not identical to each other, but separated from each other by means of a section of the drift region 100, in accordance with an embodiment, wherein said section may at least partially be higher doped as compared to a lower drift region section 100-2 below the barrier region 105, which will be described in more detail below.

In other words, the barrier region 105 may be separated from the body region 102 by means of at least a part of the drift region 100. For example, the barrier region 105 is confined, along the vertical direction Z, by an upper section 100-1 of the drift region 100 on the one side and by a lower section 100-2 of the drift region 100 on the other side, wherein said upper section 100-1 forms a transition to the body regions 102 of the IGBT cells 1-1. The lower section 100-2 may extend along the vertical direction Z until it interfaces, e.g., by means of the field stop region (cf. field stop region 107 in FIGS. 23A-B), with the doped contact region 108, which may be, as illustrated above, a p-type emitter.

In an embodiment, the barrier region 105 is not in contact with any other semiconductor region of the second conductivity type, but separated therefrom, e.g., at least by means of section(s) of the drift region 100. For example, the distance between the barrier region 105 to the closest other semiconductor region of the second conductivity type amounts to at least 1 μm or to at least 2 μm. Thus, for example, there is no p-type connection between the body regions 102 and the barrier region 105, nor is there a p-type connection between the barrier region 105 and the well region 109 of the edge termination region 109 (mentioned further below). Along said distance, a portion of the drift region 100 may be present.

With respect to all embodiments discussed above, it shall be understood that, in accordance with a variant, the sections of the drift region 100 that are included in the mesas 18 and 19, e.g., the upper sections 100-1 forming the first pn-junction 1021 with the body region 102 and the upper pn-junction 1051 with the barrier region 105 (cf. explanations below), may at least section-wise exhibit a dopant concentration at least twice as great as compared to the dopant concentration of the section of the drift region 100 arranged below the barrier region 105, e.g., said lower section 100-2 of the drift region 100 that forms the lower pn-junction 1052 with the barrier region 105.

Said sections (upper sections 100-1) of the drift region 100 that are included in the mesas 18 and 19 may each exhibit a maximum dopant concentration within the range of $1*10^{13}$ cm$^{-3}$ to $4*10^{17}$ cm$^{-3}$, e.g., a maximum dopant concentration of at least $1*10^{16}$ cm$^{-3}$. For example, said sections of the drift region 100 that are included in the mesas 18 and 19 and that may exhibit said increased dopant concentrations can be referred to as "n-barrier regions" (cf. reference numeral 100-3 in other drawings and further explanation below). For example, the dopant concentration of the sections of the drift region 100 that are included in the mesas 18 and 19 is chosen such that the upper pn-junction 1051 remains at a level slightly above the trench bottoms 145 and 155.

Now referring to FIG. 4, in accordance with a variant, the increased dopant concentration in the upper section (section 100-1) of the drift region 100 is only locally provided. For example, only one of the active mesas 18, or only several of the active mesas 18, or only all of the active mesas 18 comprise a local n-barrier region 100-3 (herein also referred to as "further barrier region"). For example, each of the local n-barrier regions 100-3 is arranged above the barrier region 105 or, respectively, the barrier region passage 1053, and below the respective body region 102. For example, each n-barrier region 100-3 is arranged in contact with the respective body region 102 and extends from there down along the vertical direction Z until it interfaces with the (p-) barrier region 105 or, respectively, terminates at a corresponding Z-level if the (p-) barrier region 105 is absent/exhibits a passage 1053 at the respective location. Along the first lateral direction X, each n-barrier region 100-3 may fill the respective active mesa 18. Each n-barrier region 100-3 may exhibit a maximum dopant concentration at least twice as great as the dopant concentration of the lower section 100-2 of the drift region 100. For example, each n-barrier region 100-3 exhibits a maximum dopant concentration within the range of $1*10^{13}$ cm$^{-3}$ to $4*10^{17}$ cm$^{-3}$, e.g., a maximum dopant concentration of at least $1*10^{16}$ cm$^{-3}$. In contrast, in accordance with this variant, the upper section 100-1 of the drift region included in the inactive mesas 19 may exhibit a maximum dopant concentration substantially equal to the maximum dopant concentration of the lower section 100-2 of the drift region 100; e.g., there are no n-barrier regions 100-3 provided within the inactive mesas 19, or, at least, the n-barrier region 100-3 does not extend into any one of the inactive mesas 19 that are arranged adjacent to one of the dummy trenches 14. As further illustrated in FIG. 4, the n-barrier region 100-3 laterally overlaps with at least one of the path-through passages 1053 of the (p-) barrier region 105.

Other aspects related to the n-barrier region 100-3 will be described further below.

In a variant (not illustrated), the upper pn-junction 1051 may even be arranged lower than each of the bottom 155 of the dummy trench 15 and said bottom 145 of the control trench 14 (wherein this example is not illustrated). In that case, a distance along the vertical direction Z between the bottom 155 of the dummy trench 15 and the upper pn-junction 1051 can be smaller than 3 µm, smaller than 2 µm, or even smaller than 1 µm.

For example, the barrier region 105 exhibits a thickness along the vertical direction Z within the range of 0.1 µm to 0.5 µm, within the range of 0.5 µm to 1 µm, or within the range of 1 µm to 5 µm.

The common vertical extension range along the vertical direction Z between the barrier region 105 the trenches that extend into the barrier region 105 maybe within the range of 50 nm to 3000 nm, for example. In an embodiment, the barrier region 105 extends further along the vertical direction Z (i.e., down to a deeper level within the semiconductor body 10) as compared to all or, respectively, at least most of the trenches.

The barrier region 105 may exhibit a resistivity of more than 10Ωcm and of less than 1000Ωcm, e.g., of more than 100Ωcm and of less than 500Ωcm, in accordance with an embodiment.

The barrier region 105 may include at least one of boron (B), aluminum (Al), difluoroboryl (BF$_2$), boron trifluoride (BF$_3$), or a combination thereof. A respective one of these exemplary materials may serve as the dopant material, in accordance with an embodiment. Further, a respective one of these exemplary materials can be implanted into the semiconductor body 10 so as to form the barrier region 105.

For example, the barrier region 105 exhibits an electrically activated dopant concentration greater than $1*10^{14}$ cm$^{-3}$ and smaller than $4*10^{17}$ cm$^{-3}$. Said dopant concentration, e.g., amounting to approximately $1*10^{16}$ cm$^{-3}$, may be present with an extension along the vertical direction Z of at least 0.5 µm, or of at least 1 µm. Further, the barrier region 105 may exhibit a maximum dopant concentration in a region where the bottom 155 of the dummy trench 15 extends into the barrier region 105.

In an embodiment, the dopant concentration of the barrier region 105 is smaller than the dopant concentration present in the body regions 102. For example, the maximal dopant concentration of the barrier region 105 is within the range of 1% to 80% of the dopant concentration present in the body region 102.

Figure 5A:
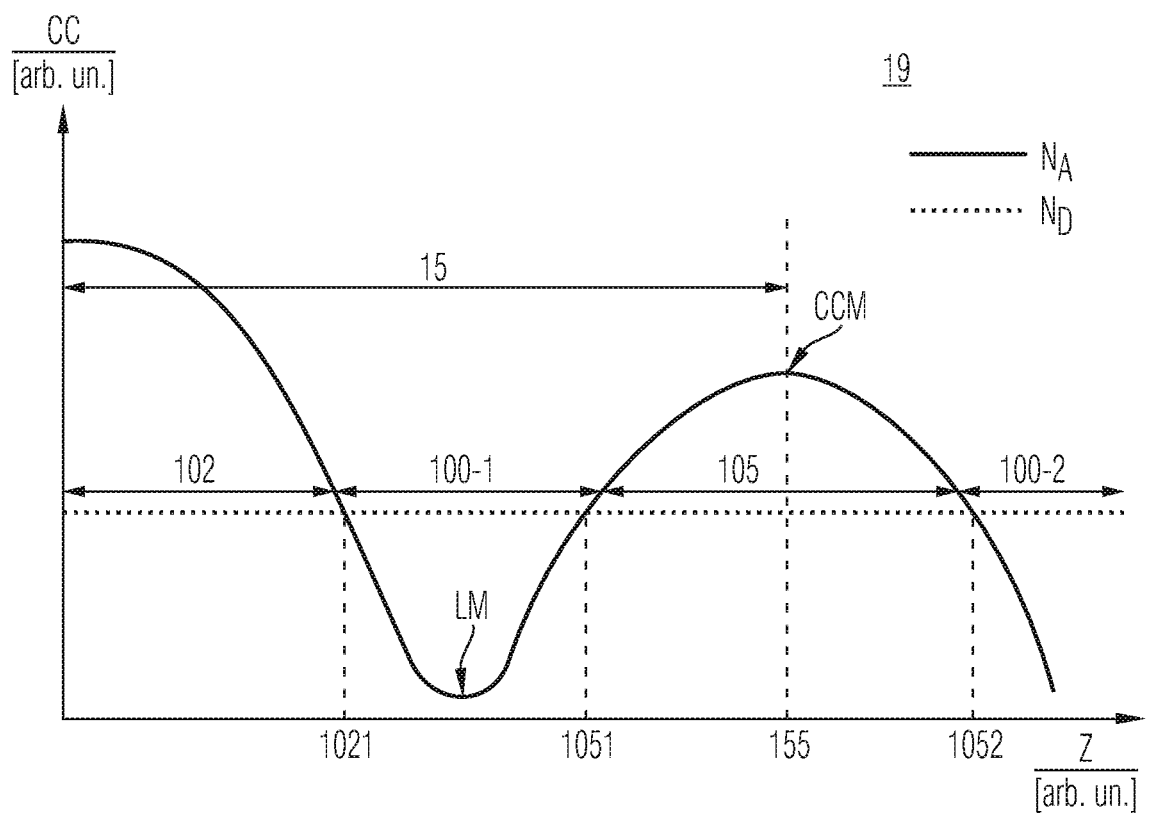
FIGS. 5A-5C schematically and exemplarily illustrate courses of dopant concentrations along the vertical direction in a power semiconductor switch in accordance with one or more embodiments.
Figure 5B:
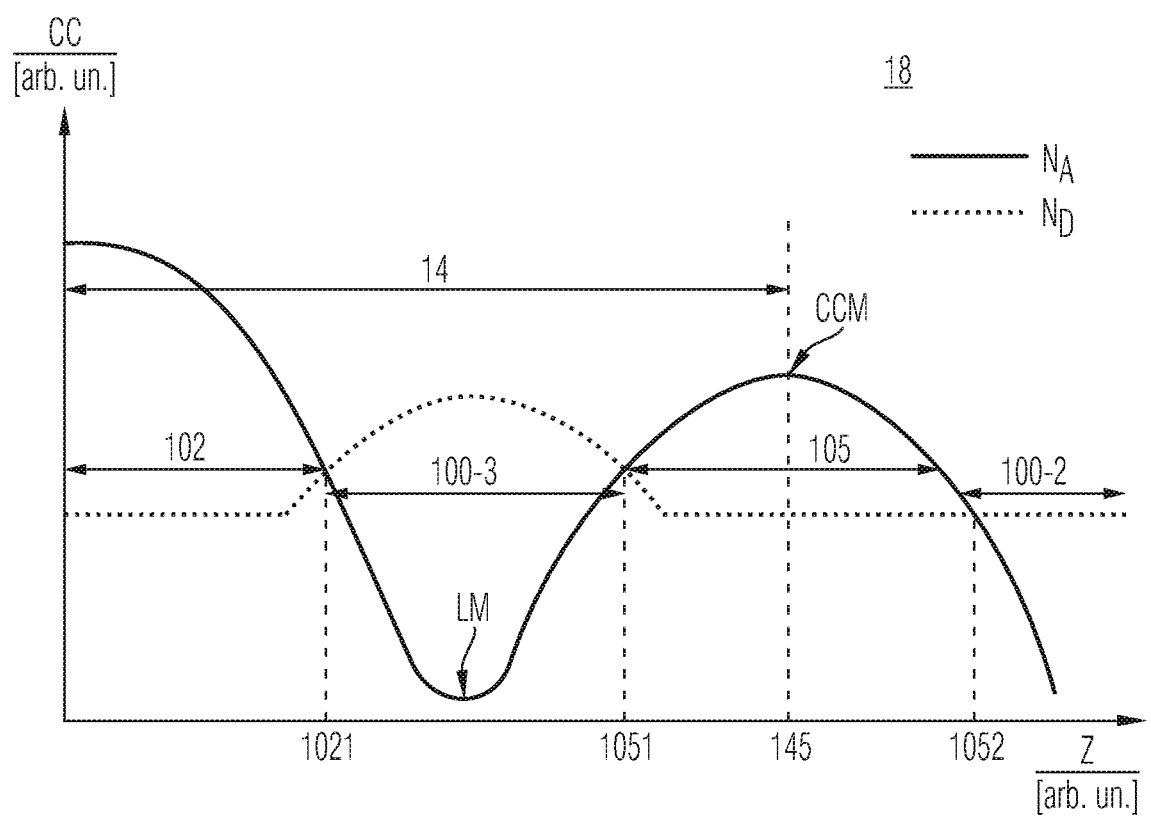
Figure 5C:
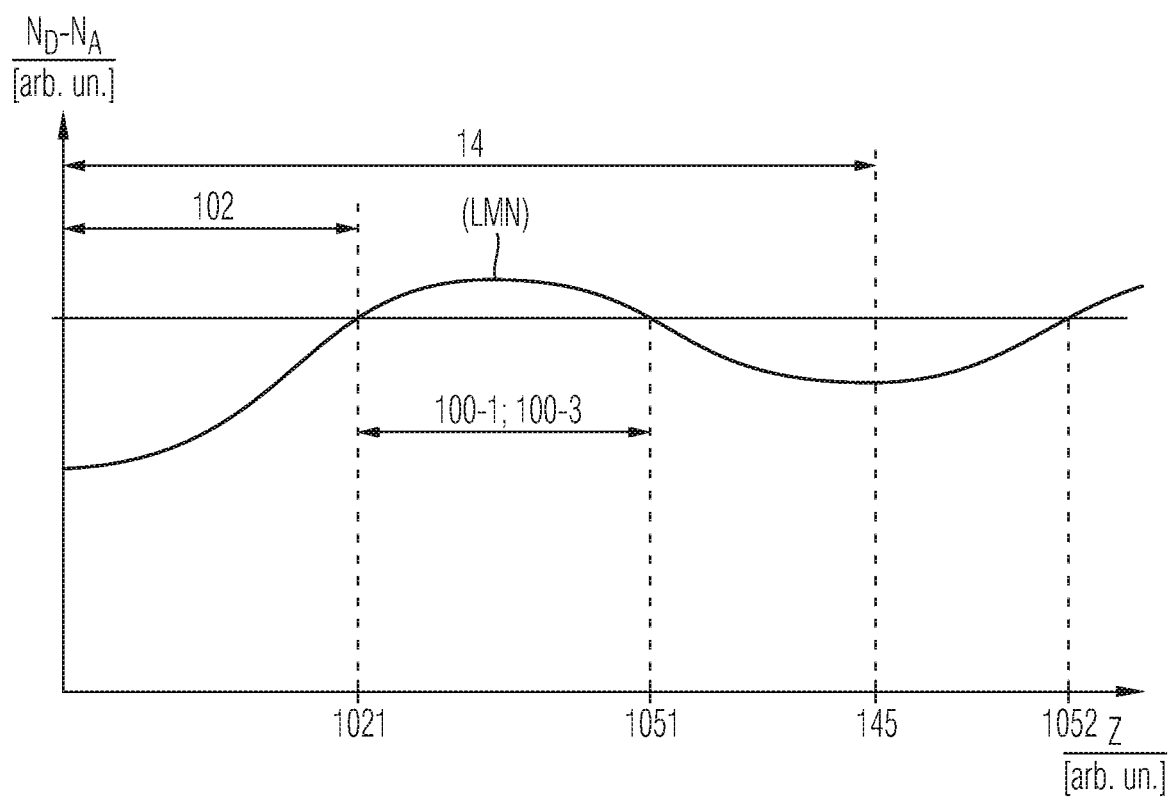

Exemplary courses of the dopant concentration (CC) of dopants of the second conductivity type along the vertical direction Z are illustrated in FIGS. 5A-C, wherein the solid line indicates the dopant concentration the second conductivity type (N$_A$) and the dotted line the indicates the dopant concentration the first conductivity type (N$_D$). FIG. 5A may relate to the inactive mesa 19, and FIG. 5B may relate to the active mesa 18, e.g., including the n-barrier region 100-3, and FIG. 5C may relate to the net dopant concentration N$_D$-N$_A$ in the active mesa 18.

It shall be understood that the courses in FIGS. 5A-C are only schematically drawn for illustration purposes, and not illustrated as being true to scale.

Referring to both FIGS. 5A and 5B, in an upper section, e.g., in proximity to the first load terminal 11, the dopant concentration N$_A$ may be comparatively high so as to provide for the body region 102, that is connected to the first load terminal 11 in case of the active mesa 18, and that is not electrically connected to the first load terminal 11 in case of the inactive mesa 19.

Still referring to both FIGS. 5A and 5B, the dopant concentration N$_A$ then decreases rapidly in a section of the mesa where the drift region 100 (said upper section 100-1 or, respectively, the n-barrier region 100-3) is present. The transition between the body region 102 and the upper section 100-1 of the drift region 100 may form said first pn-junction 1021 within the respective mesa. In case the inactive mesa 19 does not comprise a section of the body region 102, the value of the dopant concentration CC between the beginning at the first load terminal 11 and the beginning of the barrier region 105 would accordingly be at the value corresponding to the local minimum LM illustrated in FIGS. 5A-B, or lower. Then, e.g., before the respective trench bottom 155, the dopant concentration N$_A$ increases (again) so as to form the barrier region 105. The transition with between the upper section 100-1 of the drift region 100 and the barrier region 105 forms the upper pn-junction 1051. As illustrated, the barrier region 105 may exhibit its dopant concentration maximum CCM at the depth level being substantially identical to the level where the respective trench terminates, e.g., at the level of the bottom 155 of the dummy trench 15. The dopant concentration $N_A$ then decreases again so to form the lower pn-junction 1052 with the lower section 100-2 of the drift region 100.

Figure 23A:
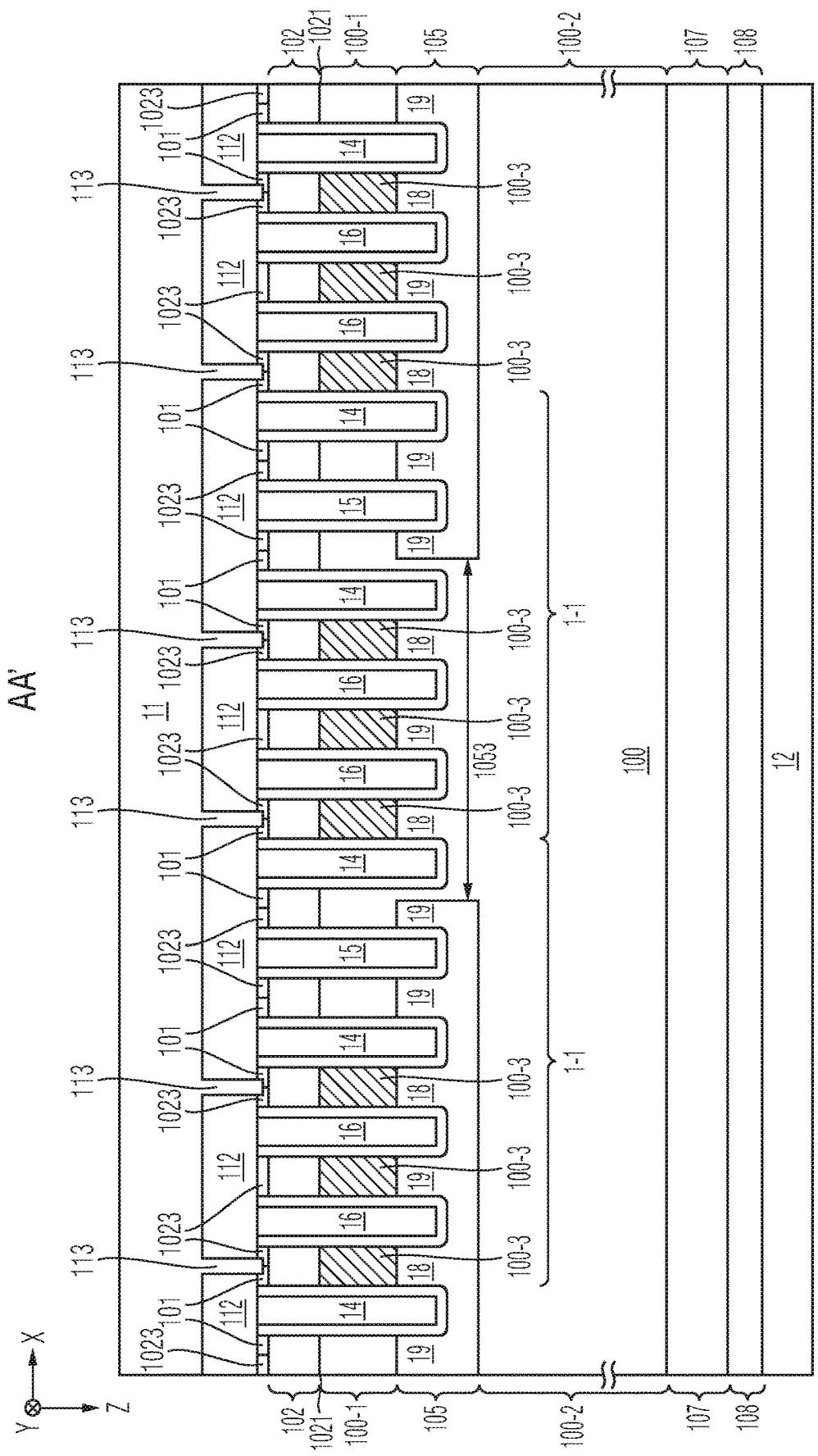
FIGS. 23A, 23B, 23B', and 23C each schematically and exemplarily illustrate a section of a vertical cross-section of a power semiconductor switch in accordance with some embodiments.
Figure 23B:
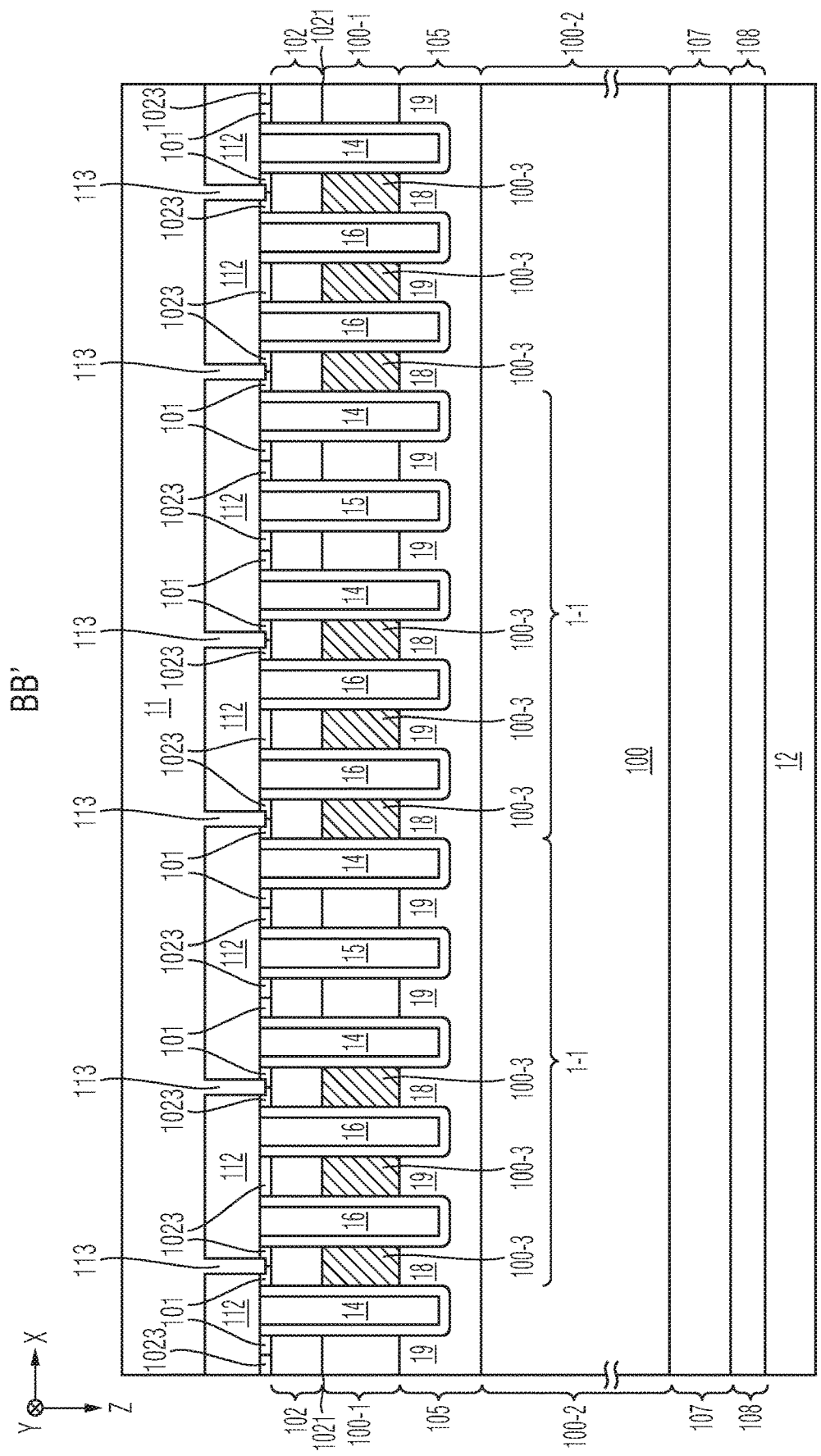
Figure 23B:
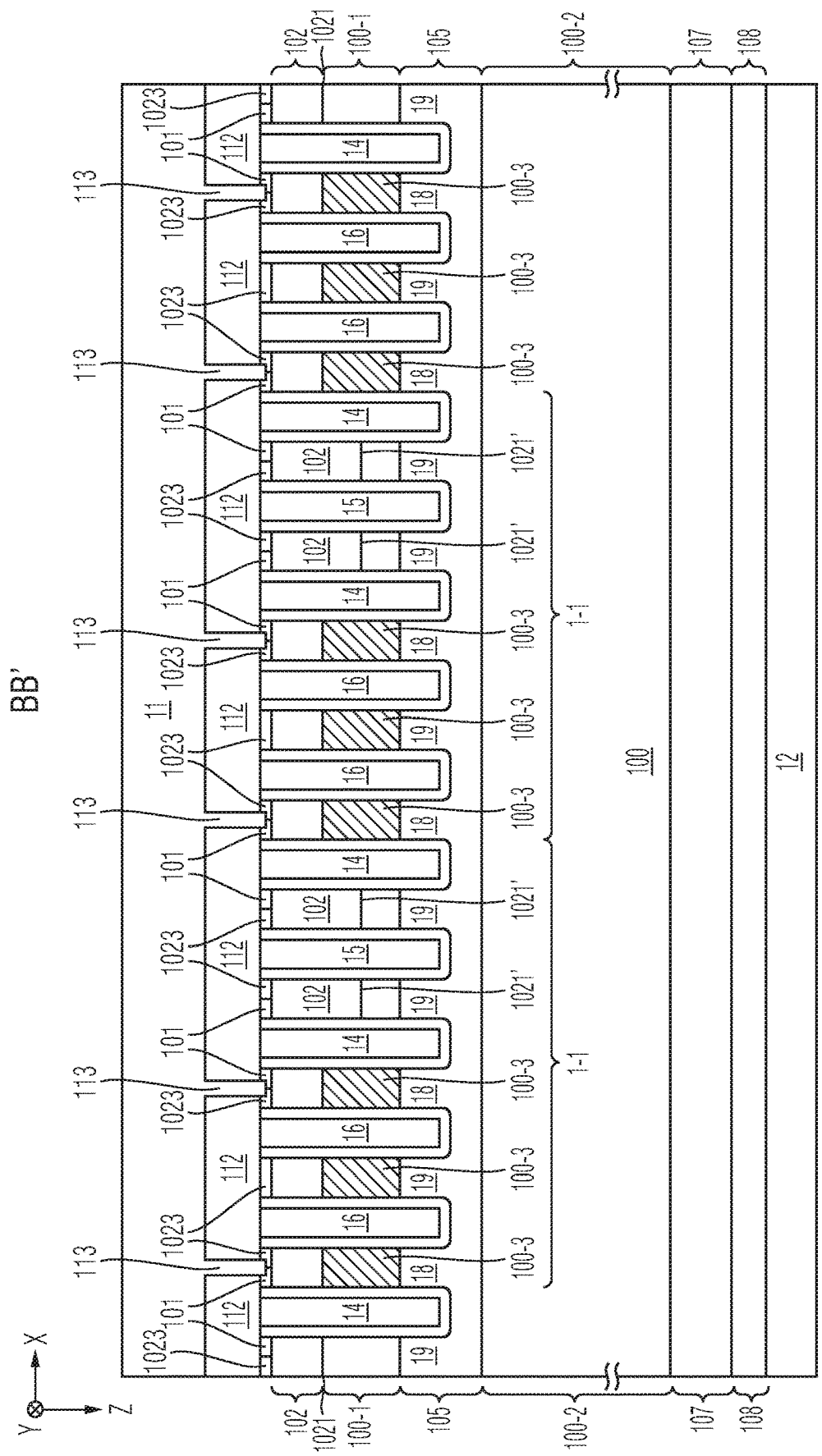
Figure 23C:
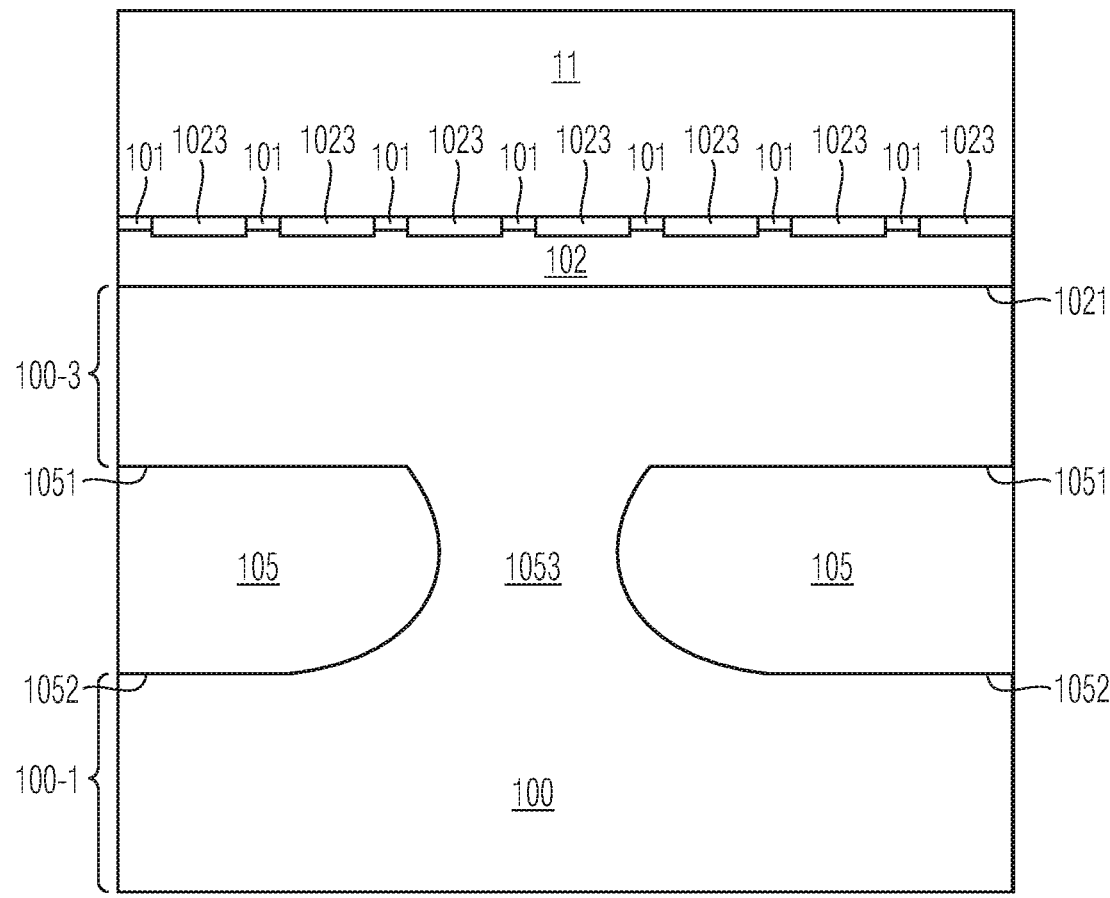

Regarding the course of the dopant concentration the first conductivity type $N_D$, it shall first be noted that neither FIG. 5A nor FIG. 5B reflects the source region nor a highly doped contact region of the second conductivity type close to the contact surface (cf. reference numeral 1023 in other drawings, e.g. FIG. 23A-C. Emphasis is rather being placed on the course between the first pn-junction 1021 and the upper pn-junction 1053: In case where there is no n-barrier region 100-3, the value $N_D$ is substantially constant (FIG. 5A). In contrast, in case of the n-barrier region 100-3, the value $N_D$ reaches a local maximum between the first pn-junction 1021 and the upper pn-junction 1053. Further, presence of the n-barrier region 100-3 may increase the distance between the first pn-junction 1021 and the upper pn-junction 1053, as illustrated in FIG. 5B.

For example, as schematically illustrated in FIG. 5C, with respect to the active mesa 18, a portion of the drift region 100 extends into the active mesa 18 (wherein said portion can be formed by the n-barrier region 100-3) and has a net dopant concentration profile $N_D$-$N_A$ along the vertical direction Z, wherein the net dopant concentration has a local maximum LMNET within a central portion of the vertical extension of the active mesa 18. The net dopant concentration can be the dopant concentration of the first conductivity $N_D$ minus the dopant concentration of the second conductivity type $N_A$. The central portion of the active mesa 18 can be the portion which is displaced from the mesa top (e.g., at the vertical level where the semiconductor body 10 interfaces with the first load terminal 11 or, respectively, with the insulation layer 112) and the mesa bottom (e.g., at the same vertical level as the control trench bottom 145) by respective at least 10%, or at least 20% of the total vertical mesa extension. The local maximum LMNET can be formed by means of the net dopant concentration $N_D$-$N_A$ changing at least by a factor of two along the vertical direction Z, as schematically illustrated in FIG. 5B and FIG. 5C.

The value of the local maximum LMNET may be influenced by the presence/absence of the n-barrier region 100-3. Presence of the n-barrier region 100-3 may yield a more distinct local maximum LMNET, where, for example, the net dopant concentration $N_D$-$N_A$ changes by a factor of greater than two, e.g., greater than four, six or even greater than ten. In case the n-barrier region 100-3 is absence, the local maximum LMNET may be weaker, but, still, the net dopant concentration $N_D$-$N_A$ changes at least by a factor of two along the vertical direction Z, in accordance with an embodiment.

Still referring to FIG. 5C, it shall again be understood that the net dopant concentration $N_D$-$N_A$ may remain positive below the first pn-junction 1021 along the vertical direction Z until the interface with the doped contact region 108 (e.g., the p-emitter) is reached, namely in case where the active mesa 18 laterally overlaps with the pass through passage 1053 of the p-barrier region 105 (cf. FIG. 23A). Yet, also in such situation, the net dopant concentration $N_D$-$N_A$ has the local maximum LMNET within the central portion of the vertical extension of the active mesa 18, in accordance with an embodiment. FIG. 5C illustrates the situation where the active mesa 18 (with or without the n-barrier region 100-3) laterally overlaps with the p-barrier region 105 (cf. also FIG. 23B)

In contrast, referring to FIG. 5A, in the inactive mesa 19 that does for example not comprise the n-barrier region 100-3 and that laterally overlaps with the p-barrier region 105, a homojunction may be formed by a transition from the body region 102 in these inactive mesas 19 to the p-barrier region 105 along the vertical direction Z.

For example, the electrically floating barrier region 105 is not electrically connected with a defined electrical potential, e.g., neither to the first load terminal 11, nor to the second load terminal 12, nor to the control terminal 13. In an embodiment, the electrically floating barrier region 105 is connected, by means of a connection having a high ohmic resistance, to a defined electrical potential (e.g., to an electrical potential of a contact or to an electrical potential of another semiconductor region). For example, by means of said high ohmic connection, during a switching operation, the electrical potential of the barrier region 105 is temporarily decoupled from the defined electrical potential. Said decoupling may occur on a time scale of said switching operation, e.g., for at least 10 ns, or at least 100 ns, or at least 10 µs. For example, the resistance of said high ohmic connection amounts to more than 100Ω, or to more than 1 MΩ.

In an embodiment, an ohmic resistance, e.g. measured during a standstill situation, between the first load terminal 11 and the barrier region 105 amounts to more than 100Ω, or to more than 1 MΩ.

For example, for ensuring that the barrier region 105 is electrically floating, the barrier region 105 does not extend into the transition region 1-5; e.g., the barrier region 105 can exclusively be arranged within the active cell region 1-2, as illustrated in FIG. 1.

For example, the barrier region 105 does not extend into the transition region 1-5. As has been explained above, the transition region 1-5 may be equipped with some of the IGBT cells 1-1 and hence be considered as an active region of the power semiconductor switch 1, i.e. a part of the power semiconductor switch 1 that also conducts a part of the load current.

In an embodiment, the transition region 1-5 does neither include a section of the electrically floating barrier region 105 nor any further electrically floating semiconductor region of the second conductivity type. For example, there is no floating p-doped semiconductor region included in the transition region 1-5.

The barrier region 105 is electrically floating, and, at the same time, the barrier region 105 can be arranged in contact with at least some of the trenches of the IGBT cells 1-1, as has been explained above. Thus, the barrier region 105 may interface with the trench insulators 142, 152 and 162. For example, at least the source trench bottom 165 and/or at least the dummy trench bottom 155 extend into the barrier region 105, e.g., such that the source trench electrode 161, the dummy trench electrode 151 and the barrier region 105 have a common vertical extension range along the vertical direction Z of at least 100 nm, of at least 50 nm or of at least 1000 nm (wherein the barrier region 105 may extend further along the vertical direction Z as compared to the trench bottoms).

Figure 6:
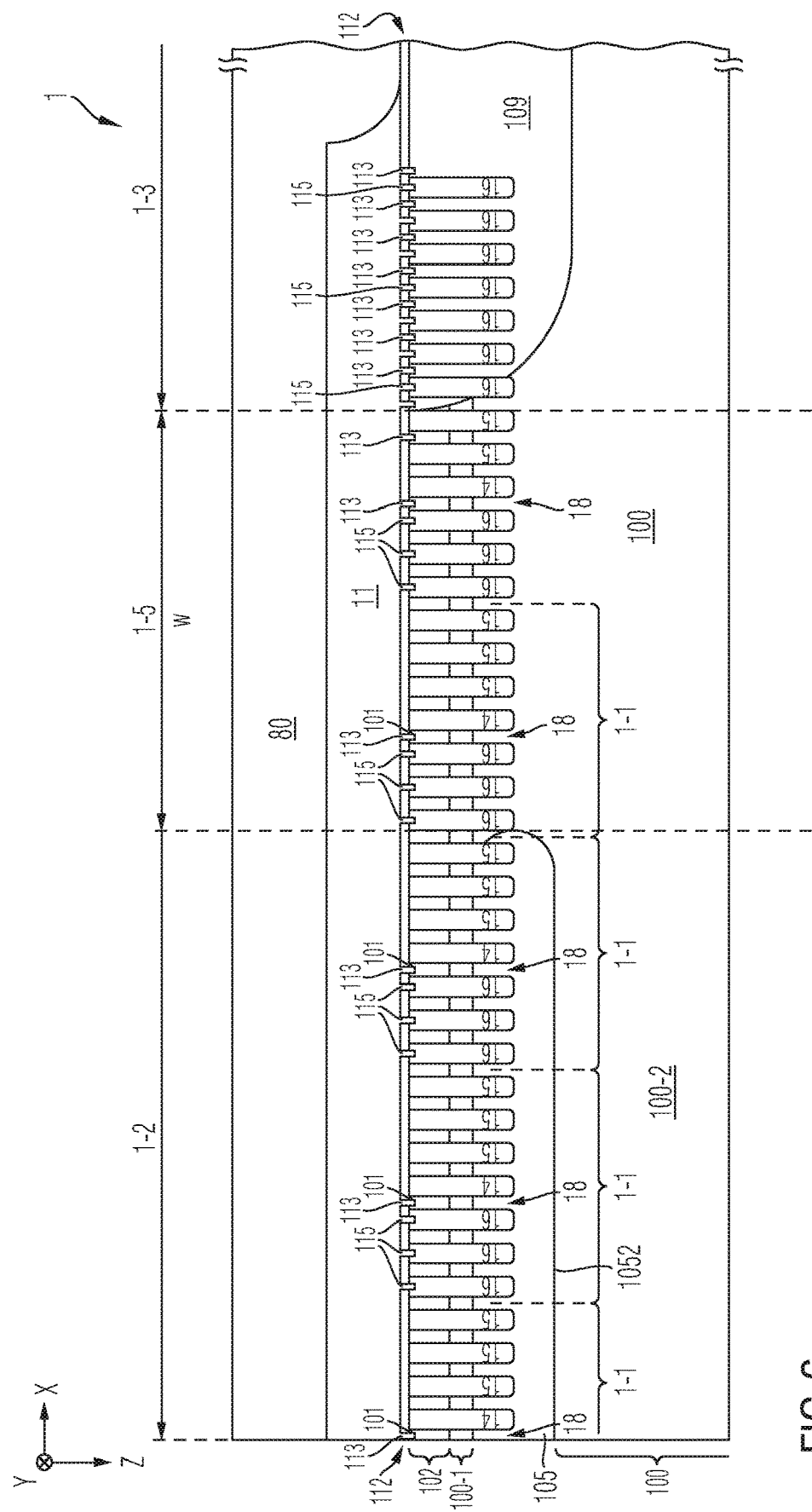
FIG. 6 schematically and exemplarily illustrates a section of a vertical cross-section of a power semiconductor switch in accordance with one or more embodiments.

This aspect shall be elucidated in more detail with respect to FIG. 6, which exemplarily and schematically illustrated a section of a vertical cross-section of the power to semiconductor switch 1 in accordance with one or more embodiments.

In accordance with the embodiment illustrated in FIG. 6, the first load terminal 11 may be partially covered by an insulation structure 80, e.g., an encapsulation. Within the active cell region 1-2, there is arranged a plurality of said IGBT cells 1-1, each of which exhibits the exemplary contacting scheme/neighborhood relationship: "SoSoSk-GoDoDoDo". In another embodiment, a different contacting scheme is employed.

The active mesas 18 are electrically connected to the first load terminal 11 by means of said first contact plugs 113, and the source electrodes 161 of the source trenches 16 are electrically connected to the first load terminal 11 by means of second contact plugs 115. The control electrodes 141 of the control trenches 14 and the dummy electrodes 151 of the dummy trenches 15 are electrically connected to the control terminal 13, e.g., by means of a gate runner.

Within the transition region 1-5, there is arranged one further IGBT cell 1-1 that may also exhibit the contacting scheme "SoSoSkGoDoDoDo" or a contacting scheme different therefrom. Further along the first lateral direction X, there is arranged one further dummy trench 15, further source trenches 16 and one control trench 14, adjacent to which there are arranged one active mesa 18. Hence, within the transition region 1-5, a part of the load current can be conducted.

The trench pattern may continue with a different contacting scheme along the first lateral direction X also within the edge termination region 1-3, wherein such trenches within the edge termination region 1-3 may be source trenches 16. The mesas between said source trenches 16 may be electrically connected to the first load terminal 11 by means of the first contact plugs 113. Hence, the arrangement of the source trenches 16 and the mesas in between these trenches that are electrically connected to the first load terminal 11 may form charge carrier drainage cells.

Within the edge termination region 1-3, there can further be arranged the semiconductor well region 109 of the second conductivity type. For example, the well region 109 is p-doped and extends from the insulation layer 112 along the vertical direction Z, e.g., further as compared to the total extension of the trenches 14, 15, 16, and 16. For example, the well region 109 extends about as deep into the semiconductor body as the barrier region 105. In addition, the well region 109 may be electrically connected to the first load terminal 11.

Still referring to FIG. 6, the barrier region 105 may terminate at the transition between the active cell region 1-2 and the transition region 1-5. For example, the barrier region 105 is exclusively arranged within the active cell region 1-2 and does neither extend into the transition region 1-5 nor into the edge termination region 1-3.

On the other side, the well region 109 is exclusively arranged within the edge termination region 1-3 and does neither extend into the transition region 1-5 nor into the active cell region 1-2. As has been elucidated above, the transition region 1-5 may entirely surround the active cell region 1-2 and may in turn be entirely surrounded by the edge termination region 1-3. The minimum width W of the transition region 1-5, e.g., the minimum distance between the barrier region 105 and the well region 109 amounts to 1 μm, wherein said minimum width may be greater than 1 μm, e.g. greater than 3 μm, greater than 5 μm or even greater than 10 μm or than 20 μm. Along said width W, a portion of the drift region 100 may be present.

As the well region 109 is electrically connected to the first load terminal 11, e.g., by means of said first contact plugs 113, as exemplarily illustrated, the electrical potential within the well region 109 can be substantially identical to the electrical potential of the first load terminal 11. Hence, by means of the transition region 1-5 and its minimum width W, it can be more reliably ensured that the barrier region 105 is indeed electrically floating.

In an embodiment, the well region 109 has an electrically activated maximal dopant concentration within the range of $1*10^{15}$ to $5*10^{18}$ cm$^{-3}$. It may extend along the vertical direction Z, e.g., further as the trenches 14, 15, 16, e.g. down to a level substantially corresponding to the lower pn-junction 1052 formed between the barrier region 105 and the drift region 100.

In an embodiment, the barrier region 105 has a lateral structure. For example, the barrier region 105 is formed as a laterally structured layer that extends throughout the entire active cell region 1-2, e.g., until it interfaces with the transition region 1-5. Hence, the barrier region 105 may for example be exclusively arranged within the active cell region 1-2 and does not extend into the transition region 1-5. Within the active cell region 1-2, the barrier region 105 can be laterally structured.

For example, the IGBT cells 1-1 are configured with a lateral structure according to a first layout having a first pitch, and wherein the lateral structure of the barrier region 105 is configured according to a second layout, the second layout having a second pitch at least twice as large as the first pitch. Hence, the lateral structure of the barrier region 105 can be coarser as compared to the trench pattern.

The lateral structure of the barrier region 105 can be formed by a plurality of pass-through passages 1053 (in the following also simply referred to as "passages"). Such concept is exemplarily illustrated in the general manner in FIG. 7. For example, according the second layout, each of the pass-through passages 1053 may exhibit a maximum lateral extension at least twice as large as a minimum trench width and/or a minimum mesa width formed in accordance with the first layout.

In an embodiment, the one or more passages 1053 provide for a load current passage for currents below 10% or even below 1% of the nominal load current of the power semiconductor switch 1. For larger load currents, the whole active cell region 1-2, irrespective of whether parts bilaterally overlap with the barrier region 105 or not, carry the load current. Thus, in accordance with an embodiment, for load currents below 10% or even below 1% of the nominal load current does not have to traverse the barrier region 105, but may path through the one or more passages 1053. For example, the barrier region 105 is absent, i.e., exhibits said passages 1053, in a vertical projection (along the vertical direction Z) of the inversion channels that may be induced in the active mesas 18, e.g., in a vertical projection of the source regions 101.

The possible effect described in the preceding paragraph has also been elucidated in greater detail above, namely with respect to the first share of the total volume of the active mesas 18 that does not laterally overlap with the barrier region 105 and the second share of the total volume of the active mesas 18 that does laterally overlap with the barrier region 105.

In an embodiment, the one or more passages 1053 are positioned and/or dimensioned so as to laterally overlap with at least a subset of the source regions 101.

For example, the barrier region 105 may form a "carpet" arranged within the active cell field 1-2 and, e.g., substantially in parallel to each of the first load terminal 11 and the second load terminal 12 and separated from each of these terminals 11, 12 by means of at least the drift region 100.

Such carpet like configuration of the barrier region 105 may be positioned within the semiconductor body 10 such that the trench bottoms 145 and 155 and/or 165 may plunge into the barrier region 105.

The passages 1053 may laterally overlap with one or more of the active mesas 18. Adhering to the visual vocabulary introduced above, the barrier region 105 may hence be implemented as a "patchwork carpet", wherein the one or more passages 1053 can be entirely filled with sections of the drift region 100. The dimensions, the positions and the numbers of passages 1053 can, for example, be chosen in accordance with the cell configuration.

The barrier region 105 may be implemented as a contiguous barrier layer within the active cell field 1-2 of the power semiconductor switch 1, e.g., as said "carpet". As has been indicated above, each of the dummy trench bottoms 155 and/or the control trench bottoms 145 and or the source trench bottoms 165 may extend into the barrier region 105, e.g., the dummy trench 15 and/or the control trench 14 and/or the source trench 16 may extend into the barrier region 105 by at least 100 nm, by at least 500 nm or by at least 1000 nm.

Figure 7:
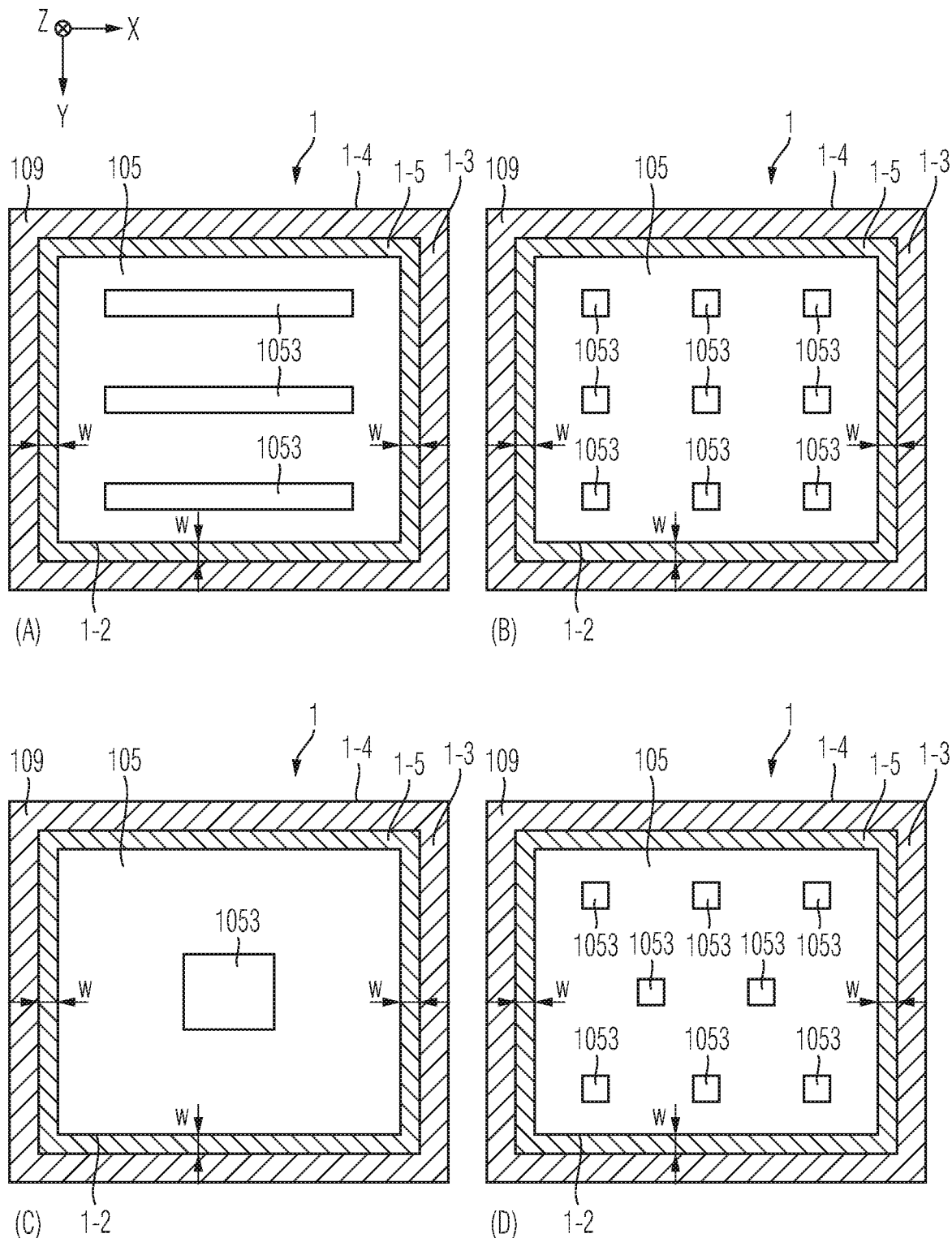
FIG. 7 schematically and exemplarily illustrates sections of a respective horizontal projection of a power semiconductor switch in accordance with some embodiments.

Still referring to FIG. 7, for example, in accordance with variant A, the passages can have a stripe configuration arranged substantially perpendicular to the stripe configuration of the IGBT cells 1-1. In another embodiment, a central pass-through passage 1053 of large extensions is provided (variant B). In accordance with variants B and D, a plurality of smaller the passages 1053 is provided, which can be distributed according to various patterns.

Each of the plurality of passages 1053 can be filled by a section of the drift region 100. Thus, within the passages 1053, an n-doped semiconductor region may be present which exhibits a dopant concentration corresponding to the dopant concentration of the drift region. In another embodiment, which will be elucidated in more detail further below, some or all of the passages 1053 can also be filled by means of (deeper) trenches.

Some embodiments are provided with a barrier region 105 whose pass-through passages 1053 are positioned and dimensioned according to a predefined design rule. For example, said second layout can be configured in accordance with the design rule. The positions and dimensions of the passages 1053 may have significant influence on the dynamic behavior of the power semiconductor switch 1, e.g., regarding a voltage slope (dV/dt) during a turn-on operation.

For example, in accordance with a first provision of such design rule, a distance between two arbitrary ones of the pass-through passages 1053 that are arranged adjacent to each other is smaller than 1 mm.

A second provision of such design rule can be that the barrier region 105 is arranged within a semiconductor layer of the semiconductor body 10, the semiconductor layer extending entirely and exclusively within the active cell region 1-2 and exhibiting a total volume, wherein the pass-through passages 1053 form at least 0.1% and at most 50% of said total volume, or wherein the pass-through passages 1053 form at least 1% and at most 30% of said total volume, or wherein the pass-through passages 1053 form at least 1% and at most 10% of said total volume. The remaining volume of the semiconductor layer, i.e., the p-doped part of the barrier region 105, can be formed by semiconductor regions of the second conductivity type. As already indicated above, i.e., the remaining volume, can have a dopant concentration (cf. concentration CC in FIG. 5) greater than $1*10^{14}$ cm$^{-3}$ and smaller than $4*10^{17}$ cm$^{-3}$, said dopant concentration being present within an extension along the vertical direction Z of at least 0.1 µm or at least 0.5 µm.

A third provision of such design rule can be, that the barrier region 105, despite its passages 1053, connects the inactive mesas 19 included in the plurality of IGBT cells 1-1 of the active cell region 1-2 with each other.

A fourth provision of such design rule can be that the passages 1053 laterally overlap with at least a subset of the active mesas 18 of the active cell region 1-2. For example, the one or more passages 1053 are positioned and/or dimensioned so as to laterally overlap with at least a subset of the source regions 101.

The fifth provision of such design rule can be that the passages 1053 laterally overlap with at least a subset of the control trenches 14 of the active cell region 1-2.

A further provision of such design rule can be that the barrier region 105 extends at least partially into subset of the active mesas 18, e.g., without establishing contact with the respective control trench 14 that is laterally flanked by the respective active mesa 18. For example, thereby, the barrier region 105 can be configured to provide for an electrically conductive path between a section of a respective one of the subset of the active mesas 18 and the bottoms 155 of the dummy trenches 15. Hence, it can be provision of the design rule that the pass-through passages 1053 laterally overlap with one or more of the active mesas 18 of the IGBT cells 1-1. For example, the design rule can specify that the pass-through passages 1053 laterally overlap, with respect to the total number of active mesas 18 present within the active cell region 1-2, with at least 1% and at most 50% of the active mesas 18. As explained above, the lateral overlap between the barrier region 105 and a respective one of the active mesas 18 may occur partially; i.e., the barrier region 105 must not necessarily entirely overlap with the respective active mesa 18, but, e.g., up to 10%, up to 30% or up to 70% of the mesa width of the respective active mesa 18.

With respect to FIGS. 8A-D, which each schematically and exemplarily illustrate a section of a horizontal projection of a power semiconductor switch 1 in accordance with some embodiments, exemplary lateral structures of the barrier region 105 shall be presented.

Referring to each of FIGS. 8A-D, the barrier region 105 may extend entirely and exclusively within the active cell region 1-2. Within the active cell region 1-2, said plurality of IGBT cells 1-1 may be provided, each of which comprises at least one of said control trenches 14 that may be laterally flanked, on no more than one of its sides, by a respective active mesa 18, each of which comprises the source region 101 that is electrically connected to the first load terminal 11. Even though the source regions 101 are illustrated as extending to the left and right of a respective control trench 14, it is a provision that each of the number of control trenches 14 that are included in the respective IGBT cell 1-1 is arranged adjacent to no more than one active mesa 18.

The IGBT cells 1-1 that are included in the active region 1-2 may exhibit a configuration as has been explained above (e.g., kSkGoDoG, or kSoSkGoDoG, or kSoSoSkGoDoG). The IGBT cells 1-1 exhibit a stripe configuration substantially orientated along the second lateral direction Y, as has also been explained above. For example, each IGBT cell 1-1 extends along the second lateral direction throughout the entire active cell region 1-2.

In FIGS. 8A-D, a plurality of source regions 101 is illustrated, wherein only some are provided with a respective reference sign. For example, each of the illustrated source regions 101 forms a part of only one active mesa 18, adjacent to which there is arranged a respective control trench 14, as illustrated in FIG. 6A.

The active cell region 1-2 can be entirely surrounded by the transition region 1-5, which in turn can be entirely surrounded by the edge termination region 1-3. The transition region 1-5 and the edge termination region 1-3 may be configured in a manner as has exemplarily been explained with respect to FIG. 6.

As illustrated in FIGS. 8A-D, the lateral structure of the barrier region 105, which is formed or, respectively defined by the number, dimensions and positions of the passages 1053, can exhibit a significantly greater pitch as compared to the pitch according to which the layout of the trench pattern is formed.

Figure 8A:
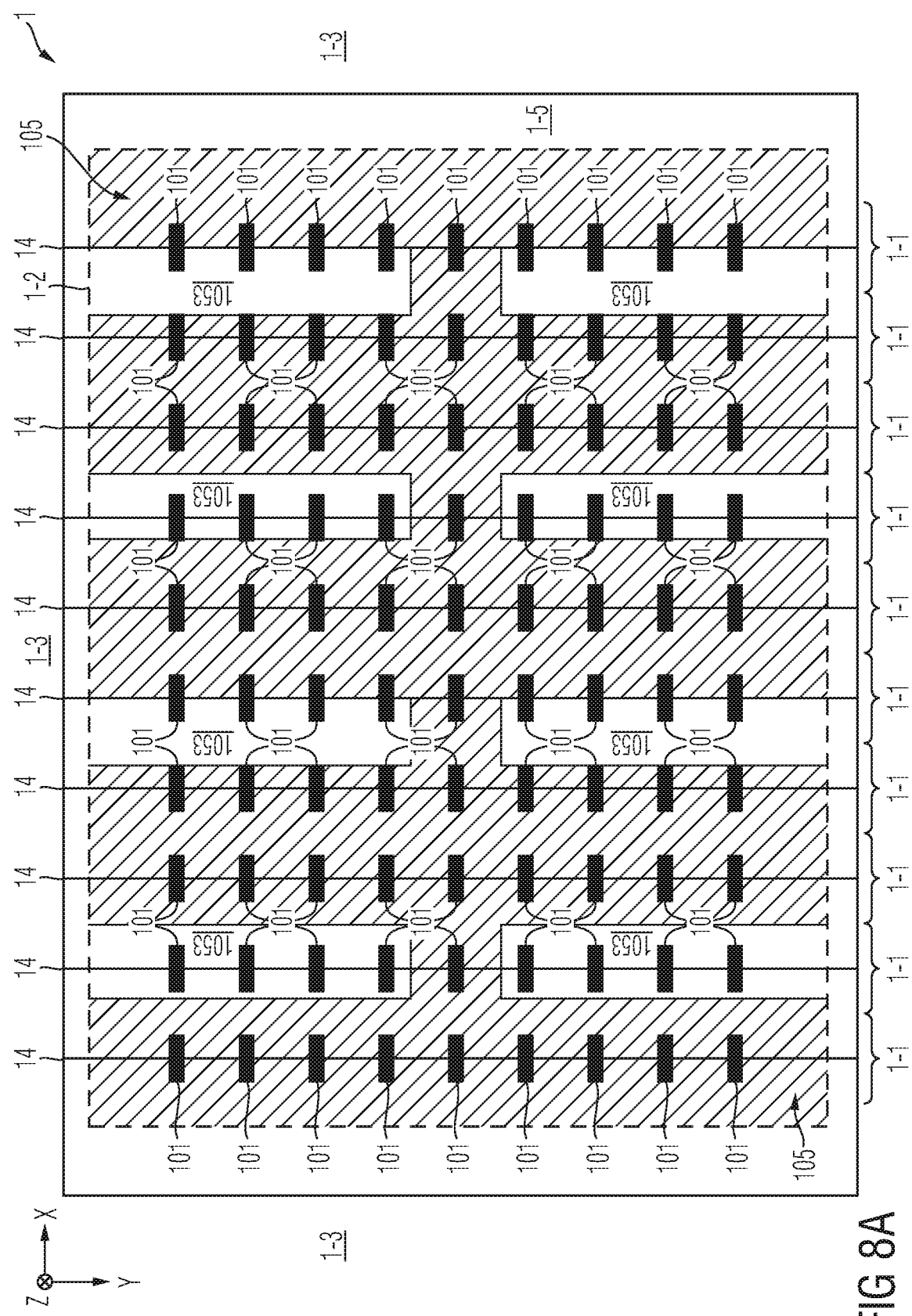
FIGS. 8A-8D each schematically and exemplarily illustrate a section of a horizontal projection of a power semiconductor switch in accordance with one or more embodiments.

For example, referring to FIG. 8A, the passages 1053 may exhibit an orientation substantially in parallel to the orientation of the stripe configuration of the IGBT cells 1-1. A respective one of the passages 1053 may laterally overlap with a plurality of adjacent trenches and mesas. It has been pointed out above that it may be appropriate to position the passages 1053 such that they laterally overlap with at least a subset of the active mesas 18, which is the case in accordance with the embodiment illustrated in FIG. 8A; there, the position of the passages 1053 is chosen such that the passages 1053 overlap with a subset of the source regions 101. Hence, a load current of said subset of active mesas 18 does not traverse the barrier region 105, but flows through its passages 1053. As further illustrated in FIG. 8A, in accordance with an embodiment, also the passages 1053 may terminate at the transition between the active cell region 1-2 and the transition region 1-5.

Figure 8B:
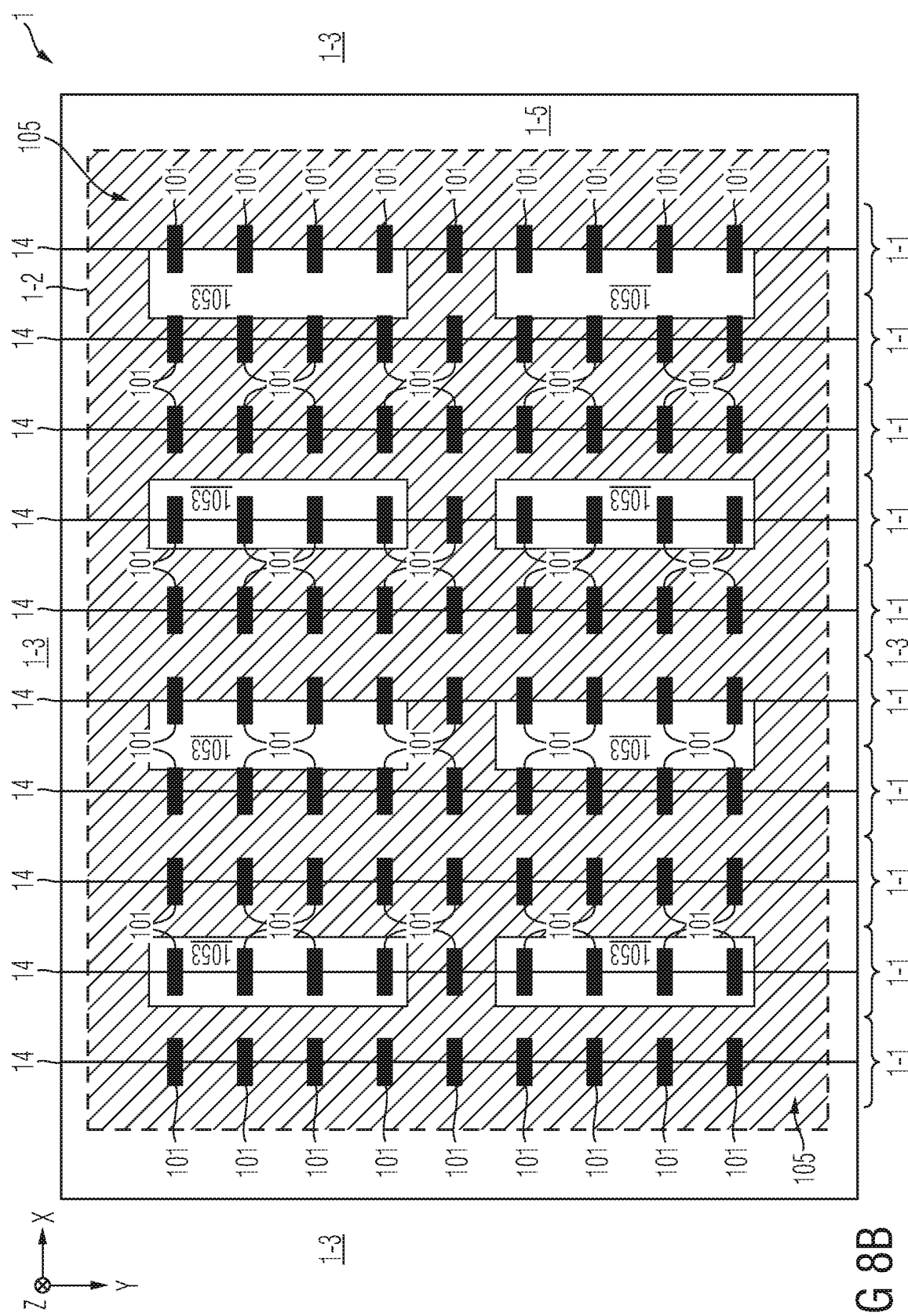

The embodiment illustrated in FIG. 8B essentially corresponds to the embodiment illustrated in FIG. 8A, wherein the passages 1053 are dimensioned and positioned so as to be entirely integrated within the barrier region 105 and so as to not intersect with the transition region 1-5.

Figure 8C:
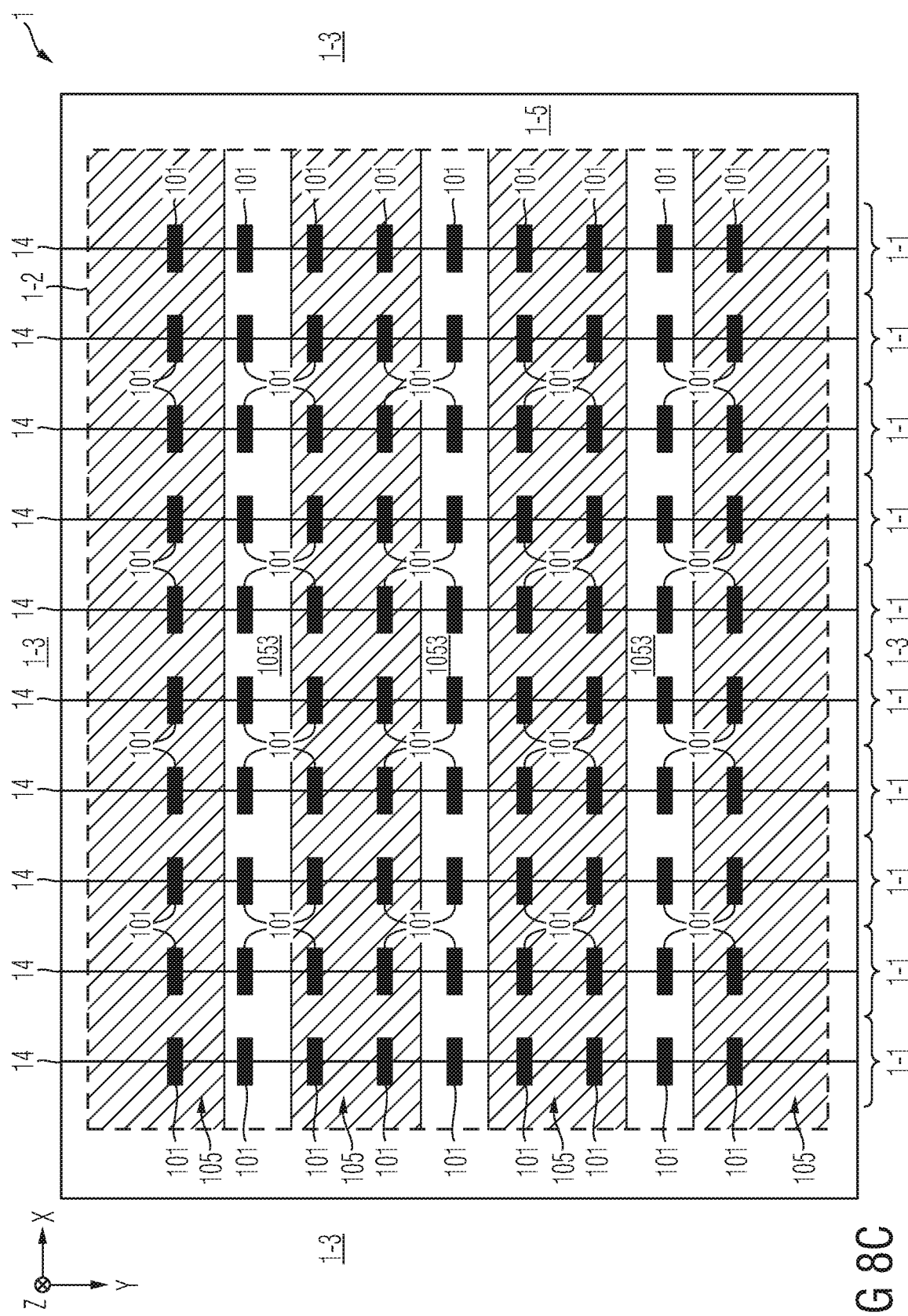
Figure 8D:
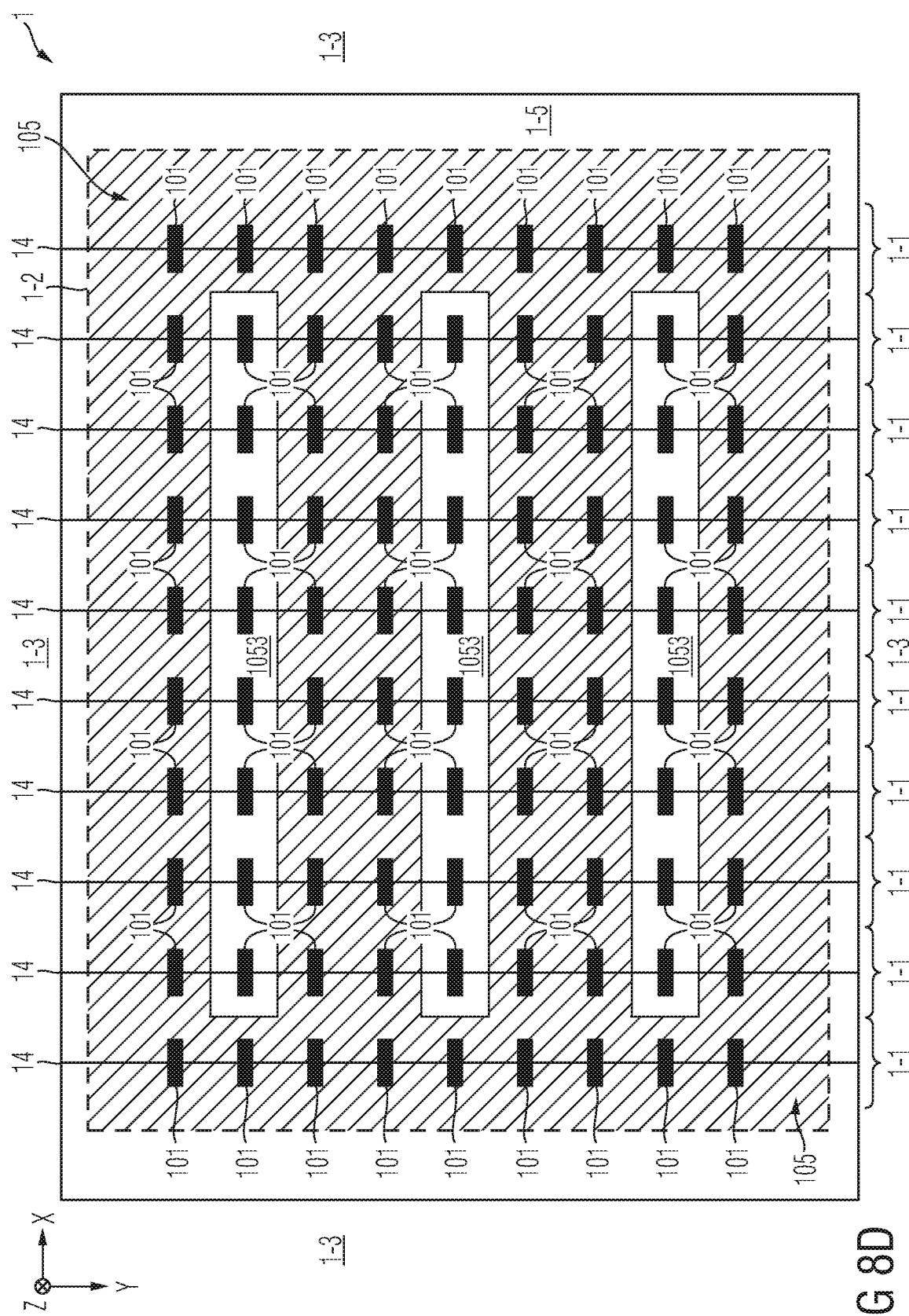

In accordance with the embodiment schematically and exemplarily illustrated in FIG. 8C, the passages 1053 exhibit an orientation substantially perpendicular to the orientation of the stripe configuration of the IGBT cells 1-1. Such orientation, which is also schematically and exemplarily illustrated in the perspective projection illustrated in FIG. 9, may support dampening or, respectively, avoiding of a voltage swing during the switching operation of the power semiconductor switch 1. The embodiment illustrated in FIG. 8D essentially corresponds to the embodiment illustrated in FIG. 8C, wherein the passages 1053 are dimensioned and positioned so as to be entirely integrated within the barrier region 105 and so as to not intersect with the transition region 1-5.

Figure 10:
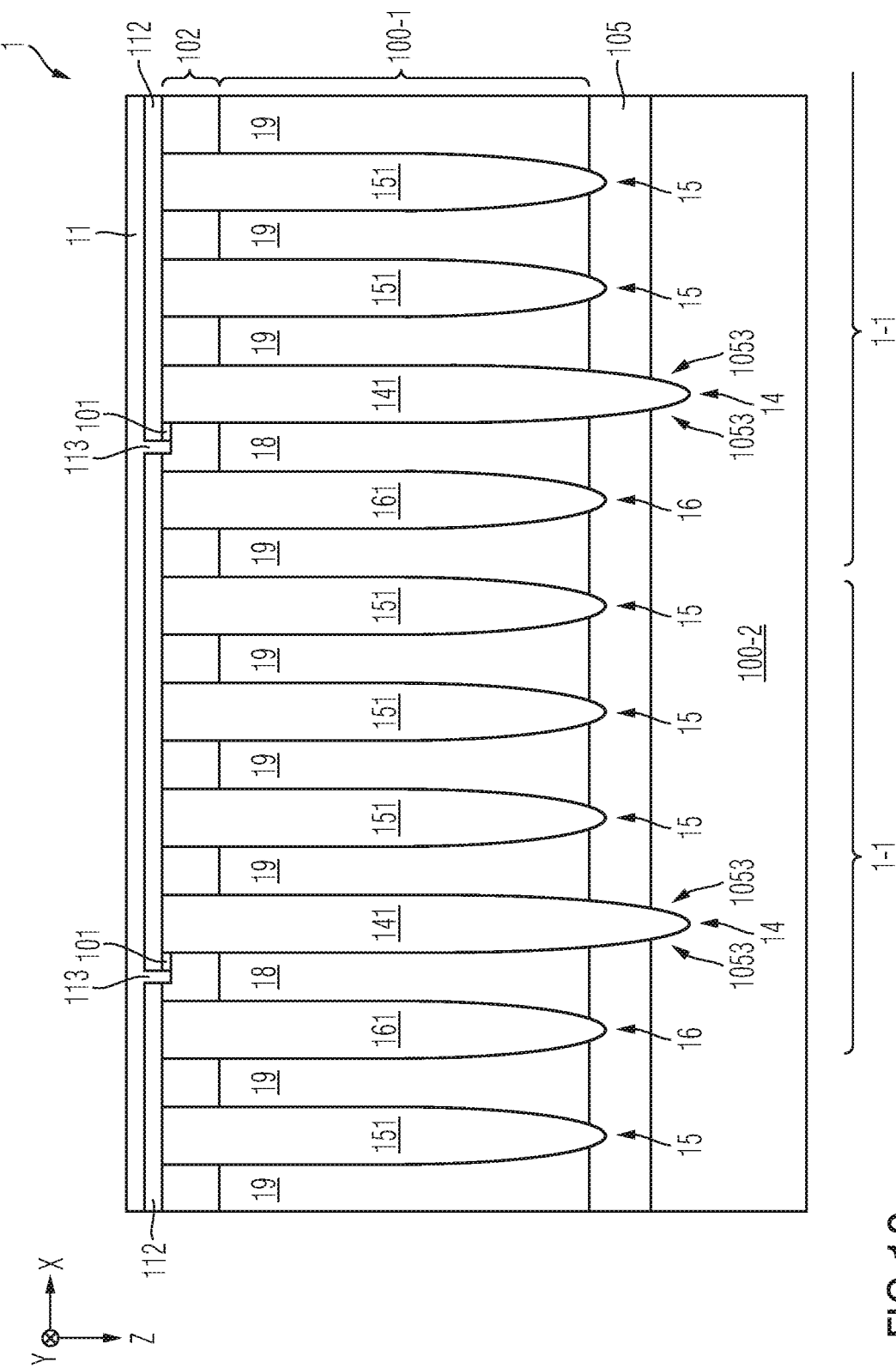
FIGS. 10-11 both schematically and exemplarily illustrate a section of a vertical cross-section of a power semiconductor switch in accordance with one or more embodiments.
Figure 11:
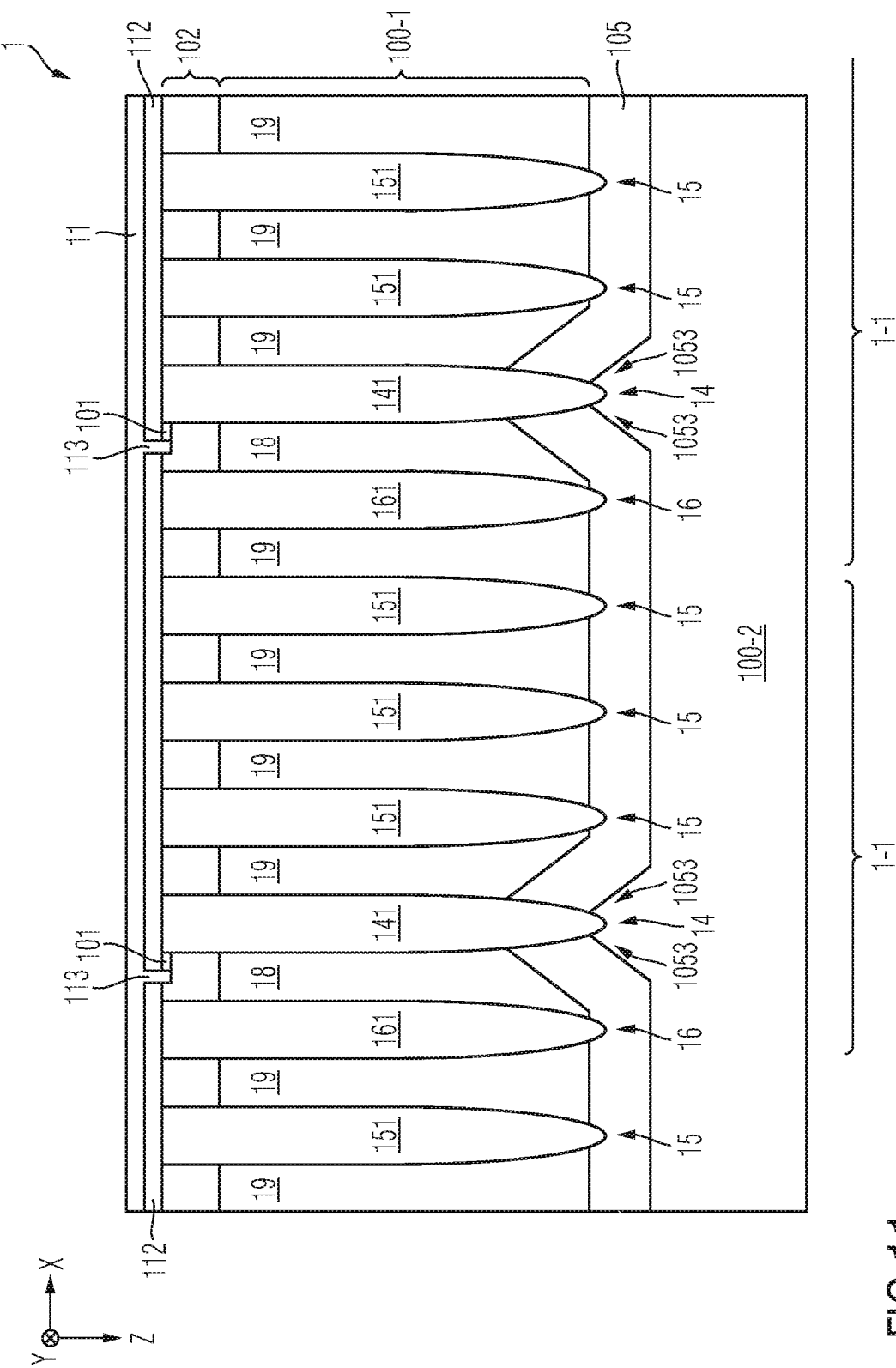

Now referring to the embodiments that are schematically and exemplarily illustrated in FIGS. 10 and 11, some or all of the passages 1053 may also be filled, in addition or in alternative to the drift region 100, with lower sections of trenches of the IGBT cells 1-1. For example, some or all of the passages 1053 are filled with lower sections of the control trenches 14. In accordance with the embodiment illustrated in FIG. 10, this may be achieved by designing the control trenches 14 was a greater total extension along the vertical direction Z as compared to the trenches that do not fill the passages 1053. In accordance with the embodiment illustrated in FIG. 11, this may be achieved by providing the barrier region 105 such that the passages 1053 are arranged within respective local elevations (with respect to the vertical direction Z).

Now referring to FIGS. 12 to 19, further exemplary lateral structures of the barrier region 105 shall be presented. In accordance with each of the embodiments schematically and exemplarily illustrated in FIGS. 12 to 19, the contacting scheme for each IGBT cell 1-1 within the active region 1-2 is "oDoDoDkGoSoSoD". However, as noted above, in other embodiment, a different contacting scheme is employed, examples of which have been presented further above. For example, one other suitable example is "kSkGoDoG".

Figure 12:
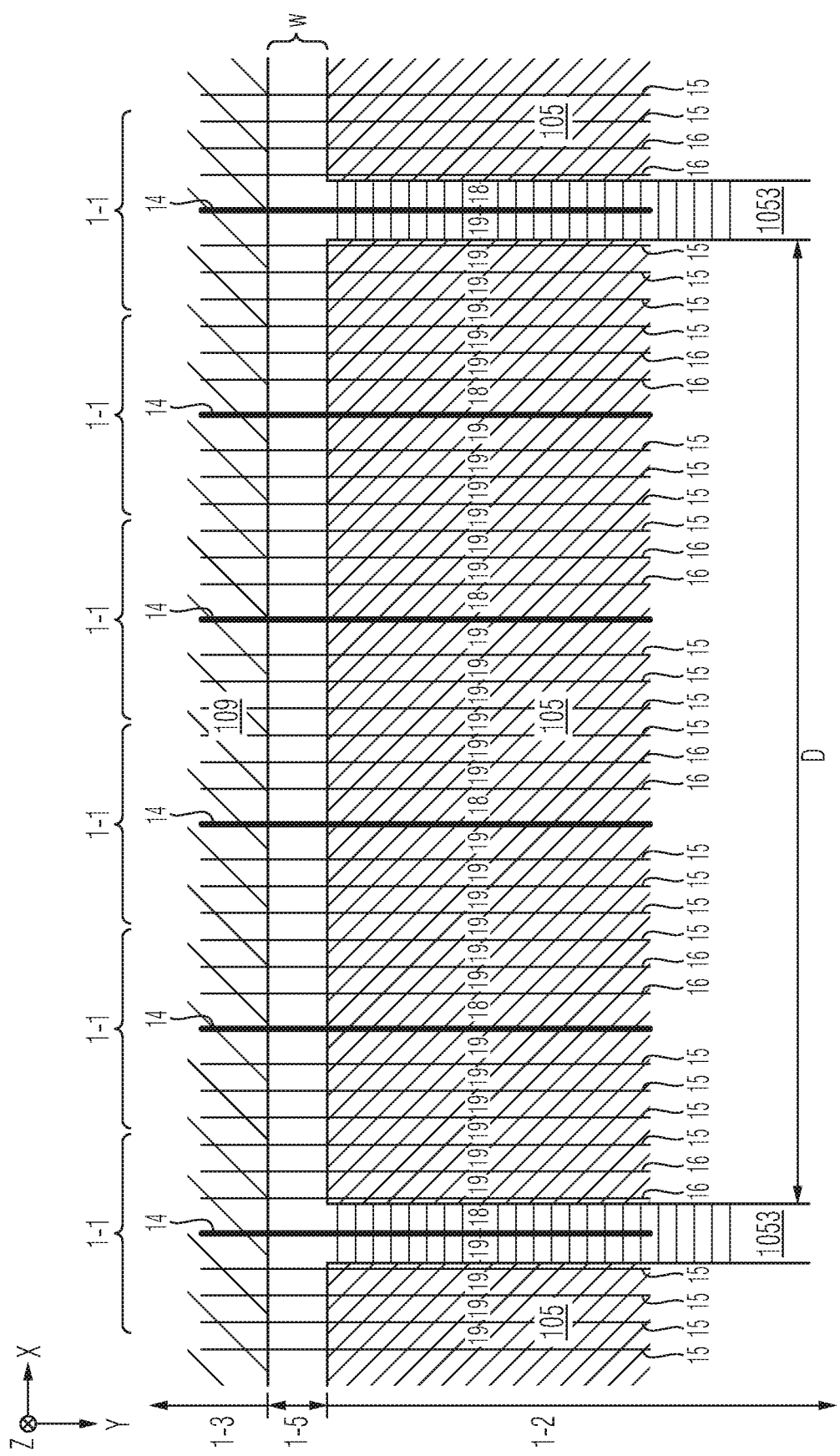
FIGS. 12-19 each schematically and exemplarily illustrate a section of a horizontal projection of a power semiconductor switch in accordance with one or more embodiments.

For example, referring to FIG. 12, the passages 1053 extend in parallel to the stripe configuration of the control trench 14. The barrier region 105 partially extends into some of the active mesas 18 that are arranged adjacent to each side of the respective control trench 14. As illustrated, the passages 1053 may occur, along the first lateral direction X, at every fifth IGBT cell 1-1. Hence, a distance D between two neighbored passages 1053 along the first lateral direction X may be greater than 500 µm, e.g., amount to approximately 700 µm. For example, the barrier region 105 hence entirely laterally overlaps with at least always exactly 80% of the total number of IGBT cells 1-1 within the active region 1-2. The remaining 20% of the total number of IGBT cells 1-1 within the active region 1-2 may laterally overlap with the passages 1053, e.g., by means of their respective control trench 14 and their respective active mesas 18, as illustrated in FIG. 12. Further, as also illustrated in FIG. 12, the well region 109 does not extend into the transition 1-5, and the barrier region 105 does also not extend into the transition region 1-5. Rather, the transition region 1-5 separates the barrier region 105 from the well region 109.

Figure 13:
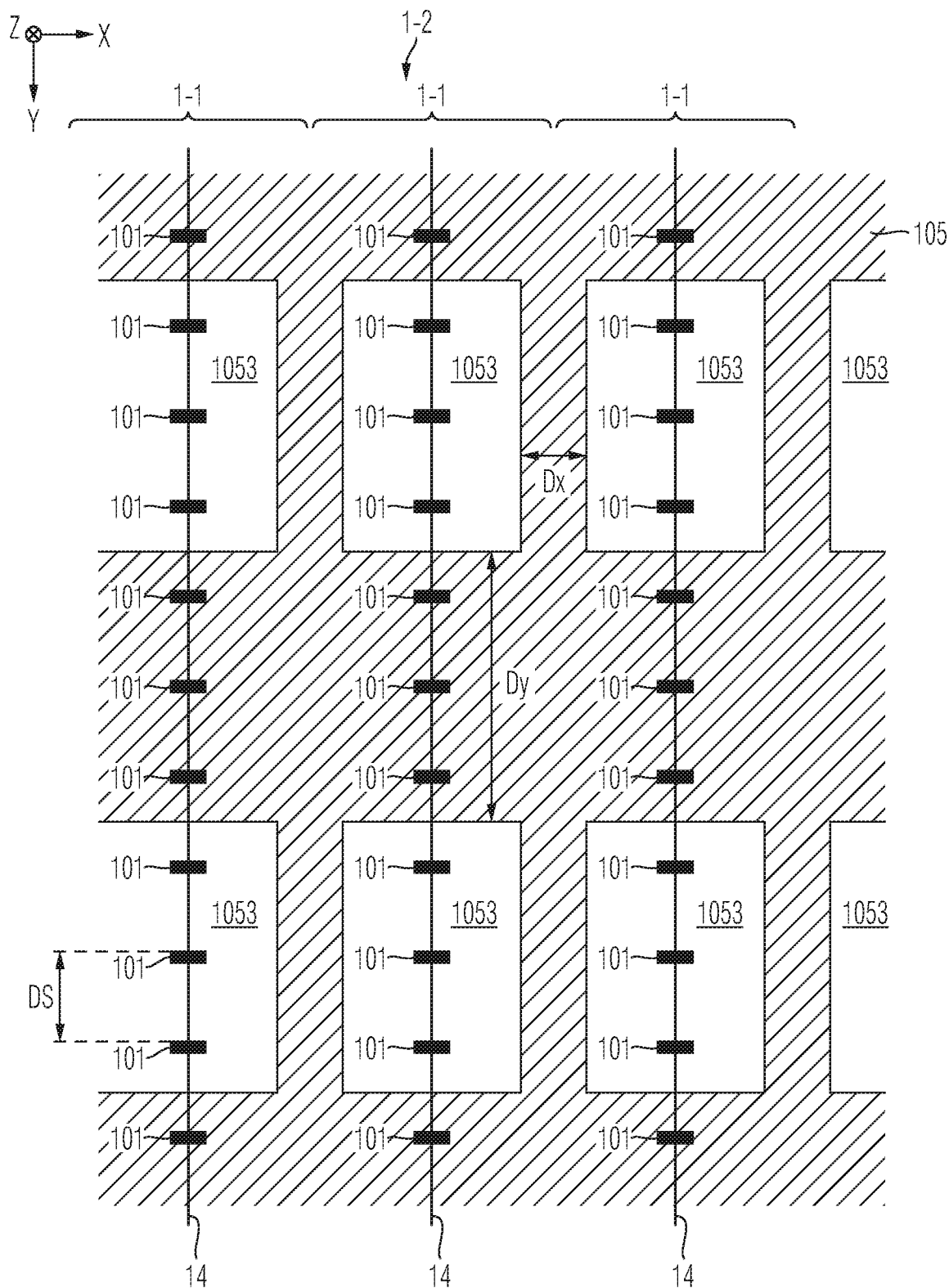

In accordance with the embodiment shown in FIG. 13, the passages 1053 may also each be provided with a smaller rectangular cross-section and positioned in accordance with an island pattern within the active cell region 1-2. Each of the passages 1053 may have a width along the first lateral direction X within the range of 5 µm to 20 µm and the length along the second lateral direction Y within the range of 5 µm to 20 µm.

As already noted with respect to FIG. 8A, even though the source regions 101 are illustrated, in FIG. 13, as extending to the left and right of a respective control trench 14, it is a provision that each of the number of control trenches 14 that are included in the respective IGBT cell 1-1 is arranged adjacent to no more than one active mesa 18.

In an embodiment, for each of the passages 1053, the width along the first lateral direction X is greater than the length along the second lateral direction Y of the respective passages 1053, e.g., the width-to-length ratio of each passage is greater than 2, or even greater than 3. Hence, the passages may have geometric configuration so as to extend rather perpendicular to the stripe configuration of the IGBT cells 1-1 and not in parallel thereto. Such configuration may be beneficial for avoiding/reducing an undesired voltage swing/oscillation on the control electrodes 141.

Along the first lateral direction X, each IGBT cell 1-1 (of which, in FIG. 13, only the source regions 101 and the control trenches 14 are illustrated, wherein each of the illustrated source regions 101 is electrically connected to two respective active mesas 18 that are separated from each other by means of a respective control trench 14) may laterally overlap with one of the passages 1053. Along the second lateral direction Y, each IGBT cell 1-1 may laterally overlap with a plurality of the passages 1053. For example, a distance Dx between two passages 1053 that are neighbored along the first lateral direction X is within the range of some micrometers, e.g., 3 µm to 5 µm. Further, a distance Dy between two passages 1053 that are neighbored along the second lateral direction Y can be within the range of some micrometers, e.g., 5 μm to 20 μm, e.g. approximately 15 μm.

Along the second lateral direction Y, the source regions 101 can be positioned with a distance Ds within the range of 0.1 μm to 20 μm. For example, each passage 1053 laterally overlaps with at least three of the source regions 101 along the second lateral direction Y.

Figure 14:
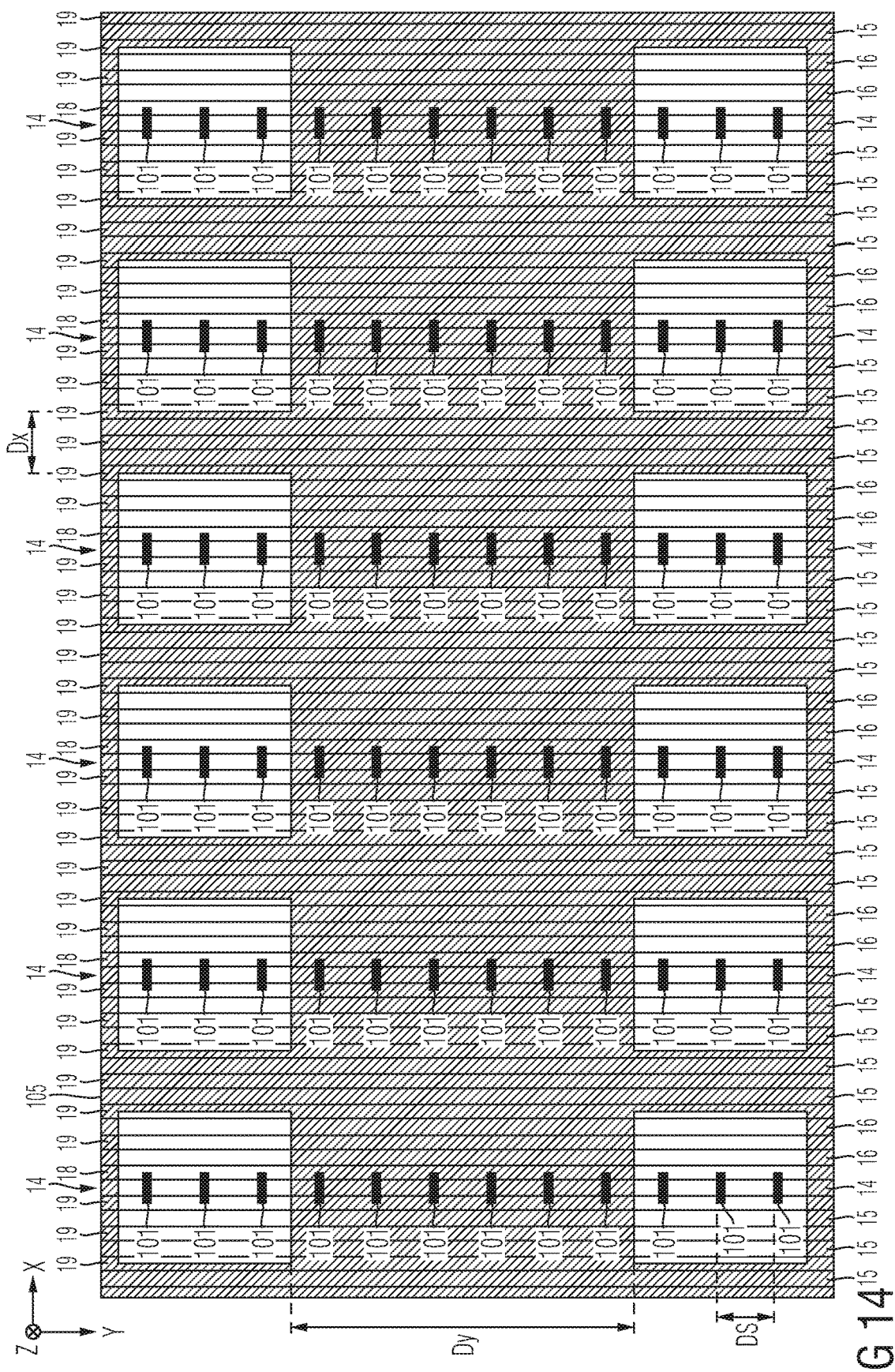

A similar configuration is schematically and exemplarily illustrated in FIG. 14. Along the first lateral direction X, each IGBT cell 1-1 may laterally overlap with one of the passages 1053. Along the second lateral direction Y, each IGBT cell 1-1 may laterally overlap with a plurality of the passages 1053, wherein the distance Dy along the second lateral direction is increased as compared to the embodiment shown in FIG. 13.

For example, the passages 1053 do not laterally overlap with each of the dummy trenches 15. Rather, some or each of the dummy trenches 15 may extend into the barrier region 105. For example, the passages 1053 overlap partially with the control trenches 14 and the source trenches 16.

Figure 15:
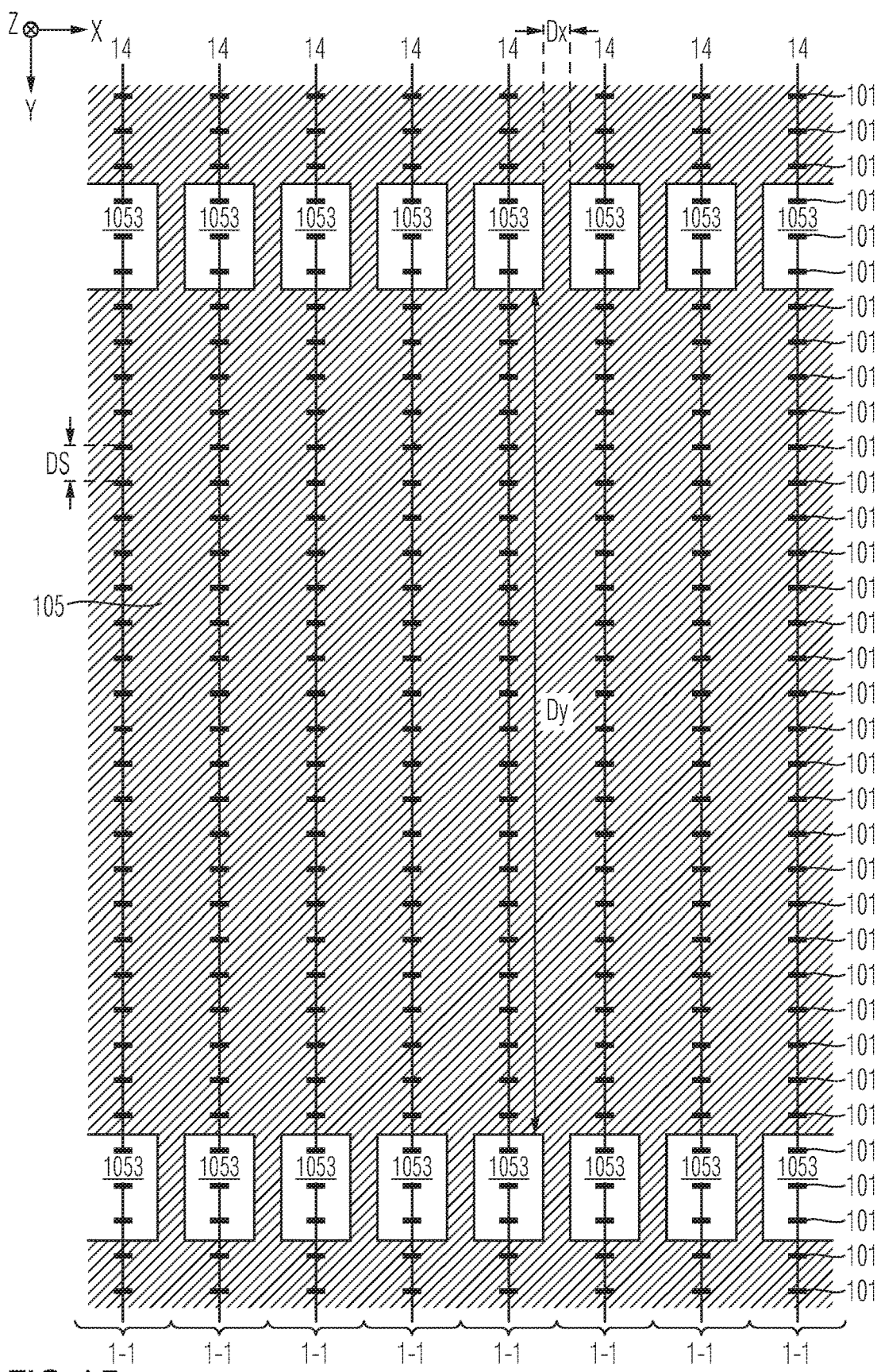

The lateral structure of the barrier region 105 schematically and exemplarily illustrated in FIG. 15 essentially corresponds to the structure as illustrated in each of FIGS. 13 and 14. Accordingly, along the first lateral direction X, each IGBT cell 1-1 may laterally overlap with one of the passages 1053. Along the second lateral direction Y, each IGBT cell 1-1 may laterally overlap with a plurality of the passages 1053, wherein the distance Dy along the second lateral direction is increased as compared to the embodiment shown in FIG. 14. E.g., the distance Dy between two passages 1053 that are neighbored along the second lateral direction amounts is within the range of several micrometers, e.g., 1 μm to 2000 μm.

Figure 16:
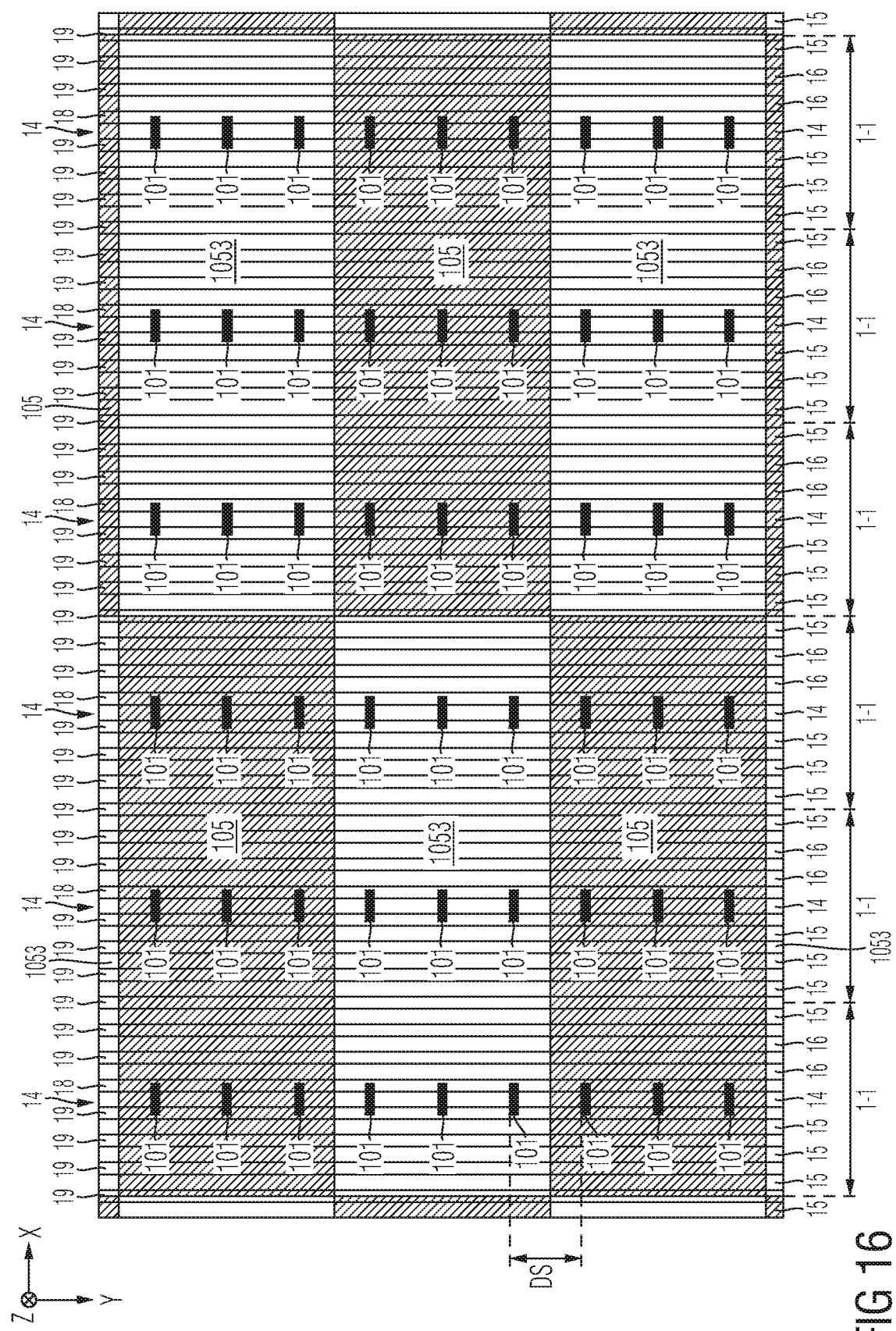

In accordance with variant schematically and exemplarily illustrated in FIG. 16, the lateral structure of the barrier region 105 has a chessboard like pattern. According to the embodiment, about 50% of the total volume of the barrier region 105 is constituted by the passages 1053 (e.g., filled with respective sections of the drift region 100) and the remaining 50% of the barrier region 105 are p-doped regions. For example, each passage 1053 may exhibit a rectangular cross-section. Each of the passages 1053 may have a width along the first lateral direction X so as to overlap with three neighbored IGBT cells 1-1, and a length along the second lateral direction Y so as to overlap with three neighbored source regions 101. Along the second lateral direction Y, the source regions 101 can be positioned within a distance Ds within the range given above. As illustrated, in accordance with the embodiment of FIG. 16 and in contrast to the embodiment shown in FIG. 14, the passages 1053 may laterally overlap with the dummy trenches 15.

Figure 17:
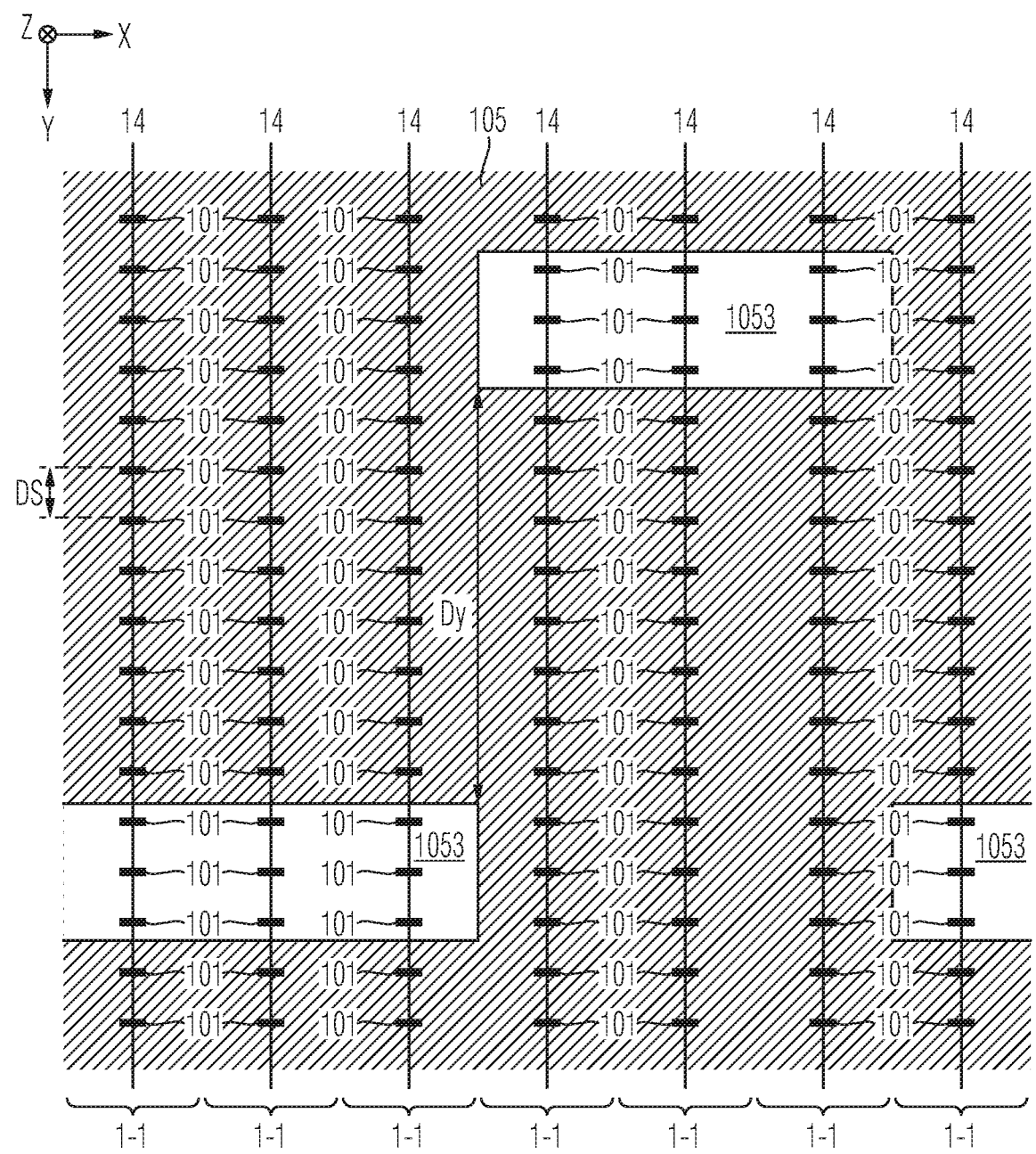

In accordance with the further variant that is schematically and exemplarily illustrated in FIG. 17, compared to the lateral structure shown in FIG. 16, the volume share of the passages 1053 may be decreased from 50% to less than 20%. Each of the passages 1053 may have a width along the first lateral direction X so as to overlap with three neighbored IGBT cells 1-1, and a length along the second lateral direction Y so as to overlap with three neighbored source regions 101. Along the second lateral direction Y, the source regions 101 can be positioned within a distance Ds within the range given above. Again, as illustrated, also in accordance with the embodiment of FIG. 17 and in contrast to the embodiment shown in FIG. 14, the passages 1053 may laterally overlap with the dummy trenches 15. Further, the distance the distance Dx along the first lateral direction X between two neighbored passages 1053 may amount to the total width of three neighbored IGBT cells 1-1. The distance Dy along the second lateral direction Y may be greater than the distance Dx. For example, the distance Dy along the second lateral direction Y between two neighbored passages may amount to at least eight times the distance Ds.

Figure 18:
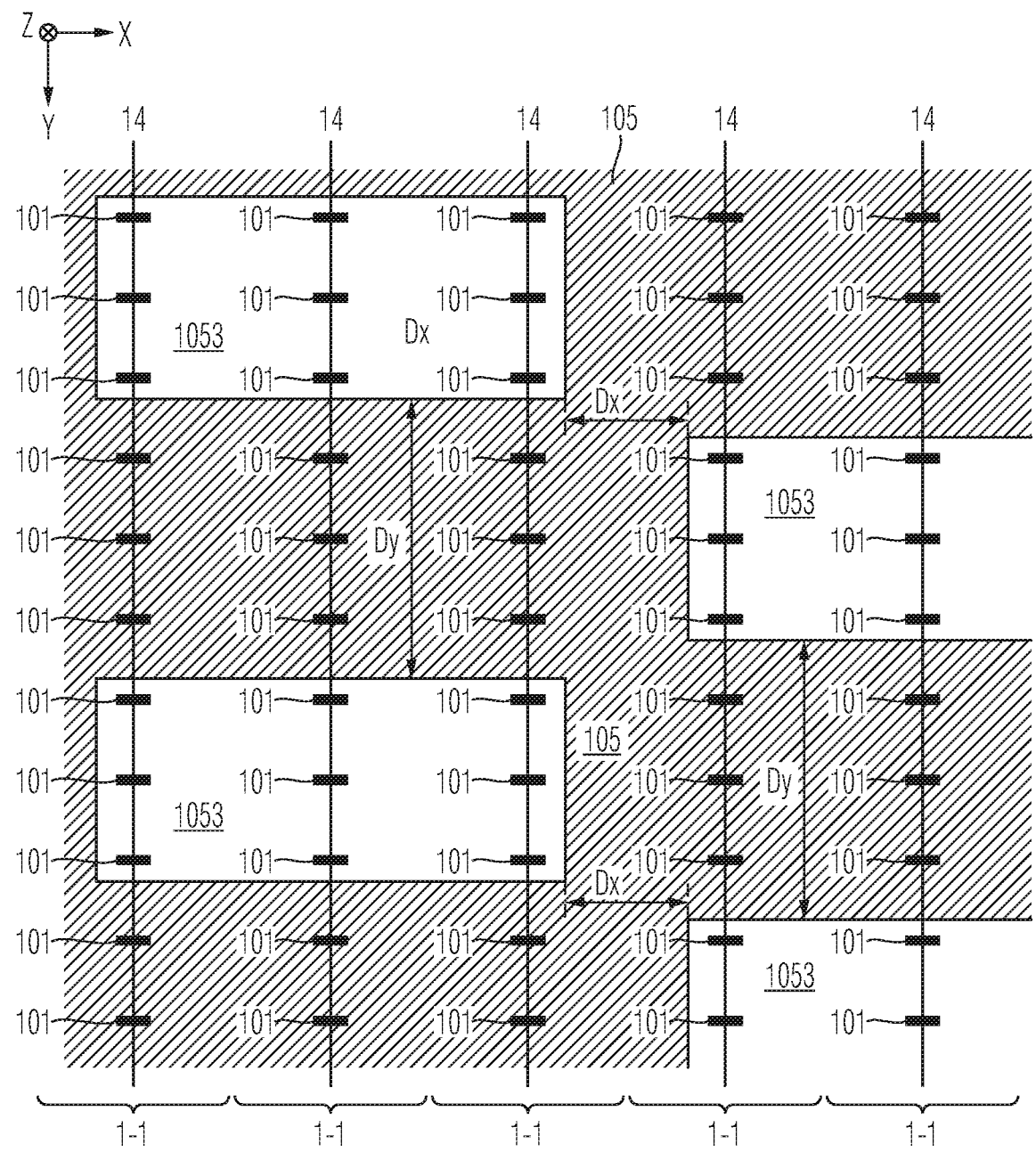

While keeping the dimensions of the passages 1053 unmodified with respect to the embodiment shown in FIG. 17, in accordance with the embodiment schematically and exemplarily illustrated in FIG. 18, the density of the passages 1053 may be increased and, hence, the distances Dx and Dy decreased. As further illustrated in FIGS. 17 and 18, the passages 1053 may be positioned such that two passages 1053 that are neighbored, at distance Dy, along the second lateral direction Y do not exhibit a lateral overlap along the first lateral direction X (as illustrated in FIG. 17) or such that two passages 1053 that are neighbored, at distance Dx, along the first lateral direction X do not exhibit a lateral overlap along the second lateral direction Y (as illustrated in FIG. 18).

Figure 19:
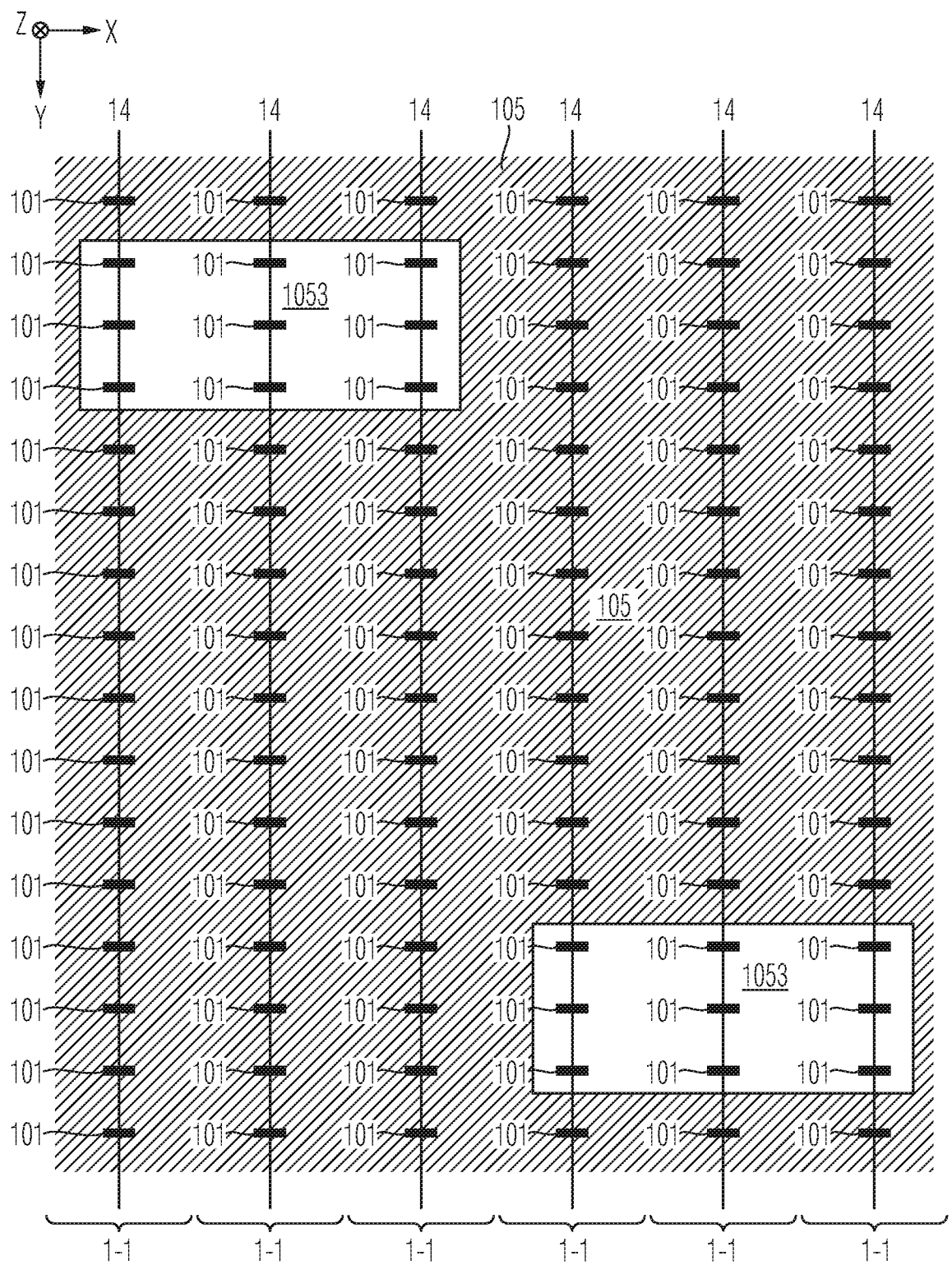

While keeping the dimensions of the passages 1053 unmodified with respect to the embodiment shown in FIG. 17, in accordance with the embodiment schematically and exemplarily illustrated in FIG. 19, the density of the passages 1053 may be decreased and, hence, the distances Dx and Dy increased.

Further variations of the lateral structure of the barrier region 105 are possible. As already noted with respect to FIG. 8A, also in accordance with the embodiments of FIGS. 12-19, it shall be understood that even though the source regions 101 are illustrated as extending to the left and right of a respective control trench 14, it is a provision that each of the number of control trenches 14 that are included in the respective IGBT cell 1-1 is arranged adjacent to no more than one active mesa 18.

For example, each variation of the lateral structure of the barrier region 105, e.g., as they are exemplarily and schematically illustrated in FIGS. 7 to 19, obeys one or more of the following provisions of a design rule:
  (i) a distance, e.g., said distances Dx and Dy, between two arbitrary ones of the pass-through passages 1053 that are arranged adjacent to each other is smaller than 1 mm;
  (ii) the barrier region 105 is arranged within said semiconductor layer of the semiconductor body 10, the semiconductor layer extending entirely and exclusively within the active cell region 1-2 and exhibiting a total volume, wherein the pass-through passages 1053 form at least 0.1% and at most 50% of said total volume, or wherein the pass-through passages 1053 form at least 1% and at most 30% of said total volume, or wherein the pass-through passages 1053 form at least 1% and at most 10% of said total volume. The remaining volume of the semiconductor layer, i.e., the p-doped part of the barrier region 105, is formed by semiconductor regions of the second conductivity type;
  (iii) the barrier region 105, despite its passages 1053, connects the inactive mesas 19 included in the plurality of IGBT cells 1-1 of the active cell region 1-2 with each other;
  (iv) the passages 1053 laterally overlap with at least a subset of the active mesas 18 of the active cell region 1-2 (For example, the one or more passages 1053 are positioned and/or dimensioned so as to laterally overlap with at least a subset of the source regions 101 of the active mesas 18);

(v) the passages 1053 laterally overlap with at least a subset of the control trenches 14 of the active cell region 1-2;
(vi) the barrier region 105 extends entirely and exclusively within the active cell region 1-2 (and not into the transition region 1-5);
(vii) the barrier region 105 extends at least partially into subset of the active mesas 18 (e.g., without establishing contact with the respective control trench 14 that is laterally flanked by the respective active mesa 18). For example, thereby, the barrier region 105 can be configured to provide for an electrically conductive path between a section of a respective one of the subset of the active mesas 18 and the bottoms 155 of the dummy trenches 15;
(viii) the lateral structure of the barrier region 105 is configured according to the second layout that has the second pitch which is at least twice as large as the first pitch (the IGBT cells 1-1 are configured with a lateral structure according to the first layout having the first pitch, as indicated above);
(ix) if present (e.g., when the power semiconductor switch 1 is configured as an RC-IGBT), the passages 1053 may laterally overlap with n-type emitters electrically connected to the second load terminal 12;

As has been explained above, the position and/or the lateral structure of the barrier region 105 (e.g., formed by one or more passages 1053) may allow dividing the total volume of the active mesas 18 into the first share and into the second share, the first share not laterally overlapping with the barrier region 105 and the second share laterally overlapping with the barrier region 105. As explained above, the first share of the active mesas 18 laterally overlaps with the at least one passage 1053 of the barrier region 105 or with another section of the drift region 100 where the barrier region 105 is not present (e.g., within the transition region 1-5). In contrast, the second share of the active mesas 18 laterally overlaps with the barrier region 105. For example, the load current conducted by the second share traverses the barrier region 105. As has further been explained above, in an embodiment, the first share is configured to carry the load current at least within the range of 0% to 100% of the nominal load current for which the power semiconductor device is designed. The second share may be configured to carry the load current only if it exceeds at least 0.5% of the nominal load current. Hence, the first share of active mesas 18 can be considered as an "ignition volume" which, e.g., during turn-on of the power semiconductor switch 1 starts to conduct the load current whereas the second share initially remains inactive. Then, if the load current exceeds the threshold of at least 0.5% of the nominal load current (wherein this threshold can be higher than 0.5%, e.g., higher than 1%, e.g., at least 5% or at least 10%), the barrier region 105 may become more conductive such that the second share may also carry the load current.

Figure 20:
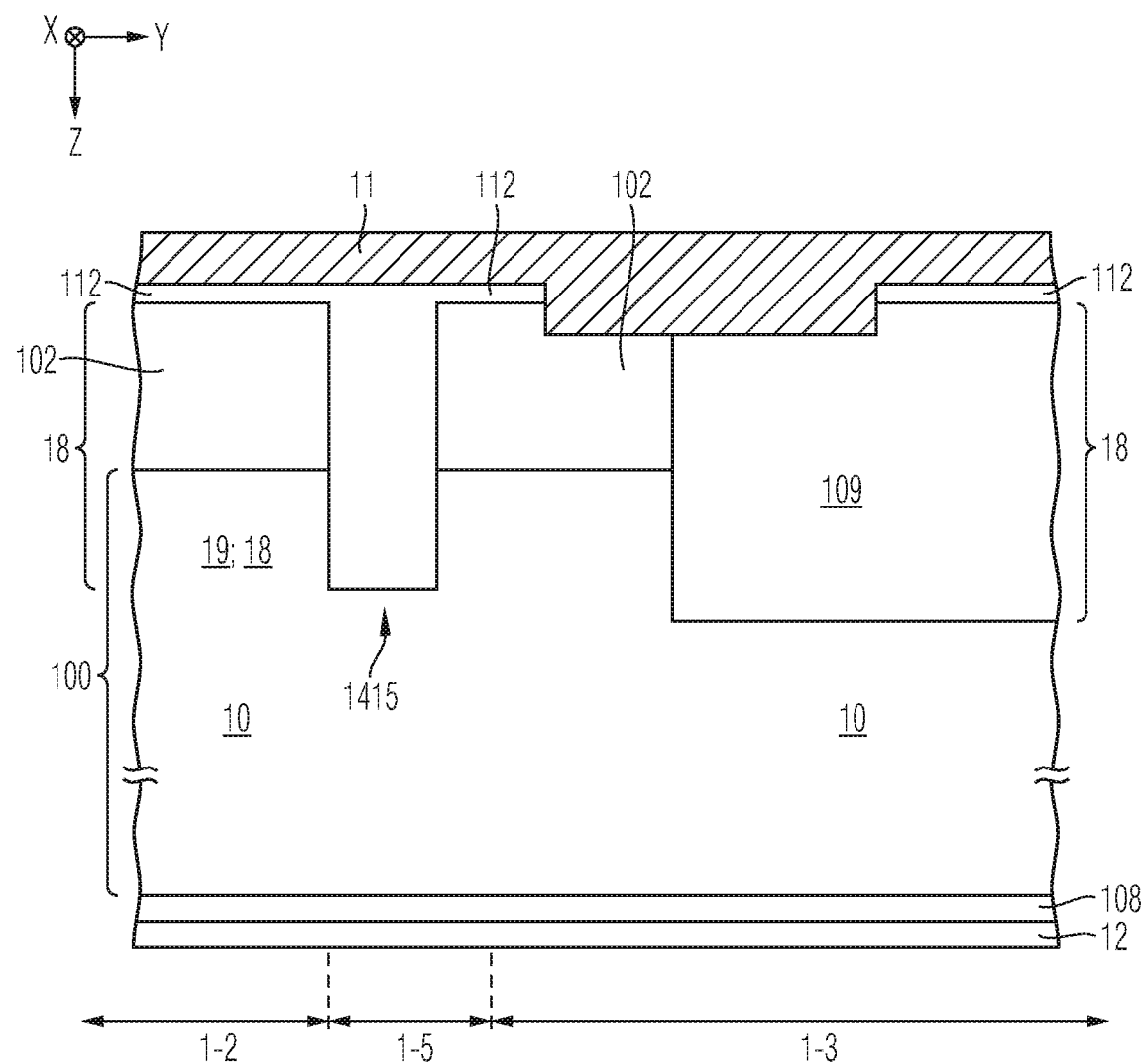
FIG. 20 schematically and exemplarily illustrates a section of a vertical cross-section of a power semiconductor switch in accordance with one or more embodiments.

Now referring to FIG. 20, a further feature shall be described that may be provided in each embodiment described herein.

FIG. 20 illustrates a section of a vertical cross-section in parallel to the ZY-plane (not in parallel to the ZX-plane). In accordance with said further feature, the switch 1 comprises a cross-trench structure 1415 associated with at least one of the IGBT cells 1-1.

The cross-trench structure 1415 merges each of the at least one control trench 14, the at least one dummy trench 15 and the at least one further (control or dummy) trench of the at least one IGBT cell 1-1 to each other. For example, the cross-trench structure 1415 extends substantially perpendicular to the stripe-like configuration of the at least one control trench 14, of the at least one dummy trench 15 and of the at least one further (control or dummy) trench, e.g., substantially along the first lateral direction X, e.g., deviating by no more than 1 micrometer in total depth as compared to the other trenches 14, 15, 16. For example, said merging occurs by means of at least one of a trench insulator and a trench electrode of the cross-trench structure 1415 such that in regions where the merging occurs, said trenches or not separated from each other by means of the semiconductor body 10.

The cross-trench structure 1415 overlaps at least partially along the vertical direction Z with the plurality of the trenches 14, 15 of the at least one IGBT-cell 1-1. Hence, like the plurality of the trenches 14, 15 of the at least one IGBT-cell 1-1, the cross-trench structure 1415 may extend from the semiconductor body surface along the vertical direction Z into the semiconductor body 10.

In an embodiment, the cross-trench structure 1415 is arranged in the transition region 1-5. For example, a portion of the body region 102 in the active cell region 1-2 and the well region 109 in the edge termination region 1-3 may be separated from each other at least by means of the cross-trench structure 1415. Moreover, the cross-trench structure 1415 may be configured to electrically isolate the portion of the body region 102 in the active cell region 1-2 and the well region 109 in the edge termination region 1-3 from each other, or, respectively, at least contribute to an electrical isolation between the portion of the body region 102 in the active cell region 1-2 and the well region 109 in the edge termination region 1-3. Said portion of the body region 102 may be present in the inactive mesa(s) 19.

Further, if present, the barrier region 105 in the active cell region 1-2 and the well region 109 in the edge termination region 1-3 may be separated from each other at least by means of the cross-trench structure 1415. Moreover, the cross-trench structure 1415 may be configured to electrically isolate the barrier region 105 in the active cell region 1-2 and the well region 109 in the edge termination region 1-3 from each other or, respectively, at least contribute to an electrical isolation between barrier region 105 in the active cell region 1-2 and the well region 109 in the edge termination region 1-3.

For example, a portion of the drift region 100 located in a lateral direction (e.g., second lateral direction Y in FIG. 20) between the electrically floating barrier region 105 and the well region 109 has a lateral extension of at least 1 μm in said lateral direction. Further, as illustrated in FIG. 20, the cross-trench structure 1415 can laterally overlap with this portion of the drift region 100.

In an embodiment, the well region 109 does not laterally overlap with the bottom of the cross-trench structure 1415. As will also be explained with respect to FIG. 25, when extending from the edge termination region 1-3 towards the active cell region 1-2, the well region 109 may decrease in depth (along the vertical direction Z) and even terminate at the cross-trench structure 1415. But, for example, the well region 109 does not extend below the bottom of the cross-trench structure 1415 towards the active cell region 1-2; rather, the eventual contact between the cross-trench structure 1415 and the well region 109 is, e.g., only established at the upper 50% of the sidewall of the cross-trench structure 1415 facing to the edge termination region 1-3.

Figure 21A:
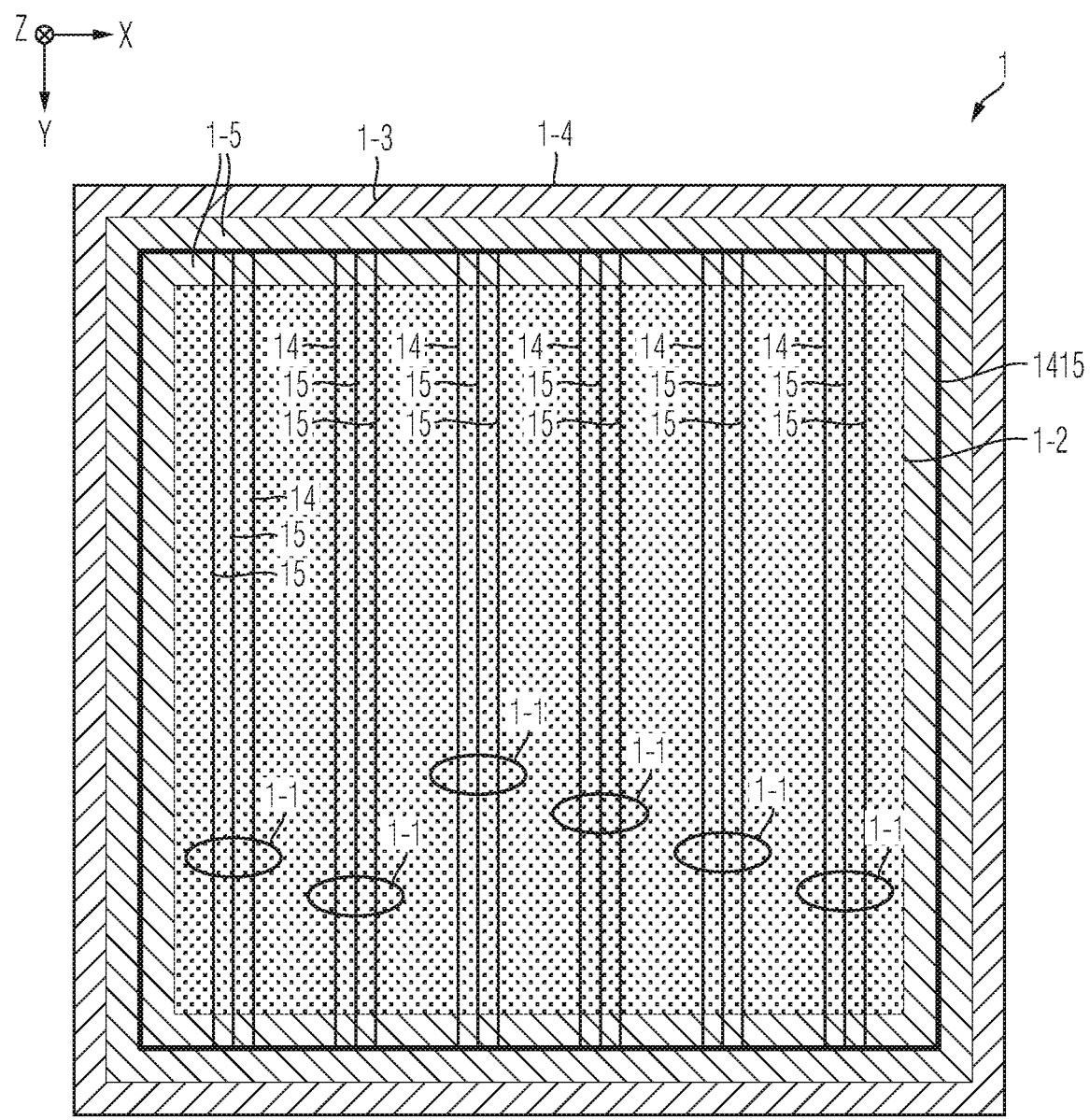
FIGS. 21A-21D each schematically and exemplarily illustrate a section of a horizontal projection of a power semiconductor switch in accordance with some embodiments.

As more clearly illustrated in FIG. 21A (and in FIG. 26), the cross-trench structure 1415 may be associated with more than only one of the IGBT cells 1-1, e.g., with a plurality or even with all of the IGBT cells 1-1 of the active cell region 1-2. For example, like the transition region 1-5, the cross-trench structure 1415 may even surround the entire active cell region 1-2. In other words, each IGBT cell 1-1 may be associated with one cross-trench structure 1415, and, optionally, the cross-trench structures 1415 may unite with each other so as to form a closed structure. In other embodiments, each IGBT cell 1-1 may be associated with one cross-trench structure 1415, and, optionally, the cross-trench structures 1415 do not unite with each other but are separated from each other.

As further illustrated in FIG. 21A, the cross-trench structure 1415 may extend linearly, e.g., along the first lateral direction X at two opposing sections of the transition region 1-5 and along the second lateral direction Y at the two other opposing sections of the transition region 1-5.

In FIG. 21A, the IGBT cells 1-1 are being illustrated only with the control trench 14 and two adjacent dummy trenches 15 for simplicity. However, each IGBT cell 1-1 can comprise further trenches, e.g., so as to exhibit one of the above mentioned contacting schemes, e.g., one of kSkGoDoG, kSoSkGoDoG and kSoSoSkGoDoG.

As illustrated, the trenches 14, 15 that join into the cross-trench structure 1415 may terminate at the cross-trench structure 1415. In another embodiment, the trenches 14, 15 that join into the cross-trench structure 1415 may even cross the cross-trench structure 1415 and extend further into the transition region 1-5 towards or even into the edge termination region 1-3. In contrast, if present, the source trenches 16 do for example neither join into the cross-trench structure 1415, but terminate before reaching the cross-trench structure 1415 (cf., for example, FIG. 26).

In an embodiment, the barrier region 105 is only arranged within the boundaries of the cross-trench structure 1415, and not external thereof. Further, the well region 109 can be arranged only external of the boundaries of the cross-trench structure 1415, not internal thereof.

Figure 21B:
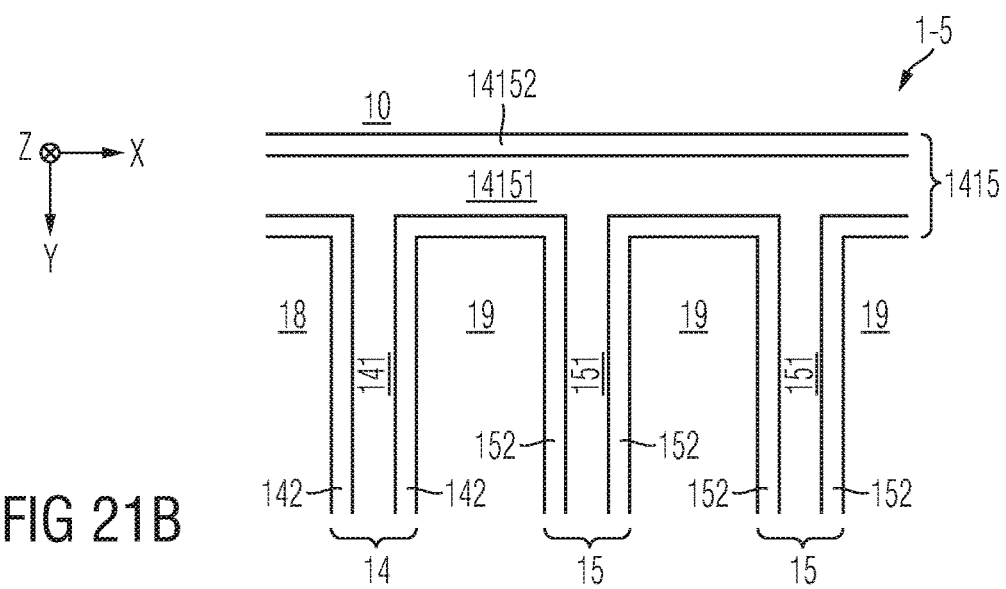

Now referring to FIG. 21B, the cross-trench structure 1415 may comprise a cross-trench electrode 14151, which may for example electrically connect each of the control trench electrode 141, the dummy trench electrode 151 and the further dummy trench electrode 151 with each other. The cross-trench electrode 14151 may be electrically insulated from the semiconductor body 10 by means of a cross-trench insulator 14152. In an embodiment, in contrast to the control and dummy trench electrodes 141, 151, the source trench electrodes 161 (if present) are of course not electrically connected with the cross-trench electrode 14151.

Figure 21C:
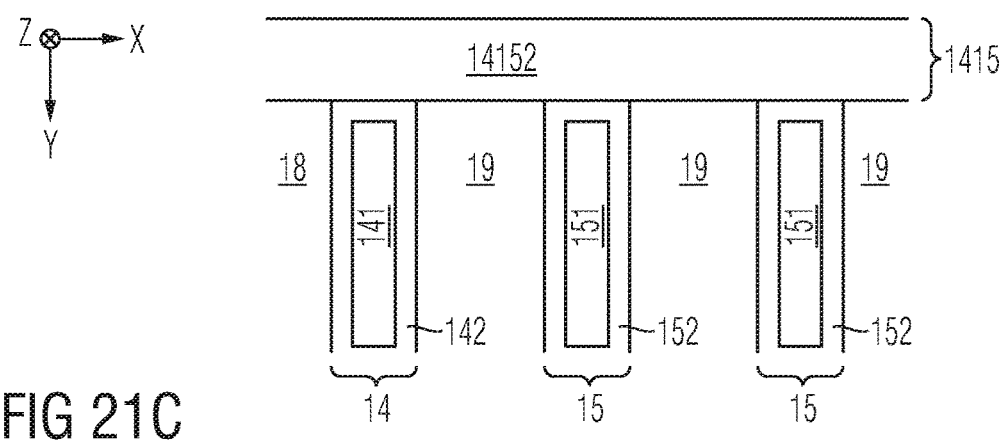

In another embodiment, the cross-trench structure 1415 essentially only consists of cross-trench insulator 14152 and does not exhibit an own electrode, as illustrated in FIG. 21C.

Figure 21D:
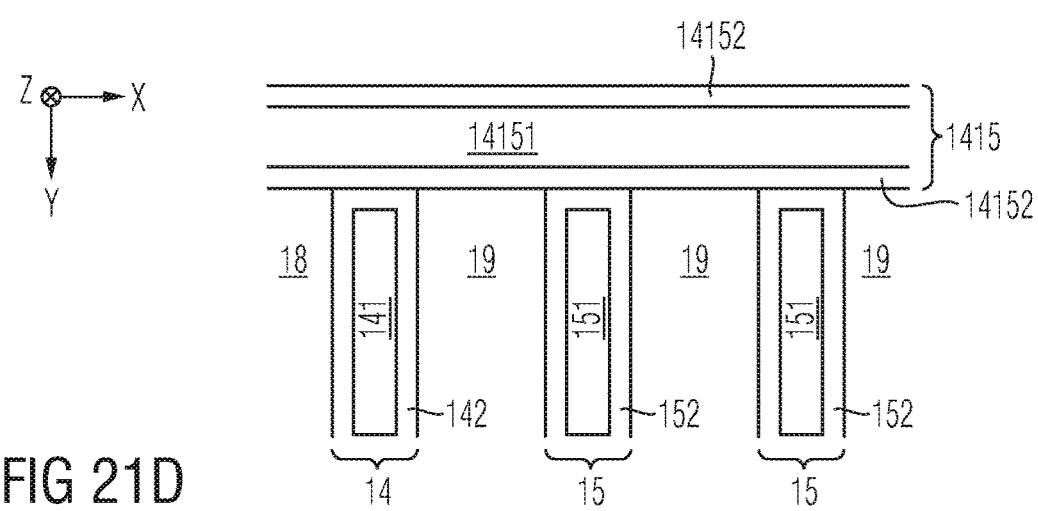

In yet other embodiments, e.g., as illustrated in FIG. 21D, the cross-trench structure 1415 comprises the cross-trench electrode 14151 that is electrically connected to a potential different from the potential of the control terminal 13, e.g., to the first load terminal 11, or, another embodiment, the cross-trench electrode 14151 is electrically floating. For example, if the cross-trench electrode 14151 is electrically connected to the first load terminal 11 and, if present, the source trench electrodes 161 of the IGBT cells 1-1 can merge with the cross-trench electrode 14151 in a similar manner as described with respect to the dummy and control trench electrodes 141, 151 as shown in FIG. 21B.

The cross-trench structure 1415 can for example exhibit the substantially same width and/or substantially same depth as the trenches 14, 15, 16 of the IGBT cells 1-1, deviating by no more than 1 micrometer in total depth as compared to the other trenches 14, 15, 16. E.g., for ensuring that the cross-trench structure 1415 exhibits the substantially same depth (along the vertical direction Z) as the trenches 14, 15, 16, techniques are known according to which the trench layout is tapered where the trenches 14, 15, 16 intersect with the cross-trench structure 1415.

As explained above, the cross-trench structures 1415 may each be arranged within the transition region 1-5. Alternatively, the cross-trench structures 1415 may be arranged within the active cell region 1-2, or, respectively, in addition to the cross-trench structures 1415 that may each be arranged within the transition region 1-5, further cross-trench structures (not illustrated) with the same configuration may be arranged with in the active cell region 1-2. For example, the further (and optional) cross-trench structures in the active cell region 1-2 may be established by applying techniques known as spacer trenches, e.g., by locally widening the layout of the control and dummy trenches 14, 15 to be merged such that the trench insulators 142, 152 extending along the mesa width so as to unite with each other. Such technique may for example also be applied for forming the cross-trench structures 1415 in the transition region 1-3.

Figure 22A:
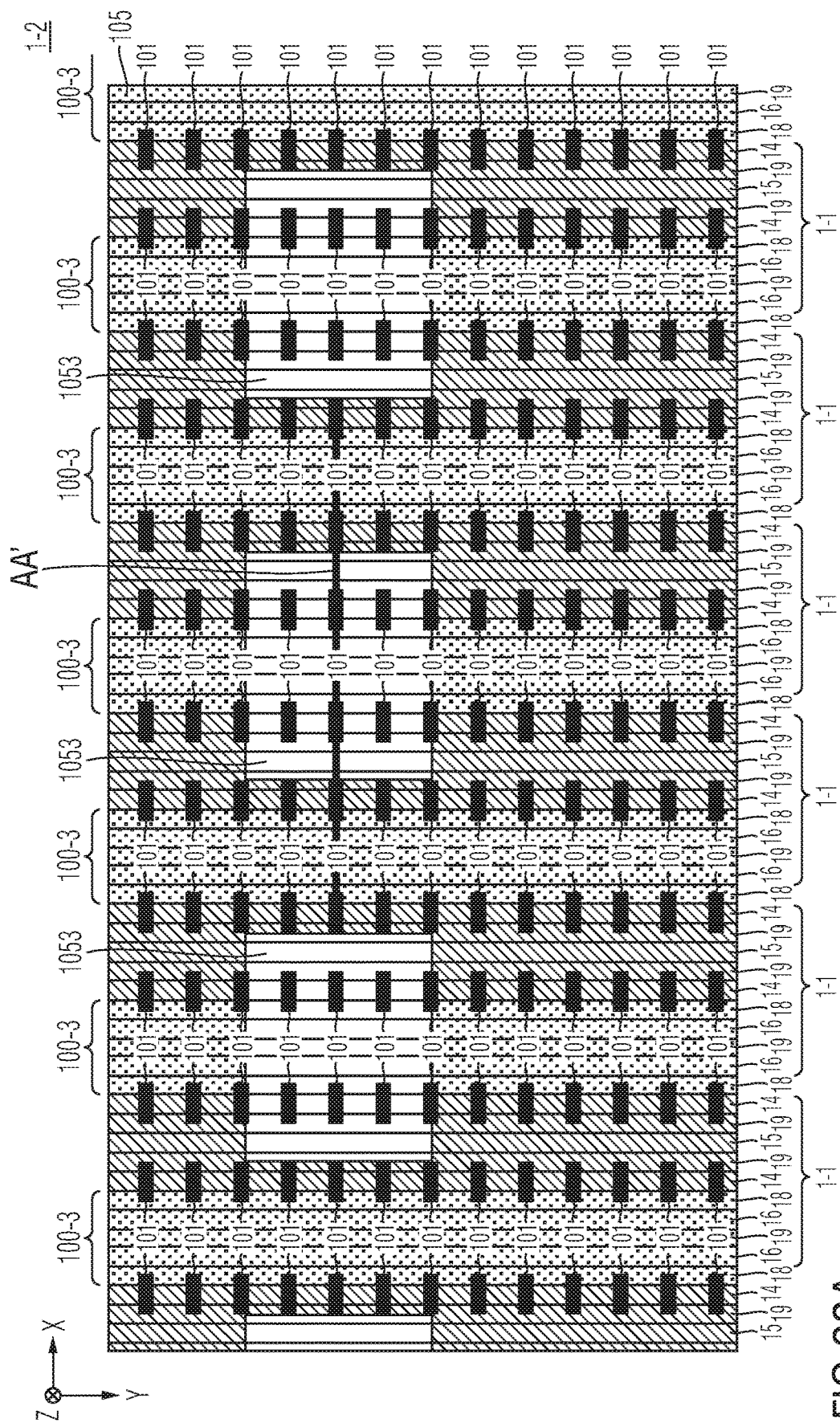
FIGS. 22A-22C each schematically and exemplarily illustrate a section of a horizontal projection of a power semiconductor switch in accordance with some embodiments.
Figure 22B:
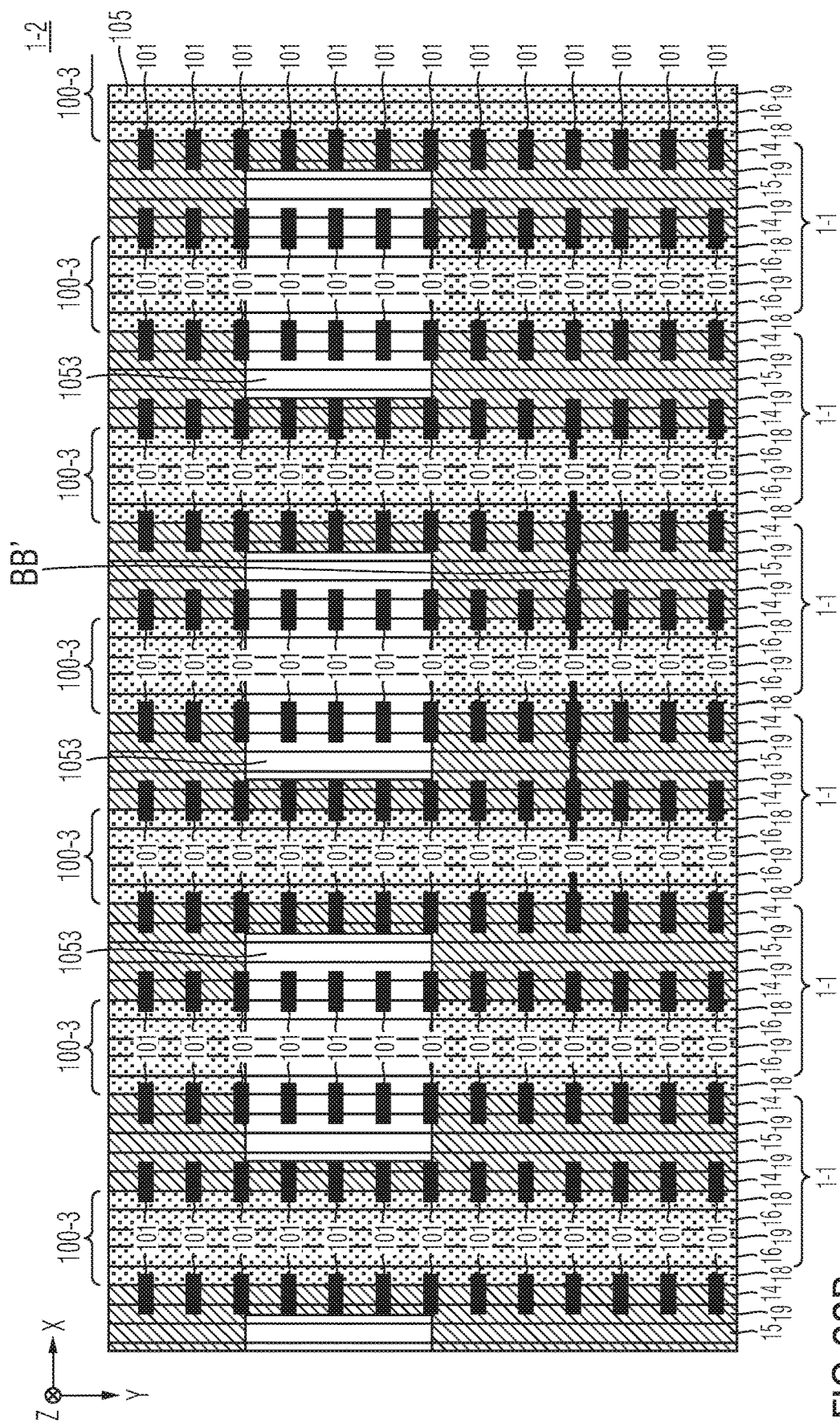
Figure 22C:
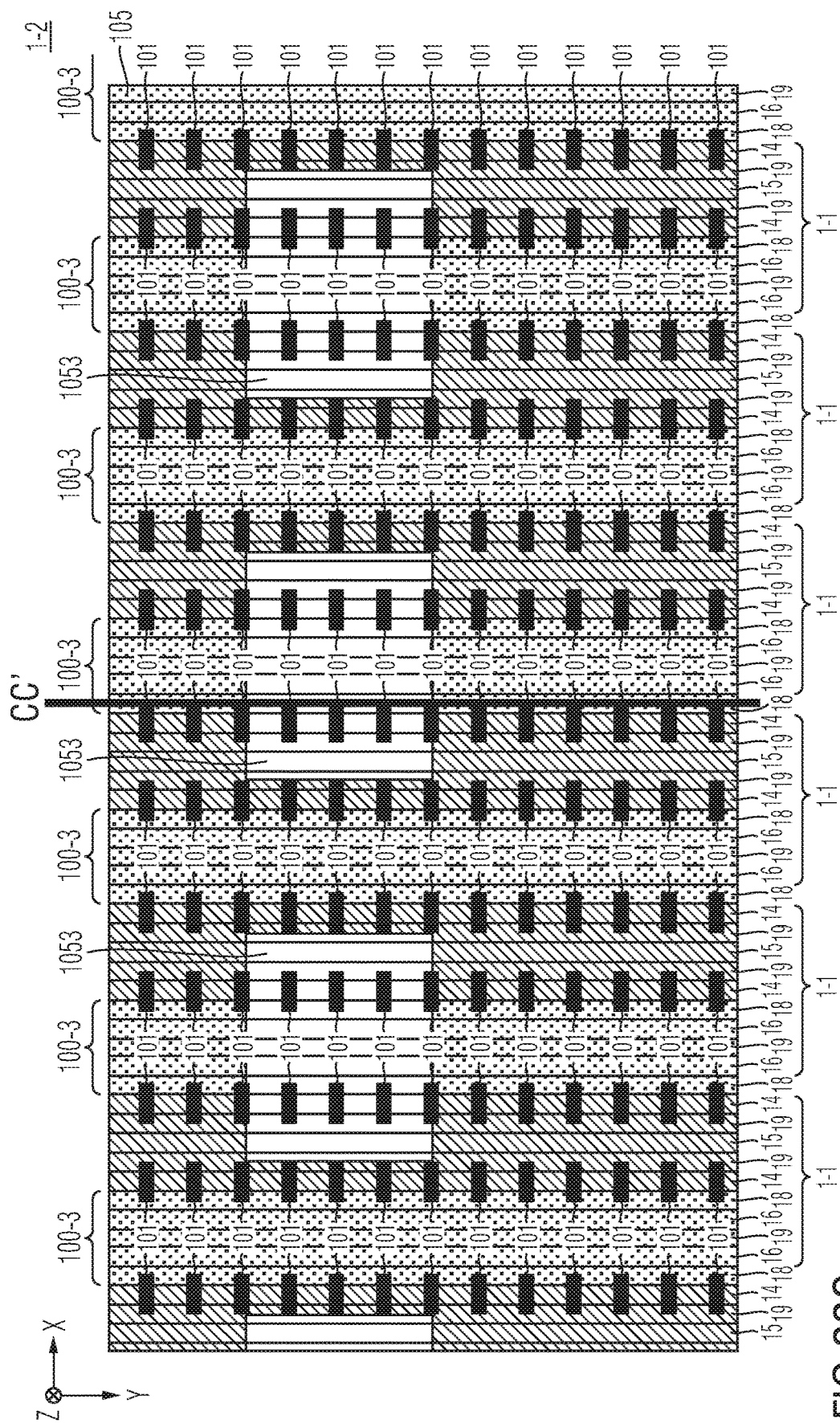

It will now be referred to FIGS. 22A-C and FIGS. 23A-C. FIGS. 22A-C schematically and exemplarily illustrate a section of a horizontal projection of the active cell region 1-2 of the switch 1 in accordance with one or more embodiments, and FIGS. 23A-C schematically and exemplarily illustrate a corresponding section of a vertical cross-section of the switch 1 in accordance with one or more embodiments (FIG. 23A along line AA' shown in FIG. 22A, FIG. 23B along line BB' shown in FIG. 22B, and FIG. 23C along line CC' shown in FIG. 22C).

In accordance with the embodiments illustrated in FIGS. 22A-C and FIGS. 23A-C, each IGBT cell 1-1 exhibits the contacting scheme "kSoSkGoDoG", i.e., one dummy trench 15, two control trenches 14, two source trenches 16, two active mesas 18, and three inactive mesas 19 arranged with the neighborhood relationship (trenches in bold)

18-16-19-16-18-14-19-15-19-14 (="kSoSkGoDoG")

Further in accordance with the embodiments illustrated in FIGS. 22A-C and FIGS. 23A-C, the switch 1 exhibits both the barrier region 105 of the second conductivity type (herein also referred to as p-barrier region 105) and the further barrier region 100-3 of the first conductivity type (herein also referred to as n-barrier region 100-3).

The p-barrier region 105 may be configured in a manner as described above in detail, e.g., as a laterally structured semiconductor layer having the pass-through passages 1053.

In accordance with one or more embodiments, e.g., as exemplarily illustrated in FIGS. 22A-C and FIGS. 23A-C, the n-barrier region 100-3 is also laterally structured, e.g., at least along the first lateral direction X. For example, the n-barrier region is arranged within (e.g., only within) the active cell region 1-2, and for example does not extend into the edge termination region 1-3 or, not even into the transition region 1-5. Like the p-barrier region 105, the n-barrier region may be configured as a laterally structured semiconductor layer that extends with the active cell region 1-2.

In an embodiment, both the p-barrier region 105 and the n-barrier region 100-3 exhibit a respective lateral structure. For example, the lateral structure of the n-barrier region 100-3 may be different from the lateral structure of the p-barrier region 105 (which is exemplarily illustrated in FIGS. 22A-C and FIGS. 23A-C). For example, the passages 1053 of the p-barrier region 105 may laterally overlap with the n-barrier region 100-3.

For example, the n-barrier region 100-3 comprises a plurality of stripes extending in parallel to the stripe configuration of the trenches 14, 15 and 16, and each IGBT cell 1-1 may comprise one of the stripes of the n-barrier region 100-3, as exemplarily illustrated in FIGS. 22A-C and FIGS. 23A-C.

Further, the p-barrier 105 region may extend further along the vertical direction Z than the n-barrier region 100-3, and the n-barrier region 100-3 may extend further against the vertical direction Z than the p-barrier region 105. Hence, the p-barrier 105 region may be arranged closer to the second load terminal 12 than the n-barrier region 100-3, and the n-barrier region 100-3 may be arranged closer to the first load terminal 11 than the p-barrier region 105.

For example, in accordance with the embodiments illustrated in FIGS. 22A-C and FIGS. 23A-C, and as best illustrated in FIG. 23A, in each IGBT cell 1-1, the n-barrier region 100-3 overlaps partially with the passage 1053 of the p-barrier region 105.

Further, in an embodiment, the n-barrier region 100-3 does for example not extend into those inactive mesas that are laterally confined by only dummy and/or control trenches 14, 15. For example, the n-barrier region 100-3 only extends into the active mesas 18 and, if present, only into those inactive mesas 19 that are laterally confined by two source trenches 16, as shown in FIGS. 22A-C and FIGS. 23A-C. For example, the n-barrier region 100-3 is at least implemented with those active mesas 18 that laterally overlap with the passages of the p-barrier region 1053.

The n-barrier region 100-3 is for example arranged between, with respect to the vertical direction Z, the body region 102 and the p-barrier region 105.

For example, the body region 102 separates the n-barrier region 100-3 from the source region 101 in each IGBT cell 1-1; e.g., the n-barrier region 100-3 is not in contact with the source region 101, but separated therefrom by means of the body region 102.

Figure 24:
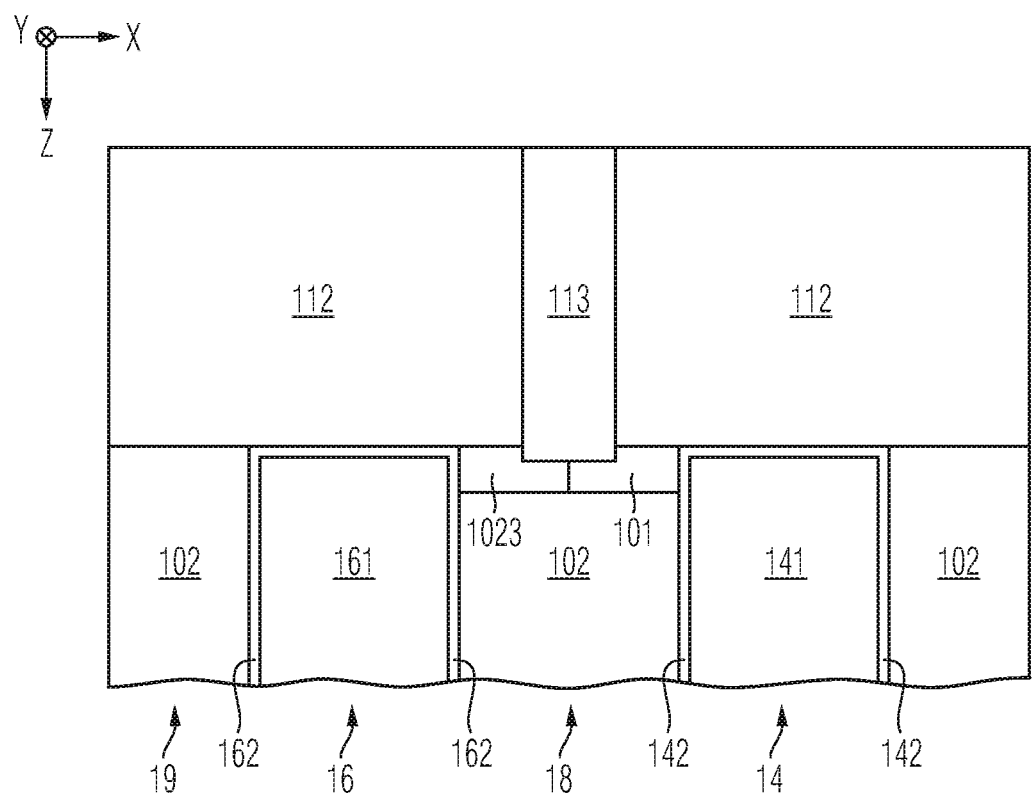
FIG. 24 schematically and exemplarily illustrate a section of a vertical cross-section of a power semiconductor switch in accordance with one or more embodiments.

Line AA' in FIG. 22A extends along the source regions 101 of the adjacent IGBT cells 1-1, as also shown in FIG. 23A. As further shown in FIG. 23A and even more clearly in FIG. 24, the body region 102 may comprise a highly doped contact region 1023 of the second conductivity type that allows for a low ohmic connection to the first load terminal 11. E.g., as illustrated in FIGS. 23A and 24, the source region 101 and the highly doped contact region 1023 may be arranged adjacent to each other and, within the active mesa 18, both in contact with the first contact plug 113.

As illustrated in FIG. 23B, within each IGBT cell 1-1, the n-barrier region 100-3 and the p-barrier region 105 may laterally overlap with each other. This may for example occur when the n-barrier region 100-3 is not laterally structured along the second lateral direction Y, but only along the first lateral direction X, whereas the p-barrier region 105 may be laterally structured in both lateral directions X and Y, as described in detail above.

An aspect which has already been explained with respect to FIGS. 5A-B is also schematically illustrated in FIG. 23B': The presence or, respectively non-presence of the n-barrier region 100-3 may influence the vertical level of the first pn-junction 1021 formed between the body region 102 and the below thereof arranged semiconductor region of the first conductivity type, namely either the upper drift region section 100-1 or the higher doped n-barrier region 100-3. For example, in accordance with one or more embodiments, the first pn-junction 1021' formed in mesas into which the n-barrier region 100-3 does not extend is arranged deeper (with respect to the vertical direction Z) as compared to the first pn-junctions 1021 formed in mesas into which the n-barrier does extend. For example, the difference in depths between these kinds of first pn-junctions 1021 and 1021' amounts to at least 200 nm or to at least 1 μm. For example, due to absence of the n-barrier region 100-3 in some mesas, the body regions 102 of these mesas may even form a homojunction with the p-barrier region 105, as explained further above with respect to FIG. 5A. In this case, there would accordingly be only a partial or even no pn-junction 1021' at all.

In other words, both the at least one inactive mesa 19 and the at least one active mesa 18 may comprise a section of the body region 102, wherein the body region section 102 in the inactive mesa 19 extends further along the vertical direction Z than the body region section 102 in the active mesa 18, in accordance with an embodiment.

For example, in the active cell region 1-2, in those inactive mesas 19 that do not comprise the n-barrier region 100-3 and that laterally overlap with the p-barrier region 105, said homojunction may be formed by a transition from the body region 102 in these inactive mesas 19 to the p-barrier region 105 along the vertical direction Z. However, since the body regions 102 in these mesas may for example be electrically floating (not electrically connected to the first load terminal 11), the p-barrier region 105 also remains electrically floating, even in case said homojunction is formed.

Figure 9:
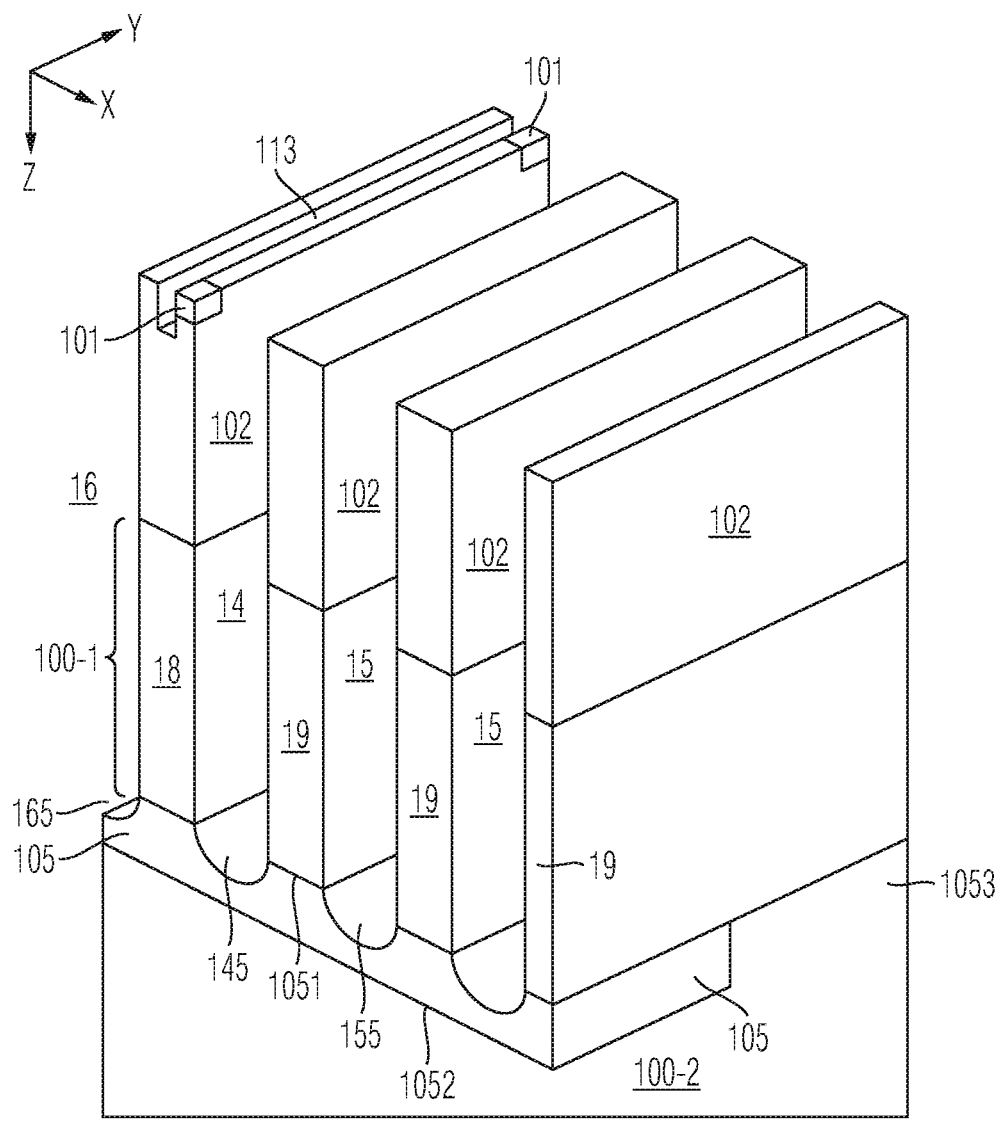
FIG. 9 schematically and exemplarily illustrates a sections of a perspective projection of a power semiconductor switch in accordance with some embodiments.

Now referring to FIG. 23C, which shows a section of a vertical cross-section of one active mesa 18 in parallel to the YZ-plane (without illustrating the first contact plug 113), the source region 101 may be laterally structured in the second lateral direction Y, which has already been shown in previous drawings, e.g., FIG. 9. Further, along the second lateral direction Y, the active mesa 18 may comprise first sections where, in the vertical direction, there are arranged the source region 101, the body region 102, the n-barrier region 100-3 and the p-barrier region 105 below each other, and second sections, where, in the vertical direction, there are arranged the source region 101, the body region 102, the n-barrier region 100-3 and the passage 1053 of the p-barrier region 105 (e.g., a drift region section) below each other.

Figure 25A:
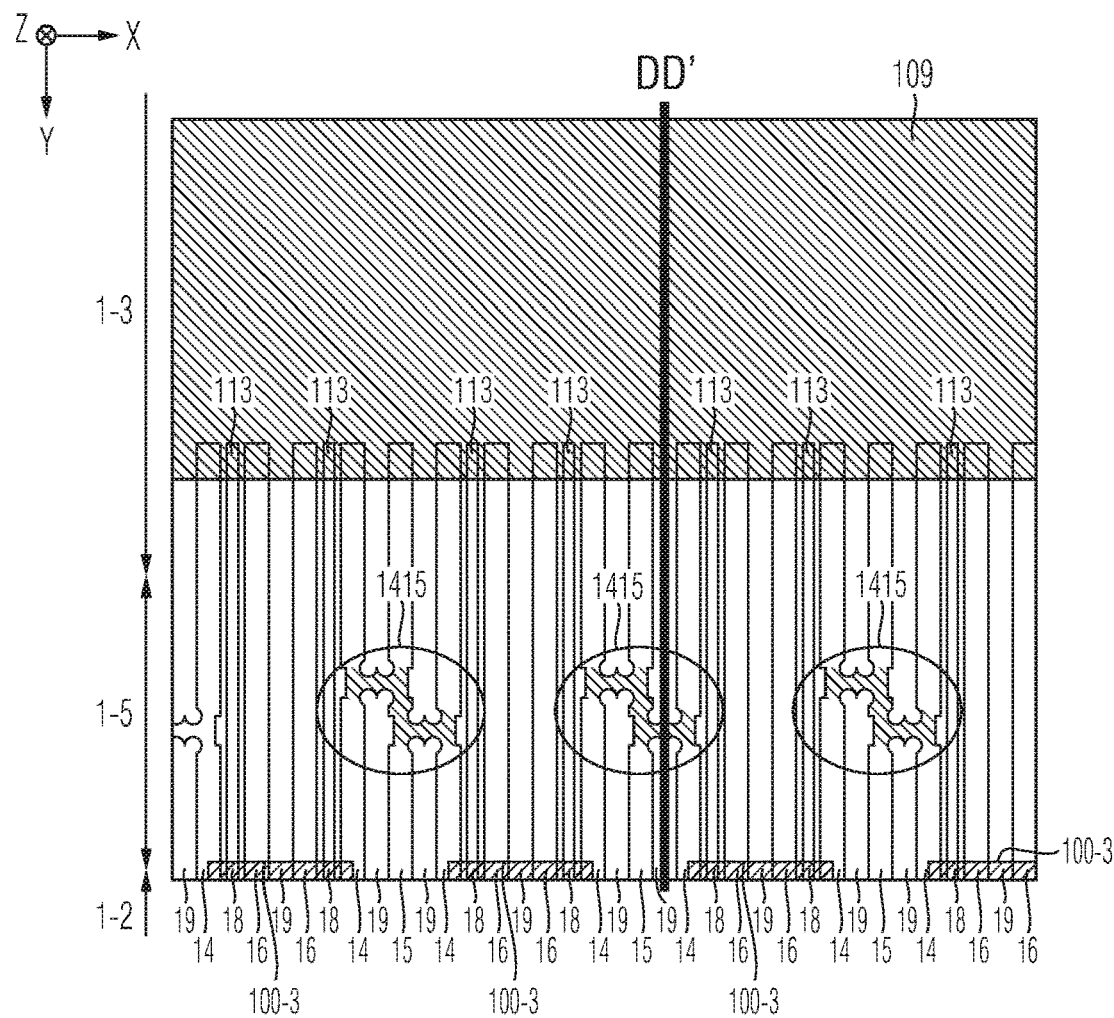
FIGS. 25A-25B schematically and exemplarily illustrate both a section of a vertical cross-section and a corresponding section of a horizontal projection of a power semiconductor switch in accordance with one or more embodiments.
Figure 25B:
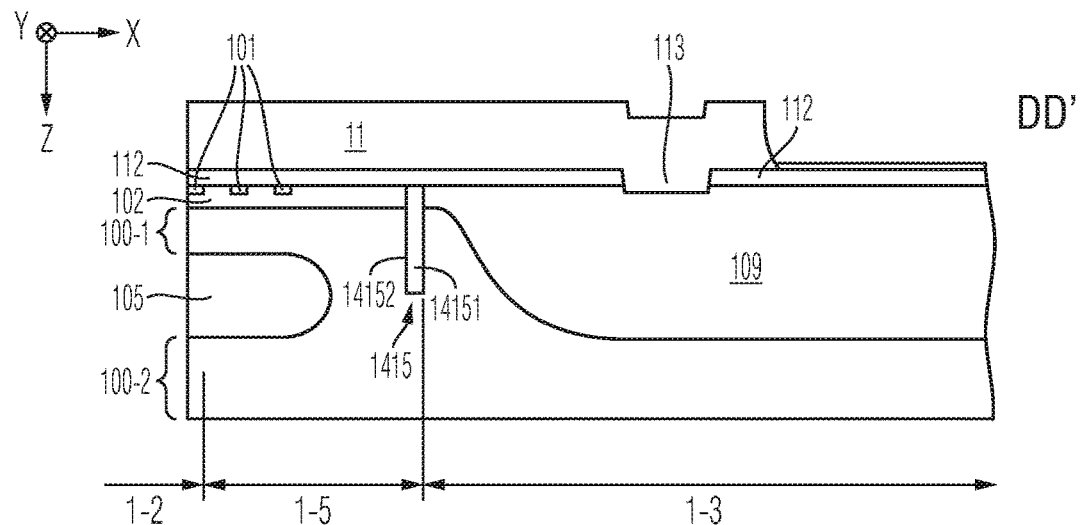
Figure 29:
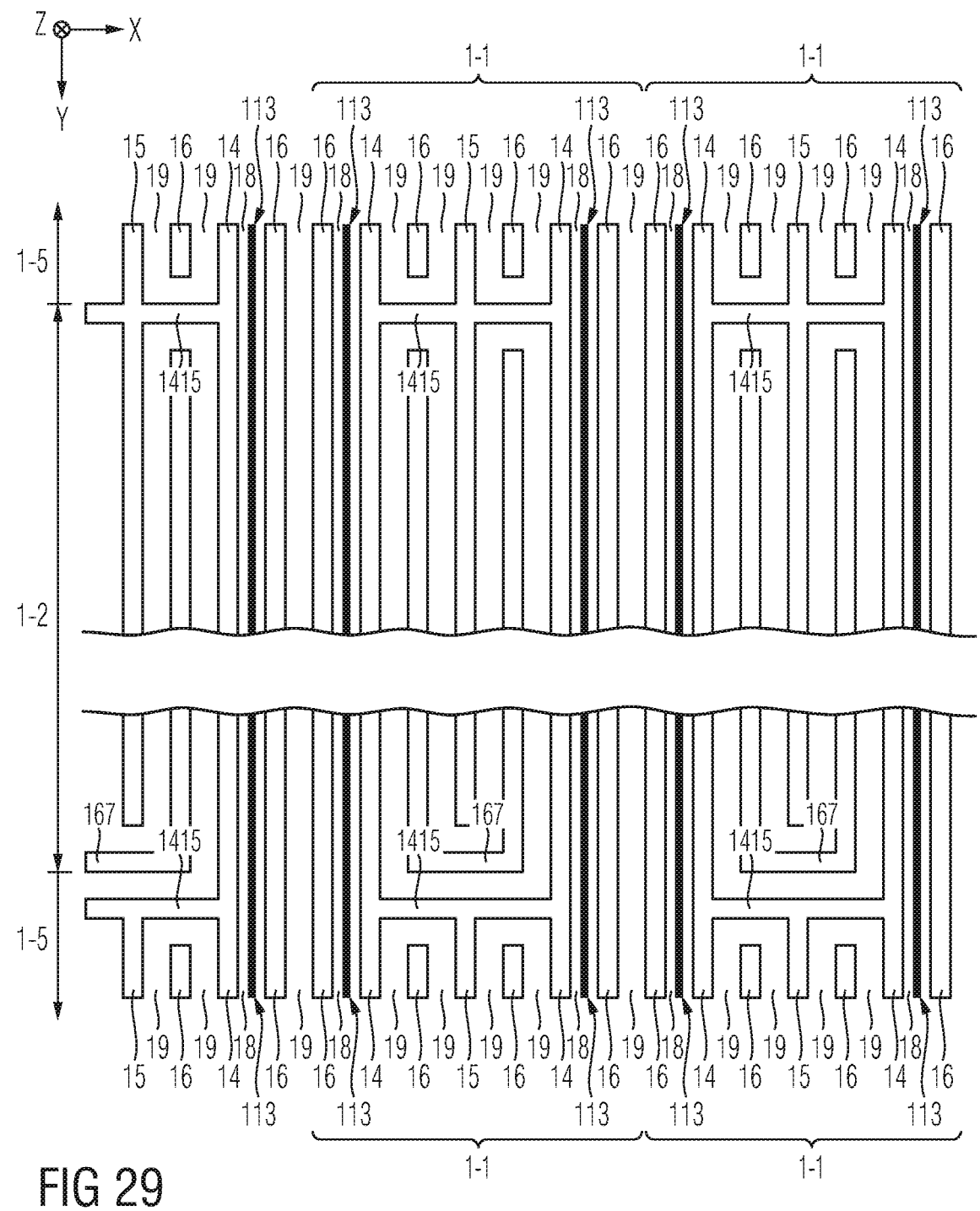

With respect to FIGS. 25A-B to 29, further optional aspects of the cross-trench structure 1415 shall be described.

FIG. 25A schematically and exemplarily illustrates a section of a horizontal projection of the switch 1 in accordance with one or more embodiments, and FIG. 25B a corresponding section of a vertical cross-section along line DD' in FIG. 25A.

The IGBT cells 1-1 of the switch 1 illustrated in FIGS. 25A-B have the same contacting scheme as those illustrated in FIGS. 22A-C, i.e., each cell 1-1 has one dummy trench 15, two control trenches 14, two source trenches 16, two active mesas 18, and three inactive mesas 19 arranged with the neighborhood relationship (trenches in bold)

18-16-19-16-18-14-19-15-19-14 (="kSoSkGoDoG")

What has been stated above with regards to the p-barrier region 105 and the n-barrier region 100-3 may equally apply to the embodiments illustrated in FIGS. 25A-B to 29. As exemplarily shown in FIG. 25A, the n-barrier region 100-3 may terminate within the active cell region 1-2 and for example does not extend into the edge termination region 1-3.

As has further been explained above and which is also illustrated in FIG. 25A, in each IGBT cell 1-1, the dummy trench 15 is arranged between two control trenches 14, with no source trench 16 or other trench in between.

For each IGBT cell 1-1, the switch 1 can comprise the associated cross-trench structure 1415. As explained above, for each cell 1-1, the respectively associated cross-trench structure 1415 merges each of the two control trenches 14 and the dummy trench 15 to each other. As the control and dummy trenches 14, 15, the cross-trench structure 1415 extends along the vertical direction Z into the semiconductor 10 (cf. FIG. 25B).

FIG. 25A illustrates the layout for the cross-trench structures 1415, wherein the above mentioned trench tapering technique may be applied, e.g., so as to ensure that the cross-trench structures 1415 extend about as far along the vertical direction as the trenches 14, 15, 16. Further, the cross-trench structure 1415 may include two cross-trenches 1415-1 and 1415-2 (cf. FIG. 26), each coupling two adjacent trenches 14, 15 with each other, as illustrated in FIG. 25A, wherein the two cross-trenches 1415-1 and 1415-2 may be laterally displaced from each other along the second lateral direction Y.

FIG. 25B shows the section of the vertical cross-section along line DD' in FIG. 25A, i.e., a section of the inactive mesa 19 laterally confined by the dummy trench 15 and one of the control trenches 14. Accordingly, the cross-trench structure 1415 can be arranged in the transition region 1-3 and between, with respect to the second lateral direction Y, the p-barrier region 105 and the well region 109. As the other trenches 14, 15, 16, the cross-trench structure 1415 comprises the cross-trench electrode 14151 electrically insulated from the semiconductor body 10 by means of the cross-trench insulator 14152. As explained above (e.g., with respect to FIG. 21B), the cross-trench electrode(s) 1415 of the cross-trench structure 1415 (or, respectively, the cross-trenches 1415-1 and 1415-2) may be electrically connected with the dummy trench electrode 151 and the control trench electrodes 141.

In an embodiment, as for example illustrated in FIG. 25, the cross-trench structure 1415 penetrates the body region 102, e.g., so as to separate the body region 102 arranged in the inactive mesa 19 within the active cell region 1-2 from the well region 109 of the edge termination region 1-3. For example, unlike those body regions 102 that are part of the active mesas 18 in the active cell field 1-2, those body regions 102 that are part of the inactive mesas 19 in the active cell field 1-2 shall not be electrically connected to the first load terminal 11, or any other defined potential. In other words, those body regions 102 that are part of the inactive mesas are floating, in accordance with an embodiment. The well region 109 is for example electrically connected to the first load terminal 11. Hence, for ensuring that those body regions 102 that are part of the inactive mesas 19 in the active cell field 1-2 remain substantially decoupled from the first load terminal 11, the cross-trench structure 1415 can be configured to electrically isolate the well region 109 from those body regions 102 that are part of the inactive mesas 19 in the active cell field 1-2. For example, the well region 109 may even contact one side of the cross-trench structure 1415, and the other side of the cross-trench structure may be contacted by one of said body regions 102.

Figure 26:
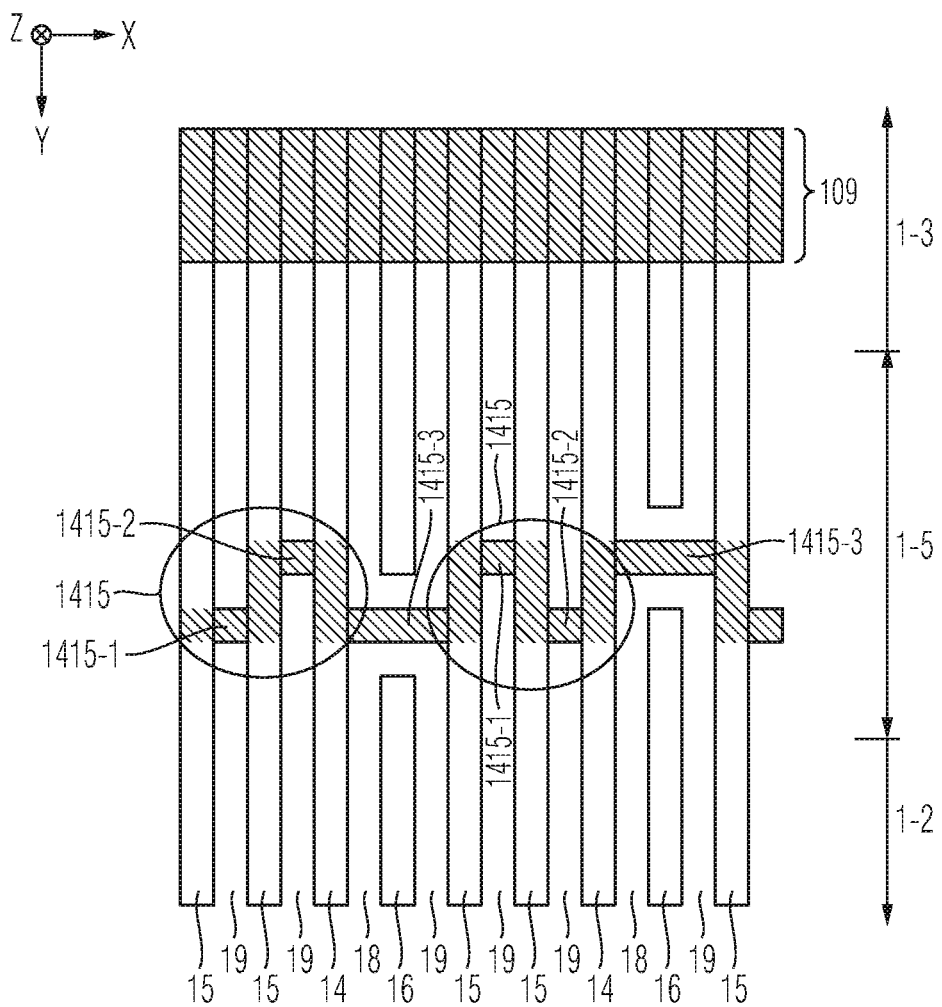
FIGS. 26-29 each schematically and exemplarily illustrate a section of a horizontal projection of a power semiconductor switch in accordance with some embodiments.

FIG. 26 illustrates an exemplarily implementation of the staggered arrangement of the cross-trench structure 1415 (wherein the contacting scheme deviates from the contacting scheme shown in FIG. 25A). For, example, the cross-trench structure 1415 comprises the first cross-trenches 1415-1, the second cross-trenches 1415-2 and the third cross trenches 1415-3. For example, the cross-trench structure 1415 surrounds the entire active cell field 1-2 (as, e.g., illustrated in FIG. 21A), with the sequentially arranged first cross-trenches 1415-1, the second cross-trenches 1415-2 and the third-cross trenches 1415-3. For example, the cross-trench structure 1415 is an uninterrupted structure that surrounds the entire active cell field 1-2 (as, e.g., illustrated in FIG. 21A), e.g., thereby contributing to decoupling the edge termination region 1-3 from the active cell field 1-2. As described above, such decoupling may for example comprise electrically isolation the body region 102 of the inactive mesas in the active cell field 1-2 from the well region 109.

The first and the second cross-trenches 1415-1 and 1415-2 may couple the control trenches 14 and the dummy trenches to one another (e.g., even be means of cross-trench electrodes). The third cross-trenches 1415-3 may for example intersect the active mesa 18 and couple adjacent first and second cross-trenches 1415-1 and 1415-2 to one another.

In an embodiment, each control trench 14 and each dummy trench 15 merges into the cross-trench structure 1415, whereas each source trench 16 is separated from the cross-trench structure 1415 by means of the semiconductor body 10, as illustrated in FIG. 26. For example, a distance between each of the source trenches 16 and the cross-trench structure 1415 along the second lateral direction Y amount to at least a width of the control trench insulator 142 (width along the first lateral direction X), a width of one of the active mesas 18, or to at least 1 µm, to at least 2 µm, or to at least 3 µm.

E.g., due to the closed arrangement formed by the cross-trench structures 1415 in the transition region 1-3, the source trenches 16 do not (unlike the control and dummy trenches 14, 15) extend seamlessly from the active cell region 1-2 into the transition region 1-5 towards the edge termination region 1-3, but terminates before reaching the closed arrangement formed by the cross-trench structures 1415 in the transition region 1-3, e.g., as mentioned above, at a distance of at least 1 µm, to at least 2 µm, or to at least 3 µm to the sidewall of the cross-trench structure (i.e., the respective third cross-trench 1415-3) facing towards the active cell region 1-2. Moreover, the "decoupled" extension of the source trench 16 in the transition region 1-5 and in the edge termination region 1-3 may comprise a trench electrode connected to a potential different from the potential of the first load terminal 11.

Figure 27:
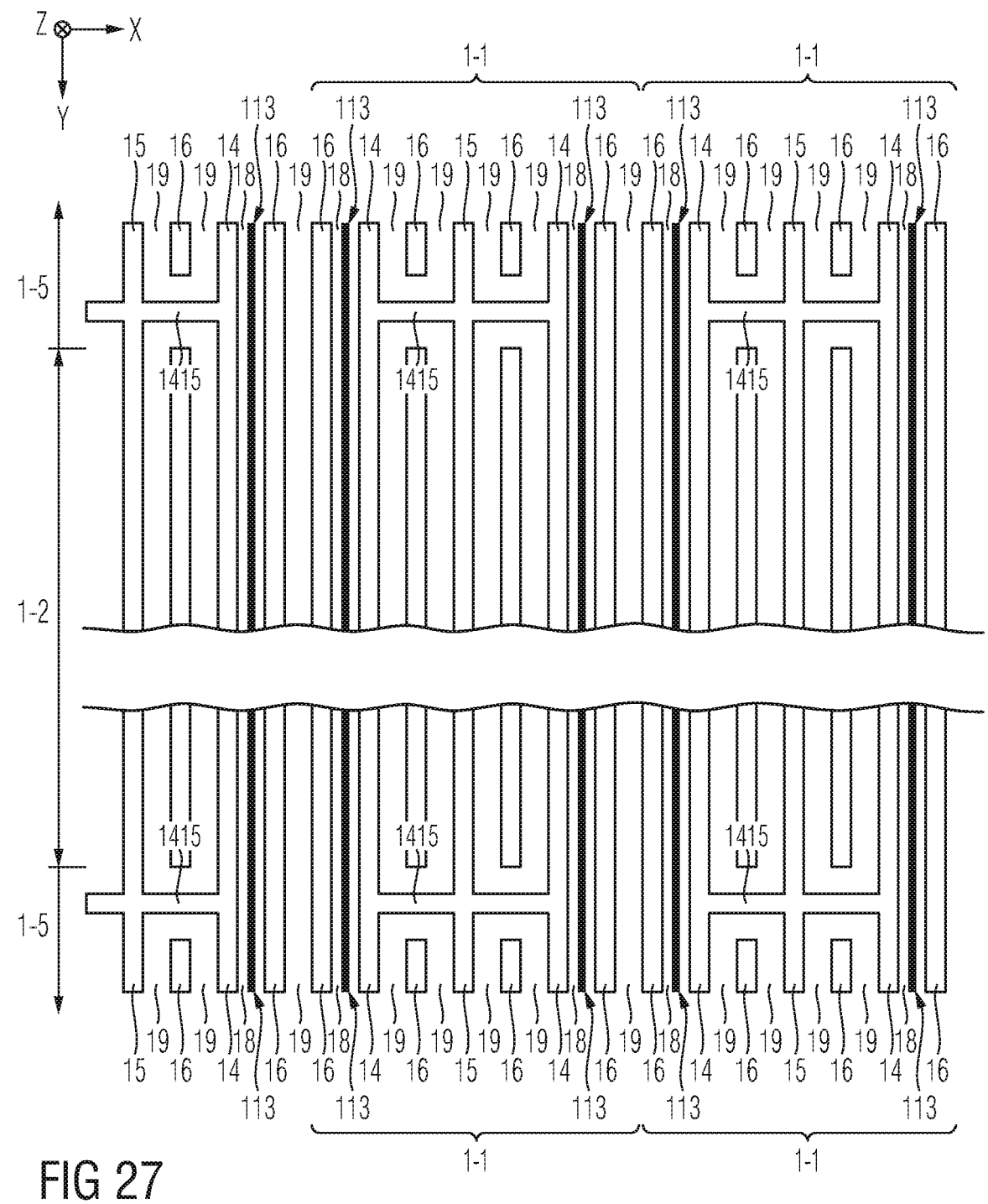
Figure 28:
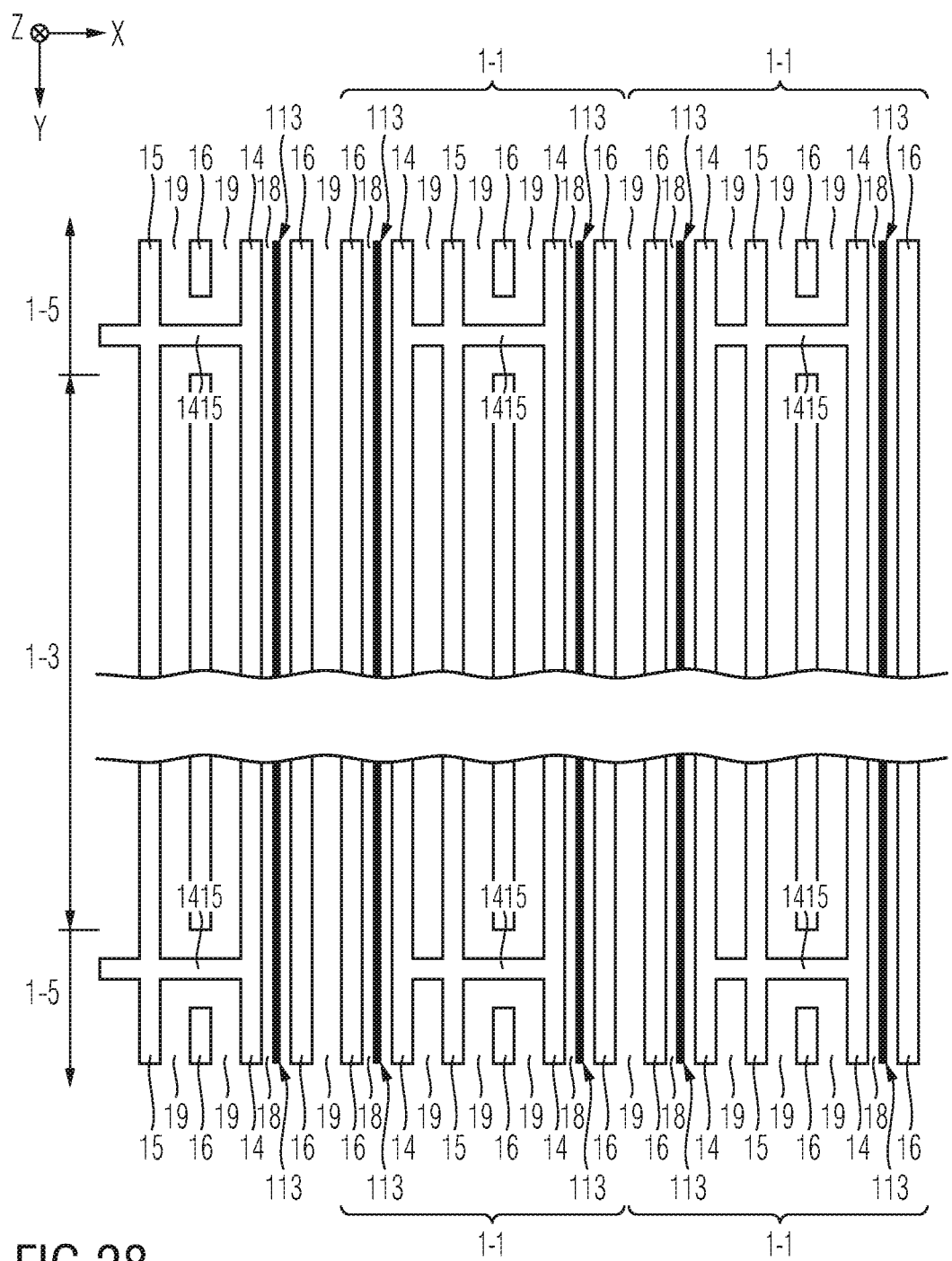

With regards to FIGS. 27-29, some further possible arrangements of the cross-trench structure 1415 shall be described.

The FIGS. 27-29 show two opposing sections of the transition region 1-5 (e.g., referring also to FIG. 21B the "upper" and "lower" (in terms of the Y-direction) sections).

In accordance with the embodiments illustrated in FIGS. 27 and 29, each IGBT cell 1-1 exhibits the contacting scheme "SkGoSoDoSoGkSo", i.e., one dummy trench 15, two control trenches 14, four source trenches 16, two active mesas 18 (contacted by the first contact plugs 113), and five inactive mesas 19 arranged with the neighborhood relationship (trenches in bold)

16-18-14-19-16-19-15-19-16-19-14-18-16-19.

Hence, it shall be understood the control trenches 14 and the dummy trenches 15 that may be interconnected to another by means of the cross-trench structure 1415 must not necessarily be arranged adjacent to another.

In accordance with the embodiment illustrated in FIG. 28, each IGBT cell 1-1 exhibits the slightly modified contacting scheme "SkGoDoSoGkSo", i.e., one dummy trench 15, two control trenches 14, three source trenches 16, two active mesas 18 (contacted by the first contact plugs 113), and four inactive mesas 19 arranged with the neighborhood relationship (trenches in bold)

16-18-14-19-15-19-16-19-14-18-16-19.

Hence, also with regards to FIG. 28, it shall be understood the control trenches 14 and the dummy trenches 15 that may be interconnected to another by means of the cross-trench structure 1415 must not necessarily be arranged adjacent to another Hence, in accordance with the embodiments illustrated in FIGS. 27-29 and as explained above, for each IGBT cell 1-1, there is provided one associated cross-trench structure 1415 into which each of the control trenches 14 and each of the dummy trenches 15 of the respective IGBT cell 1-1 merges. As explained above, each cross-trench structure 1415 may comprise the respective cross-trench electrode 14151, which may be electrically connected to the respective control trench and dummy trench electrodes 141 and 151. The respective control trench and dummy trench electrodes 141 and 151 may even be arranged in contact with the cross-trench electrode 14151 (cf. FIG. 21B).

In accordance with the embodiments illustrated in FIGS. 27-29, the cross-trench structures 1415 of the IGBT cells 1-1 do not form an uninterrupted structure that surrounds the entire cell field 1-2. Rather, the respective cell parts comprising the two active mesas 18, the two source trenches 16 there between and the inactive mesa 19 laterally confined by these two source trenches 16 merge seamlessly into the transition region 1-5. According to an embodiment, a first subset of the control trench electrodes 141 which are merged together by an uninterrupted portion of the cross-trench structure 1415 are connected to the control terminal 13, whereas a second subset of control trench electrodes 141 merged together by a second uninterrupted portion of the cross-trench structure 1415 is connected to the further control terminal.

In accordance with the embodiments illustrated in FIGS. 27-29, and as has been explained above, the source trenches 16 do for example not merge into the cross-trench structures 1415, but are displaced therefrom along the second lateral direction Y, e.g., by means of one or more micrometers. This may yield a comb-like embedding of some of the source trenches 16 within the active cell field 1-2, namely those source trenches 16 laterally confined by two trenches that are each either a control trench 14 or a dummy trench 15 (which are coupled with each other by means of the cross-trench structure 1415). In accordance with FIG. 27, each IGBT cell 1-1 comprises two of such comb-like embedded source trenches 16, whereas in accordance with FIG. 28, each IGBT cell 1-1 comprises only one of such comb-like embedded source trench 16.

FIG. 29 shows a variant of FIG. 26, according to which the dummy trench 15 of each IGBT cell 1-1 is embedded, in a comb-like manner, by means of each two adjacent source trenches 16. To this end, each IGBT cell 1-1 may comprises a source trench interconnect structure 167, which interconnects two source trenches 16 of the respective IGBT cell 1-1 and which may be similarly configured as the cross-trench structure 1415. The source trench interconnect structure 167 may for example be arranged in the periphery of the active cell field 1-2, in a region where the active cell field 1-2 interfaces with the transition region 1-3. For example, the comb-like embedded dummy trench 15 does not merge into source trench interconnect structure 167, but is displaced therefrom along the second lateral direction Y (e.g., similarly as the other source trenches 16 do not merge into the cross-trench structure 1415).

One or more or all embodiments described herein may each further exhibit one or more of the following features:

For example, in each IGBT cell 1-1, the active mesa 18 is laterally confined (e.g., along the first lateral direction X) by one control trench 14 and one source trench 16.

(ii) For example, in each IGBT cell 1-1, the further barrier region 100-3 (herein also referred to as n-barrier region) is only implemented in the active mesa(s) 18 and in those inactive mesa(s) 19 that are laterally confined by two source trenches 16. In contrast, the n-barrier region 100-3 is for example not arranged in those inactive mesas 19 which are laterally confined by control trenches 14 and/or dummy trenches 15. E.g., the n-barrier region 100-3 exclusively extends into those mesas 18, 19 that are laterally confined by either one control trench 14 and one source trench 16 or by two source trenches 16.

(iii) For example, at each of at least 90% of the IGBT cells 1-1 or even each IGBT cell 1-1 laterally overlaps at least partially with the p-barrier region 105.

(iv) For example, each IGBT cell 1-1 has an associated cross-trench structure 1415, e.g., arranged in the transition region 1-5, wherein the cross-trench structure 1415 merges at least one control trench 14, at least one dummy trench 15 and at least one further control or dummy trench 14; 15 of the respective IGBT cell 1-1.

(v) For example, each IGBT cell 1-1 exhibits the same contacting scheme, e.g. (using the abbreviations introduced above), one of
(1) kSkGoDoG
(2) kSoSkGoDoG
(3) kSoSoSkGoDoG (vi) For example, the exemplary contacting schemes (1) to (3) identified above and the other exemplary contacting schemes mentioned herein may allow for the switch 1 to be operated with different control voltages. E.g., as mentioned above, in addition to the control terminal 13, the switch 1 may comprise a (non-illustrated) further control terminal, and, for example, every second IGBT cell 1-1 is operated based on a control signal provided from the control terminal 13 to the respective control electrode(s) 141 of every second IGBT cell 1-1, and every other second IGBT cell 1-1 is operated based on a control signal provided from the further control terminal to the respective control electrode(s) 141 of every other second IGBT cell 1-1. The exemplarily described contacting schemes would accordingly even allow operating the switch with more than two control signals.

Presented herein is also a method. The method comprises processing a power semiconductor switch. The processed power semiconductor switch comprises a first load terminal and a second load terminal. The processed power semiconductor switch is configured to conduct a load current along a vertical direction between said terminals. Processing the power semiconductor switch comprises forming: an active cell region with a drift region of a first conductivity type; an edge termination region having a well region of a second conductivity type to be electrically connected to the first load terminal; a plurality of IGBT cells arranged within the active cell region, wherein each of the IGBT cells comprises a plurality of trenches that extend into the drift region along the vertical direction and that laterally confine a plurality of mesas. The plurality of trenches include: at least one control trench having a control electrode for controlling the load current; at least one dummy trench having a dummy electrode to be electrically coupled to the control electrode; at least one further trench having a further trench electrode, the at least one further trench being one of a further control trench and a further dummy trench. The plurality of mesas include: at least one active mesa to be electrically connected to the first load terminal within the active cell region and being configured to conduct at least a part of the load current, wherein each of the number of control trenches that are included in the respective IGBT cell is arranged adjacent to no more than one active mesa; at least one inactive mesa arranged adjacent to the at least one dummy trench and not to be electrically connected to the first load terminal. Processing the power semiconductor switch further comprises forming a cross-trench structure associated with at least one of the IGBT cells, the cross-trench structure merging each of the at least one control trench, the at least one dummy trench and the at least one further trench of the at least one IGBT cell to each other, wherein the cross-trench structure overlaps at least partially along the vertical direction with the plurality of the trenches of the at least one IGBT-cell.

Exemplary embodiments of the method correspond to the exemplary embodiments of the switch 1 presented above.

For example, an embodiment of the method comprises forming the (p-) barrier region 105. This can for example include carrying out one or more first implantation processing steps and/or one or more first lithographic processing steps, e.g., for providing the barrier region 105 with a lateral structure, e.g., as mentioned above with respect to the drawings.

For example, an embodiment of the method comprises forming the further (n-) barrier region 100-3. This can for example include carrying out one or more second implantation processing steps and/or one or more second lithographic processing steps, e.g., for providing the further barrier region 100-3 with a lateral structure, e.g., as mentioned above with respect to the drawings. For example, the further barrier region 100-3 is provided with a lateral structure different from the lateral structure of the barrier region 105.

In an embodiment, forming the cross-trench structure 1415 may include applying a trench tapering technique, e.g., so as to ensure that the cross-trench structure 1415 extends along the vertical direction Z substantially as far as the trenches 14, 15, 16 of the IGBT cells 1-1, e.g., such that the cross-trench structure 1415 deviates by no more than 1 micrometer in total depth as compared to the other trenches 14, 15, 16.

In the above, embodiments pertaining to power semiconductor switches and corresponding processing methods were explained. For example, these semiconductor switches are based on silicon (Si). Accordingly, a monocrystalline semiconductor region or layer, e.g., the semiconductor body 10 and its regions/zones can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor switch, comprising a first load terminal and a second load terminal, the power semiconductor switch being configured to conduct a load current along a vertical direction between the first and second load terminals and comprising:
   an active cell region including a drift region of a first conductivity type;
   an edge termination region including a well region of a second conductivity type electrically connected to the first load terminal;
   a plurality of IGBT cells arranged within the active cell region, each of the IGBT cells comprising a plurality of trenches that extend into the drift region along the vertical direction and that laterally confine a plurality of mesas;
   wherein the plurality of trenches comprises:
      at least one control trench having a control electrode for controlling the load current;
      at least one dummy trench having a dummy electrode electrically coupled to the control electrode;
      at least one further trench having a further trench electrode, the at least one further trench being one of a further control trench and a further dummy trench;
   wherein the plurality of mesas comprises:
      at least one active mesa electrically connected to the first load terminal within the active cell region and being configured to conduct at least a part of the load current, each of the control trenches that are included in the respective IGBT cell being arranged adjacent to no more than one active mesa, a portion of the drift region extending into the at least one active mesa and having a net dopant concentration profile along the vertical direction, the net dopant concentration having a local maximum within a central portion of the vertical extension of the at least one active mesa;

at least one inactive mesa arranged adjacent to the at least one dummy trench and not electrically connected to the first load terminal;

a cross-trench structure associated with at least one of the IGBT cells, the cross-trench structure merging each of the at least one control trench, the at least one dummy trench and the at least one further trench of the at least one IGBT cell to each other, wherein the cross-trench structure overlaps at least partially along the vertical direction with the plurality of the trenches of the at least one IGBT-cell.

2. The power semiconductor switch of claim 1, wherein each IGBT-cell further comprises at least one source trench having a source electrode electrically connected with the first load terminal.

3. The power semiconductor switch of claim 2, wherein in each of the IGBT-cells, the at least one source trench is arranged adjacent to the at least one control trench, and wherein the at least one control trench and the at least one source trench laterally confine the at least one active mesa.

4. The power semiconductor switch of claim 1, wherein each IGBT-cell further comprises an electrically floating barrier region of the second conductivity type, and wherein at least a bottom of the at least one dummy trench extends at least partially into the electrically floating barrier region.

5. The power semiconductor switch of claim 4, wherein a portion of the drift region located in a lateral direction between the electrically floating barrier region and the well region has a lateral extension of at least 1 µm in the lateral direction.

6. The power semiconductor switch of claim 5, wherein the cross-trench structure laterally overlaps with the portion of the drift region.

7. The power semiconductor switch of claim 4, wherein the electrically floating barrier region does not extend into a transition region between the active cell field region and the edge termination region.

8. The power semiconductor switch of claim 4, wherein the electrically floating barrier region is confined, along the vertical direction, by an upper section of the drift region on one side and by a lower section of the drift region on another side, and wherein the upper section forms a transition to body regions of the IGBT cells.

9. The power semiconductor switch of claim 4, wherein the electrically floating barrier region is formed as a laterally structured layer that extends within the active cell region.

10. The power semiconductor switch of claim 9, wherein the lateral structure of the electrically floating barrier region includes a plurality of pass-through passages.

11. The power semiconductor switch of claim 10, wherein each of the plurality of the pass-through passages is filled by either a section of the drift region or by a section of a trench of a respective one of the IGBT cells.

12. The power semiconductor switch of claim 4, wherein the electrically floating barrier region is arranged within a semiconductor layer of the semiconductor body, the semiconductor layer extending within the active cell region and having a total volume within the active cell region, wherein pass-through passages of the electrically floating barrier region form at least 0.1% and at most 50% of the total volume, and wherein a remaining volume of the semiconductor layer is formed by semiconductor regions of the second conductivity type.

13. The power semiconductor switch of claim 4, wherein a body region section present in the inactive mesa forms a homojunction with the electrically floating barrier region.

14. The power semiconductor switch of claim 1, further comprising, in at least one of the IGBT-cells, a barrier region of the first conductivity type, wherein the barrier region of the first conductivity type is arranged within the at least one active mesa of the at least one of the IGBT-cell and has a dopant concentration at least twice as great as the drift region.

15. The power semiconductor switch of claim 14, wherein the barrier region of the first conductivity type forms a part of the upper drift region section.

16. The power semiconductor switch of claim 14, wherein the further barrier region of the first conductivity type does not extend into any one of the inactive mesas that are arranged adjacent to one of the dummy trenches.

17. The power semiconductor switch of claim 14, wherein each IGBT-cell further comprises an electrically floating barrier region of the second conductivity type, wherein at least a bottom of the at least one dummy trench extends at least partially into the electrically floating barrier region of the second conductivity type, and wherein the further barrier region of the first conductivity type laterally overlaps with at least one path-through passage of the electrically floating barrier region of the second conductivity type.

18. The power semiconductor switch of claim 14, wherein the further barrier region exclusively extends into those mesas that are laterally confined by either one control trench and one source trench or by two source trenches, the one source trench or the two source trenches being electrically connected with the first load terminal.

19. The power semiconductor switch of claim 1, wherein the cross-trench structure comprises a cross-trench electrode electrically connecting each of the control trench electrode, the dummy trench electrode and the further trench electrode with each other.

20. The power semiconductor switch of claim 1, wherein in each of the IGBT-cells, the at least one control trench, the at least one dummy trench and the at least one further trench of the at least one IGBT-cell are arranged adjacent to each other.

21. The power semiconductor switch of claim 1, wherein the cross-trench structure electrically isolates at least a portion of the inactive mesa from the well region.

22. The power semiconductor switch of claim 1, wherein each IGBT-cell has at least one associated cross-trench structure, and wherein the cross-trench structures of all IGBT-cells surround the active cell region.

* * * * *

UNITED STATES PATENT AND TRADEMARK OFFICE
CERTIFICATE OF CORRECTION

PATENT NO. : 11,011,629 B2  
APPLICATION NO. : 16/695707  
DATED : May 18, 2021  
INVENTOR(S) : M. Beninger-Bina et al.

Page 1 of 1

It is certified that error appears in the above-identified patent and that said Letters Patent is hereby corrected as shown below:

On the Title Page

Item (57) Abstract, Line 3, please change "merge" to --merges--

In the Claims

Column 44, Line 18, Claim 14, Line 5, please change "IGBT-cell" to --IGBT-cells--

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*